US008537357B2

(12) United States Patent
Holub et al.

(10) Patent No.: US 8,537,357 B2
(45) Date of Patent: *Sep. 17, 2013

(54) SYSTEM FOR DISTRIBUTING AND CONTROLLING COLOR REPRODUCTION AT MULTIPLE SITES

(75) Inventors: Richard A. Holub, Rochester, NY (US); Daniel R. Mongeau, Marlboro, MA (US)

(73) Assignee: Rah Color Technologies LLC, Alexandria, VA (US)

( * ) Notice: Subject to any disclaimer, the term of this patent is extended or adjusted under 35 U.S.C. 154(b) by 244 days.

This patent is subject to a terminal disclaimer.

(21) Appl. No.: 12/660,937

(22) Filed: Mar. 8, 2010

(65) Prior Publication Data
US 2010/0231728 A1    Sep. 16, 2010

Related U.S. Application Data

(62) Division of application No. 11/413,949, filed on Apr. 28, 2006, now Pat. No. 7,710,560, which is a division of application No. 10/209,431, filed on Jul. 31, 2002, now Pat. No. 7,075,643, which is a division of application No. 09/139,498, filed on Aug. 25, 1998, now Pat. No. 6,459,425.

(60) Provisional application No. 60/056,947, filed on Aug. 25, 1997.

(51) Int. Cl.
*G01J 3/46* (2006.01)

(52) U.S. Cl.
USPC .......................................... 356/402

(58) Field of Classification Search
USPC .......................................... 356/402
See application file for complete search history.

(56) References Cited

U.S. PATENT DOCUMENTS 2,790,844 A    4/1957    Neugebauer
4,029,419 A    6/1977    Schumann et al.
(Continued)

FOREIGN PATENT DOCUMENTS

EP    0 562 973    3/1993
EP    0579224    7/1993
(Continued)

OTHER PUBLICATIONS

Radius PressView System User's Manual, Jun. 1995.
(Continued)

*Primary Examiner* — Kara E Geisel
(74) *Attorney, Agent, or Firm* — Kenneth J. Lukacher Law Group

(57) ABSTRACT

In a color imaging system, multiple rendering devices are provided at different nodes along a network. Each rendering device has a color measurement instrument for calibrating the color presented by the rendering device. A rendering device may be a printer in which the measuring of color samples on a sheet rendered by the printer is provided by a sensor coupled to a transport mechanism which moves the sensor and sheet relative to each other, where the sensor provides light from the samples to a spectrograph. A rendering device may also be a display having a member supporting a color measuring instrument for receiving light from an area of the screen. The color measuring instruments provide for non-contact measurements of color samples rendered on a display or a sheet, and are self calibrating by the use of calibration references.

34 Claims, 54 Drawing Sheets

(56) References Cited

U.S. PATENT DOCUMENTS

| | | |
|---|---|---|
| 4,054,389 A | 10/1977 | Owen |
| 4,314,280 A | 2/1982 | Rose |
| 4,441,120 A | 4/1984 | Gerritsen |
| 4,500,919 A | 2/1985 | Schreiber |
| 4,531,317 A | 7/1985 | McCurdy |
| 4,630,076 A | 12/1986 | Yoshimura |
| 4,658,286 A | 4/1987 | Schwartz et al. |
| 4,677,465 A | 6/1987 | Alkofer |
| 4,700,218 A | 10/1987 | Thomsen et al. |
| 4,729,016 A | 3/1988 | Alkofer |
| 4,745,465 A | 5/1988 | Kwon |
| 4,758,085 A | 7/1988 | Lequime et al. |
| 4,770,530 A | 9/1988 | Van Aken et al. |
| 4,839,829 A | 6/1989 | Freedman |
| 4,843,573 A | 6/1989 | Taylor et al. |
| 4,848,874 A | 7/1989 | Mui et al. |
| 4,850,706 A | 7/1989 | Mikes |
| 4,863,242 A | 9/1989 | Correa |
| 4,929,078 A | 5/1990 | Harmon |
| 4,939,581 A | 7/1990 | Shalit |
| 4,975,862 A | 12/1990 | Keller et al. |
| 4,980,759 A | 12/1990 | Smyth |
| 4,987,496 A | 1/1991 | Greivenkamp, Jr. |
| 5,040,889 A | 8/1991 | Keane |
| 5,042,893 A | 8/1991 | Ong |
| 5,049,791 A | 9/1991 | Kawakami |
| 5,049,986 A | 9/1991 | Aono et al. |
| 5,062,714 A | 11/1991 | Peterson et al. |
| 5,077,600 A | 12/1991 | Ichigaya et al. |
| 5,083,195 A | 1/1992 | Evelin |
| 5,087,123 A | 2/1992 | Gerlacher et al. |
| 5,107,332 A | 4/1992 | Chan |
| 5,109,275 A | 4/1992 | Naka et al. |
| 5,113,355 A | 5/1992 | Nomura |
| 5,115,229 A | 5/1992 | Shalit |
| 5,121,253 A | 6/1992 | Waintroob |
| 5,122,977 A | 6/1992 | Pfeiffer |
| 5,146,328 A | 9/1992 | Yamasaki et al. |
| 5,177,602 A | 1/1993 | Fujimori |
| 5,182,721 A | 1/1993 | Kipphan et al. |
| 5,185,673 A | 2/1993 | Sobol |
| 5,200,816 A | 4/1993 | Rose |
| 5,231,481 A | 7/1993 | Eouzan et al. |
| 5,243,414 A | 9/1993 | Dalrymple et al. |
| 5,243,463 A | 9/1993 | Waintroob |
| 5,251,007 A | 10/1993 | Rinke |
| 5,267,178 A | 11/1993 | Berner |
| 5,272,518 A | 12/1993 | Vincent |
| 5,274,501 A | 12/1993 | Stroll, Jr. |
| 5,278,641 A | 1/1994 | Sekizawa et al. |
| 5,303,165 A | 4/1994 | Ganz et al. |
| 5,305,082 A | 4/1994 | Bret |
| 5,309,257 A | 5/1994 | Bonino et al. |
| 5,313,291 A | 5/1994 | Appel et al. |
| 5,319,437 A | 6/1994 | Van Aken et al. |
| 5,333,069 A | 7/1994 | Spence |
| 5,345,315 A | 9/1994 | Shalit |
| 5,363,318 A | 11/1994 | McCauley |
| 5,394,204 A | 2/1995 | Shigeta et al. |
| 5,414,538 A | 5/1995 | Eschbach |
| 5,416,890 A | 5/1995 | Beretta |
| 5,426,517 A | 6/1995 | Schwartz |
| 5,428,720 A | 6/1995 | Adams, Jr. |
| 5,432,906 A | 7/1995 | Newman et al. |
| 5,444,556 A | 8/1995 | Ito et al. |
| 5,448,277 A | 9/1995 | Long |
| 5,450,502 A | 9/1995 | Eschbach et al. |
| 5,459,678 A | 10/1995 | Feasey |
| 5,465,111 A | 11/1995 | Fukushima et al. |
| 5,477,321 A | 12/1995 | Johnson |
| 5,479,186 A | 12/1995 | McManus et al. |
| 5,485,284 A | 1/1996 | Shono et al. |
| 5,495,331 A | 2/1996 | Wulf |
| 5,495,428 A | 2/1996 | Schwartz |
| 5,499,040 A | 3/1996 | McLaughlin et al. |
| 5,510,851 A | 4/1996 | Foley et al. |
| 5,512,961 A | 4/1996 | Cappels, Sr. |
| 5,526,121 A | 6/1996 | Sandifer et al. |
| 5,528,261 A | 6/1996 | Holt et al. |
| 5,528,424 A | 6/1996 | Lentz et al. |
| 5,532,848 A | 7/1996 | Beretta |
| 5,539,539 A | 7/1996 | Fujimoto et al. |
| 5,544,258 A | 8/1996 | Levien |
| 5,554,912 A | 9/1996 | Thayer et al. |
| 5,561,459 A | 10/1996 | Stokes et al. |
| 5,568,169 A | 10/1996 | Dudek et al. |
| 5,596,416 A | 1/1997 | Barry et al. |
| 5,602,932 A | 2/1997 | Macdonald et al. |
| 5,604,596 A | 2/1997 | Ukai et al. |
| 5,625,758 A | 4/1997 | Schneider et al. |
| 5,668,890 A | 9/1997 | Winkelman |
| 5,680,333 A | 10/1997 | Jansson |
| 5,694,227 A | 12/1997 | Starkweather |
| 5,739,809 A | 4/1998 | McLaughlin et al. |
| 5,739,905 A | 4/1998 | Hutchinson |
| 5,745,657 A | 4/1998 | Barry et al. |
| 5,748,221 A | 5/1998 | Castelli et al. |
| 5,751,965 A | 5/1998 | Mayo et al. |
| 5,767,980 A | 6/1998 | Wang et al. |
| 5,774,225 A | 6/1998 | Goldstein et al. |
| 5,786,803 A | 7/1998 | Hernandez et al. |
| 5,806,081 A | 9/1998 | Swen et al. |
| 5,809,165 A | 9/1998 | Massen |
| 5,809,213 A | 9/1998 | Bhattacharjya |
| 5,812,286 A | 9/1998 | Lin |
| 5,821,917 A | 10/1998 | Cappels |
| 5,828,793 A | 10/1998 | Mann |
| 5,835,817 A | 11/1998 | Bullock |
| 5,850,472 A | 12/1998 | Alston et al. |
| 5,854,680 A | 12/1998 | Rakitsch |
| 5,859,711 A | 1/1999 | Barry et al. |
| 5,867,603 A | 2/1999 | Barnsley et al. |
| 5,892,557 A | 4/1999 | Henderson |
| 5,905,906 A | 5/1999 | Goffinet et al. |
| 5,940,186 A | 8/1999 | Barry et al. |
| 5,969,812 A | 10/1999 | Carver |
| 6,018,361 A | 1/2000 | Fujii et al. |
| 6,035,103 A | 3/2000 | Zuber |
| 6,041,708 A | 3/2000 | Kipphan et al. |
| 6,043,909 A | 3/2000 | Holub |
| 6,072,546 A | 6/2000 | Nakayabu |
| 6,075,888 A * | 6/2000 | Schwartz ............... 382/167 |
| 6,157,735 A | 12/2000 | Holub |
| 6,178,007 B1 | 1/2001 | Harrington |
| 6,204,919 B1 | 3/2001 | Barshad et al. |
| 6,219,155 B1 | 4/2001 | Zuber |
| 6,232,954 B1 | 5/2001 | Rozzi |
| 6,256,638 B1 | 7/2001 | Dougherty et al. |
| 6,271,937 B1 | 8/2001 | Zuber |
| 6,320,668 B1 | 11/2001 | Kim |
| 6,337,922 B2 | 1/2002 | Kumada |
| 6,373,580 B1 | 4/2002 | Walker |
| 6,404,509 B1 | 6/2002 | Kuwata et al. |
| 6,430,311 B1 | 8/2002 | Kumada |
| 6,606,165 B1 | 8/2003 | Barry et al. |
| 6,633,396 B1 | 10/2003 | Barry et al. |
| 6,636,326 B1 | 10/2003 | Zuber |
| 6,654,491 B1 | 11/2003 | Hidaka |
| 6,657,741 B1 | 12/2003 | Barry et al. |
| 6,750,992 B1 | 6/2004 | Holub |
| 6,753,990 B1 | 6/2004 | Payne et al. |
| 6,995,870 B2 | 2/2006 | Holub |
| 7,057,639 B2 | 6/2006 | Spoonhower et al. |
| 7,161,558 B1 | 1/2007 | Eidem et al. |
| 7,280,251 B1 | 10/2007 | Holub |
| 7,312,897 B2 | 12/2007 | Holub |
| 7,715,052 B2 | 5/2010 | Holub |
| 7,728,845 B2 | 6/2010 | Holub |
| 7,729,008 B2 | 6/2010 | Holub |
| 7,791,761 B2 | 9/2010 | Holub |
| 7,830,546 B2 | 11/2010 | Holub |
| 2010/0245874 A1 | 9/2010 | Holub |

FOREIGN PATENT DOCUMENTS

| JP | 58-102114 | 6/1983 |
|---|---|---|
| JP | 61-292026 | 12/1986 |
| JP | 62-91078 | 4/1987 |
| JP | 4-329066 | 11/1992 |
| JP | 7-17115 | 1/1995 |
| JP | 7-288704 | 10/1995 |
| JP | 10-173943 | 6/1998 |
| WO | WO 96/00435 | 1/1996 |

OTHER PUBLICATIONS

Radius PressView 17SR and PressView 21SR User's Manual, Mar. 1995.
Radius ProSense Display Calibrator User's Manual, Jun. 1995.
Swain, Michael J. et al., Color Indexing, International Journal of Computer Vision, 7:1, 11-32 (1991).
Funt, Brian V. et al., Color Constant Color Indexing, IEEE Transactions on Pattern Analysis and Machine Intelligence, vol. 17, No. 5, pp. 522-529, May 1995.
Marszalec, E. et al., Some Aspects of RGB Vision and its Applications in Industry, International Journal of Pattern Recognition and Artificial Intelligence, vol. 10, No. 1, pp. 55-72 (1996).
Marszalec, E. et al., On-Line Color Camera Calibration, IEEE, pp. 232-237 (1994).
Marszalec, E. et al., Color Measurements Based on a Color Camera, Proc. SPIE/NEW vol. 3101, Image Processing Techniques and Applications: Algorithms, Methods and Components II, Munich, 170-181 (1997).
Brown, S. W. et al., NIST Calibration Facility for Display Colorimeters, Proc., IS&T/SPIE 11th International Symposium, Electronic Imaging'99, San Jose (1999).
Brown, S. W. et al., Calibrating Colorimeters for Display Measurements, Article Manuscript: Information Display Dec. 1999 pp. 30-34 (1999).
Ohno, Y. et al., Four-Color Matrix Method for Correction of Tristimulus Colorimeters, Proc., IS&T Fifth Color Imaging Conference, 301-305 (1997).
Ohno, Y. et al., Four-Color Matrix Method for Correction of Tristimulus Colorimeters—Part 2, Proc., IS&T Sixth Color Imaging Conference (1998).
Micrografx Picture Publisher Reference Guide, Micrografx, Inc., 1992.
Buckley, R., Specifying Color in Office Documents, TAGA Proceedings, pp. 30-43 (1990).
Masia, A., A Digital Color Separating System Based on Principles of Colorimetry, TAGA Proceedings, pp. 346-361 (1984).
Newman, T., Improved Color for the World Wide Web: A Case Study in Color Management for Distributed Digital Media, TAGA Proceedings, vol. 2, pp. 772-787 (1995).
Cowan, W., An Inexpensive Scheme for Calibration of a Colour Monitor in Terms of CIE Standard Coordinates, Computer Graphics, vol. 17, No. 3, pp. 315-321, (1983).
C. Sodergard, T. Lehtonen, R. Launonen, & Juuso Aikas, "A System for Inspecting Colour Printing Quality", Reprinted from TAGA Proceedings, vol. 1, The Technical Association of the Graphic Arts, Rochester, New York, pp. 620-634, 1995.
R. Blessing, "Before Your Very Eyes", Publishing & Production Executive, Aug. 1995.
"Graphic Technology—Color Reflection Target for Input Scanner Calibration", American National Standard, Annex B, pp. 18-20, Jun. 1993. (ANSI IT8. Jul. 2, 1993).
C. Sodergard, M. Kuusisto, Y. Xiaohan, K. Sandstrom, "On-line Control of the Colour Print Quality Guided by the Digital Page Description", Reprinted from Proceeding of 22nd International Conference on Printing Research Institutes, Munich, Germany, 1993.
J. Gordon & R. Holub, "On the Use of Linear Transformation for Scanner Calibration", Communications and Comments, Color Research and Application, vol. 18, No. 13, pp. 218-219, Jun. 1993.
"MCT Metric Color Tag Specification-Draft", Revision 1.1d, EfiColor Developers Desk, Electronics for Imaging, Inc., pp. 1-30, Mar. 22, 1993.

R.H. Johnson & D. W. Wichern, Applied Multivariate Statistical Analysis, 3rd Edition, Prentice Hall, Chapter 8, pp. 356-395, 1992.
A. Hardy & F. Wurzburg, Jr., "Color Correction in Color Printing", Journal of the Optical Society of America, vol. 38, No. 1, pp. 300-307, Apr. 1948.
H. E. J. Neugebauer, "The Colorimetric Effect of the Selection of Printing Inks and Photographic Filters on the Quality of Multicolor Reproductions", TAGA Proceedings, Technical Association of the Graphic Arts, Rochester, New York, pp. 15-29, 1956.
Pobboraysky, "A Proposed Engineering Approach to Color Reproduction", TAGA Proceedings, Technical Association of the Graphic Arts, Fourteen Annual Meeting, Rochester, New York, pp. 127-165, Jun. 11-13, 1962.
R.H. Gallagher, Finite Element Analysis: Fundamentals, Pentice-Hall, Englewood Cliffs, New Jersey, Chapter 8, pp. 228-241, 1975.
W.K. Pratt, Digital Image Processing, New York: Wiley, Chapter 19, pp. 551-559, 1978.
Commission International de L'Eclairage, "Colorimetry", Second Edition, Austria, Publication CIE 15.2, pp. 19-23, 27-32, 1986.
J. Gordon, R. Holub, & R. Poe, "On the Rendition of Unprintable Colors", TAGA Proceedings, Technical Association of the Graph Arts, Rochester, New York, pp. 1-10, 1987.
R. Holub, W. Kearsley & C. Pearson, "Color Systems Calibration for Graphic Arts: I. Input Devices", Journal of Imaging Technology vol. 14, No. 2, pp. 47-52, Apr. 1988.
R. Holub, W. Kearsley & C. Pearson, "Color Systems Calibration for Graphic Art: II. Output Devices", Journal of Imaging Technology, vol. 14, No. 2, pp. 53-60, Apr. 1988.
C. Hoyt, "Toward Higher Res, Lower Cost Quality Color and Multispectral Imaging", Reprinted from Advanced Imaging, Apr. 1995.
Abstracts of Awards for Fiscal Year 1995, SBIRP, U.S. Department of Commerce, pp. 46.
"Experience the Future", Komori World News 28, International Edition, p. 5, Sep. 1995.
"Introducing Imagexpo 1.2 Interactive remote viewing and annotation software for the graphic arts professional", Group Logic, Arlington, Virginia, 1994-1995.
Vanhala et al. "A General Teleproofing System", Reprinted from: Proceedings of the TAGA Conference, Rochester, New York, pp. 88-99, May 1991.
"TIFF", Revision 6.0 Final—Jun. 3, 1992, Aldus Corporation, Seattle, Washington, pp. 13-16, 1992.
W. Press, B. Flannery, S. Teukolsky, & W. Vetterling, "Numerical Recipes the Art of Scientific Computing", Cambridge University Press, Chapter 14.3, pp. 509-520, Chapter 5.3, pp. 137-140, Chapter 9.6, pp. 269-273, & Chapter 10.8-10.9.
R. Holub, "The Future of Parallel, Analog and Neural Computing Architectures in the Graphic Art", TAGA Proceedings, pp. 80-112, 1988.
Y. Garini Ph.D , "Thin-Film Measurements Using SpectraCube, Application Note for Thin Film Measurements", Spectral Diagnostics (Sd) Ltd. pp. 1-6, Jan 1995.
M. Schwartz, R. Holub, & J. Gilbert, "Measurements of Gray Component Reduction in Neutral and Saturated Colors", TAGA Proceedings, pp. 16-27, 1985.
R. Holub & W. Kearsley, "Color to colorant conversions in a colorimetric separation system", SPIE, vol. 1184, Japan, pp. 24-35, Dec. 1989.
J. Greivenkamp, "Color dependent optical prefilter for the suppression of aliasing artifacts", Applied Optics, vol. 29, No. 5, pp. 676-684, Feb. 10, 1990.
R. Holub, "Colorimetric Aspects of Image Capture", Track III-Image Processing, IS&T's 48th Annual Conference Proceedings, Arlington, Virginia, pp. 449-451, May 1995.
Ocean Optics, Inc.,"Price and Data Sheet for Spectrometers" & "S1000 Miniature Fiber Optic Spectrometer", Mar. 1995.
Michael Kieram, "Easy Pieces The five essential pieces", Publish Magazine, Jun. 1996, pp. 43-47.
Customer Bulletin, 3M Rainbow Color Proofing System, 3M Company 1996.
Heidelberger Druckmashinen Aktiengesellschaft, "In-Line Image Control CPC 23", pp. 1-4.

L. Mertz, Concentric spectographs, Applied Optics, vol. 16, No. 12, pp. 3122-3124, Dec. 1977.

J. Thomas Brownrigg, Design and Performance of a Miniature Dual-Beam Diode-Array Spectrometer, Spectroscopy, vol. 10, No. 9, pp. 39-44, Nov./Dec. 1995.

Berthold K.P. Horn, Exact Reproduction of Colored Images, Computer Vision, Graphics, and Image Processing, vol. 26, pp. 135-167, 1984.

Richard Young and William E. Schneider, Instrumentation advances enhance spectroradiometers, Laser Focus World, May 1995.

Photometric Characterization of Light Sources by an Array Spectrograph Application Note, Jobin Yvon-Spex Instruments S.A., Inc., 1996.

Roy S. Berns, Ricardo J. Motta, Mark E. Gorzynski, CRT Colorimetry. Part I; Theory and Practice, Color, research and application, vol. 18, No. 5, pp. 299-314, Oct. 1993.

Roy S. Berns, Mark E. Gorzynski, Ricardo J. Motta, CRT Colorimetry. Part II: Metrology,Color research and application, vol. 18, No. 5, pp. 315-325, Oct. 1983.

Visioneer, Inc., PaperPort Strobe for Macintosh Installation Guide, pp. 1-15, (1997).

Office Action dated Feb. 10, 2009, with Notice of References Cited for U.S. Appl. No. 11/216,784, filed Aug. 31, 2005.

Pointer, M., The Gamut of Real Surface Colours, Color Research and Applications, vol. 5, No. 3, pp. 145-155, 1980.

Hunt, R., A model of Colour Vision for Predicting Colour Appearance in Various Viewing Conditions, Color Research and Application, vol. 12, No. 6, pp. 297-314, 1987.

Defendants' Answer to Plaintiff's First Amended Complaint, Affirmative Defenses, and Counterclaims, United States District Court for the Western District of New York, Case 6:10-cv-06710-CJS, Document 11, Filed Apr. 25, 2011, pp. 1-42.

Defendants' Answer, Affirmative Defenses, and Counterclaims, United States District Court for the Western District of New York, Case 6:10-cv-06710-CJS, Document 9, Filed Apr. 4, 2011, pp. 1-30.

Holub, Richard A. et al., Three Component Color Representations for Graphic Arts, Proceedings of the Annual Technical Conference Technical Association of the Graphic Arts, Rochester, NY, 1993, pp. 50-66.

PostScript Language Reference Manual, 2nd Edition, Adobe Systems, Incorporated, 1990, pp. i-vi and 1-764.

Holub, Richard A. et al., Three-Component Color Representations for Graphic Arts, IS&T Final Program and Advance Printing of Paper Summaries, IS&T's 46th Annual Conference, May 9-14, 1993, pp. 163-165.

Apple Computer, Advanced Color Imaging on the Mac OS, Addison-Wesley, Aug. '95, p. 344.

InterColor Consortium, ICC Profile Format 3.0, Jun. 10, 1994, p. 82.

Murch, G., Management on the Desktop, IS&T and SID's Color Imaging Conference, pp. 95-99, 1993.

Birmy Graphics Corp., PowerRIP 3.1 for Macintosh Manual, Jul '95, p. 44.

Asadi, B. et al., QuarkXPress 3.2/3.3 Bible, IDG Books, 1993, p. 694.

Takehara, K., et al., A SAW-Based Spread Spectrum Wireless LAN System, IEEE Second International Symposium on Spread Spectrum Techniques and Applications, Nov. 29, '92, pp. 175-178.

Starkweather, G., A High Resolution Laser Printer, J. Imaging Technol. 11(6): 300-305, 1985.

Stone, J., et al., Color Gamut Mapping and the Printing of Digital Color Images, ACM Transactions on Graphics 7(4): 249-292, 1988.

Gentile, R., Device Independent Color in PostScript, in SPIE vol. 1913, Human Vision, Visual Processing and Digital Display IV, pp. 419-432, 1993.

Maeda, M. et al., Object Oriented Color Management System, in SPIE vol. 1909, Device Independent Color Imaging and Imaging System Integration, pp. 195-205, 1993.

Tektronix, Inc., Phaser 240 User Manual, p. 202, 1995.

Tektronix, Inc., TekColor(tm), Color Management System, p. 115, 1990.

International Color Consortium, ICC Profile Format Specification, Version 3.2, Nov. 20, 1995,.

Japanese Patent Office Action Mailed Feb. 14, 2012, Japanese Patent Application No. 2011-074873, translation of Action and Pending Claims.

Canadian Patent Office Action Mailed May 29, 2012, Canadian Patent Application No. 2,559,350, and Pending Claims.

ASTM Standards on Color and Appearance Measurement, Third Edition, pp. 321-327, 1991.

ColorQUEST(TM) II Spectrophotometer Brochure, Hunter Associates Laboratory, Inc., 1993.

HunterLab Spectra-Probe(R) On-Line Spectrocolorimeter Brochure, Hunter Associates Laboratory, Inc., 1993.

Textile World (reprint), "HunterLab; Online Spectrophotometer", Apr. 1989.

HunterLab UltraScan(TM) Spectrocolorimeter Brochure, Hunter Associates Laboratory, Inc., 1991.

* cited by examiner

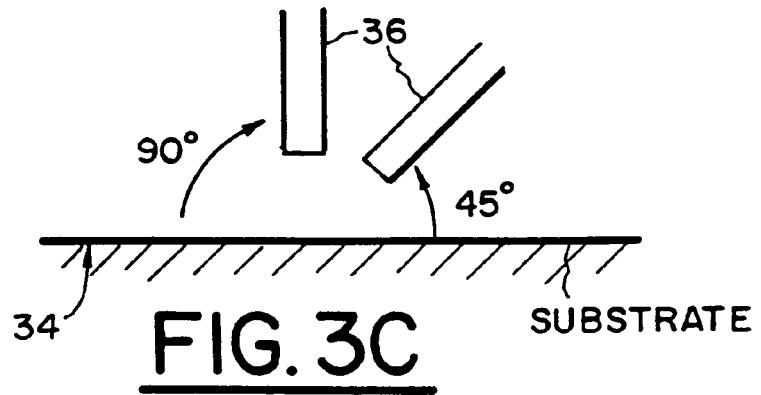
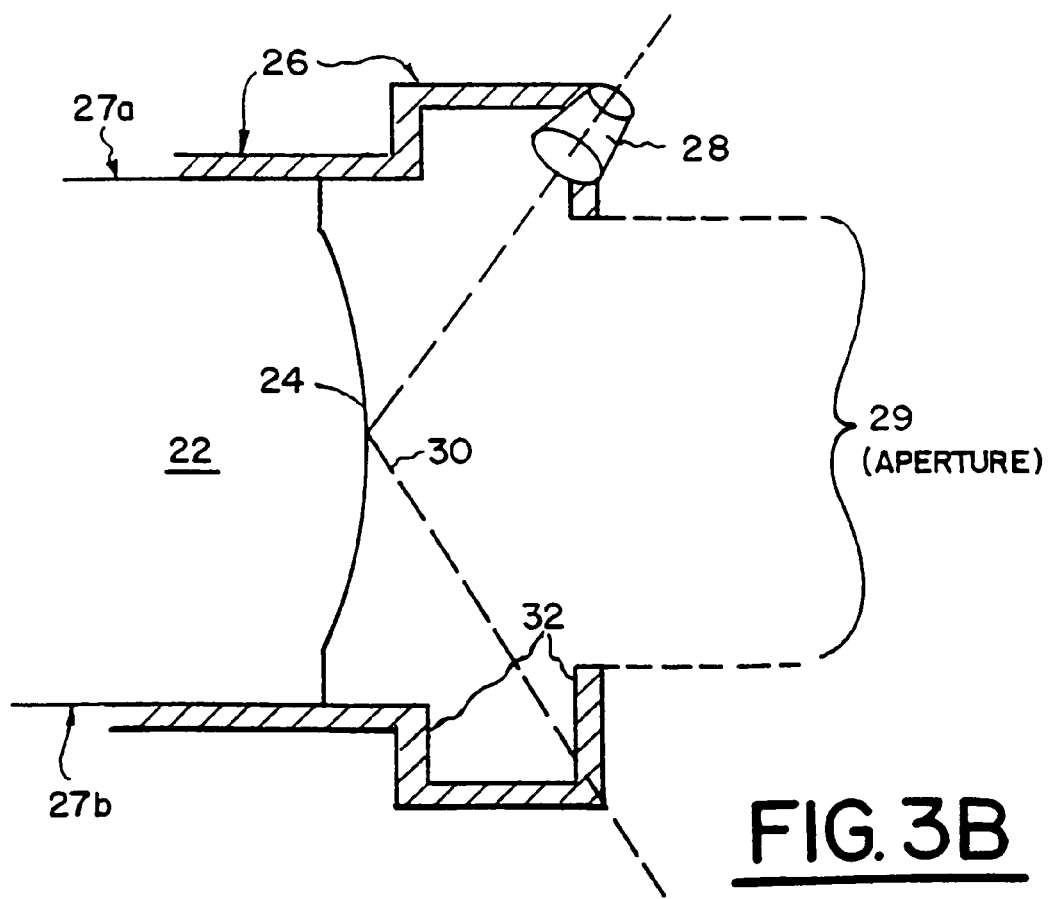

CASE 1: THE MINIMUM INPUT L* IS LESS THAN
MINIMUM OUTPUT L*
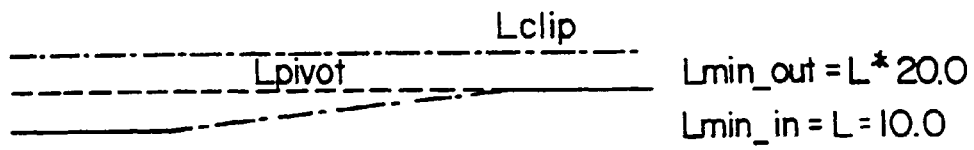
L* = 100.0
L*out = L*in
Lclip
Lpivot
Lmin_out = L* 20.0
Lmin_in = L = 10.0
CASE 2: THE MINIMUM INPUT L* IS GREATER THAN
MINIMUM OUTPUT L*
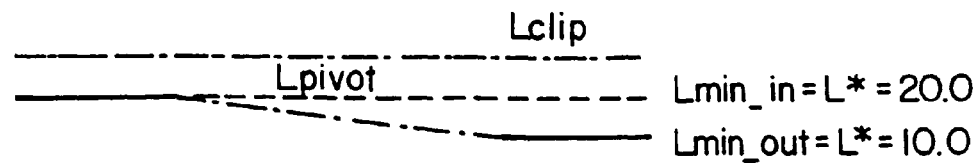
L* = 100.0
L*out = L*in
Lclip
Lpivot
Lmin_in = L* = 20.0
Lmin_out = L* = 10.0
FIG. 14

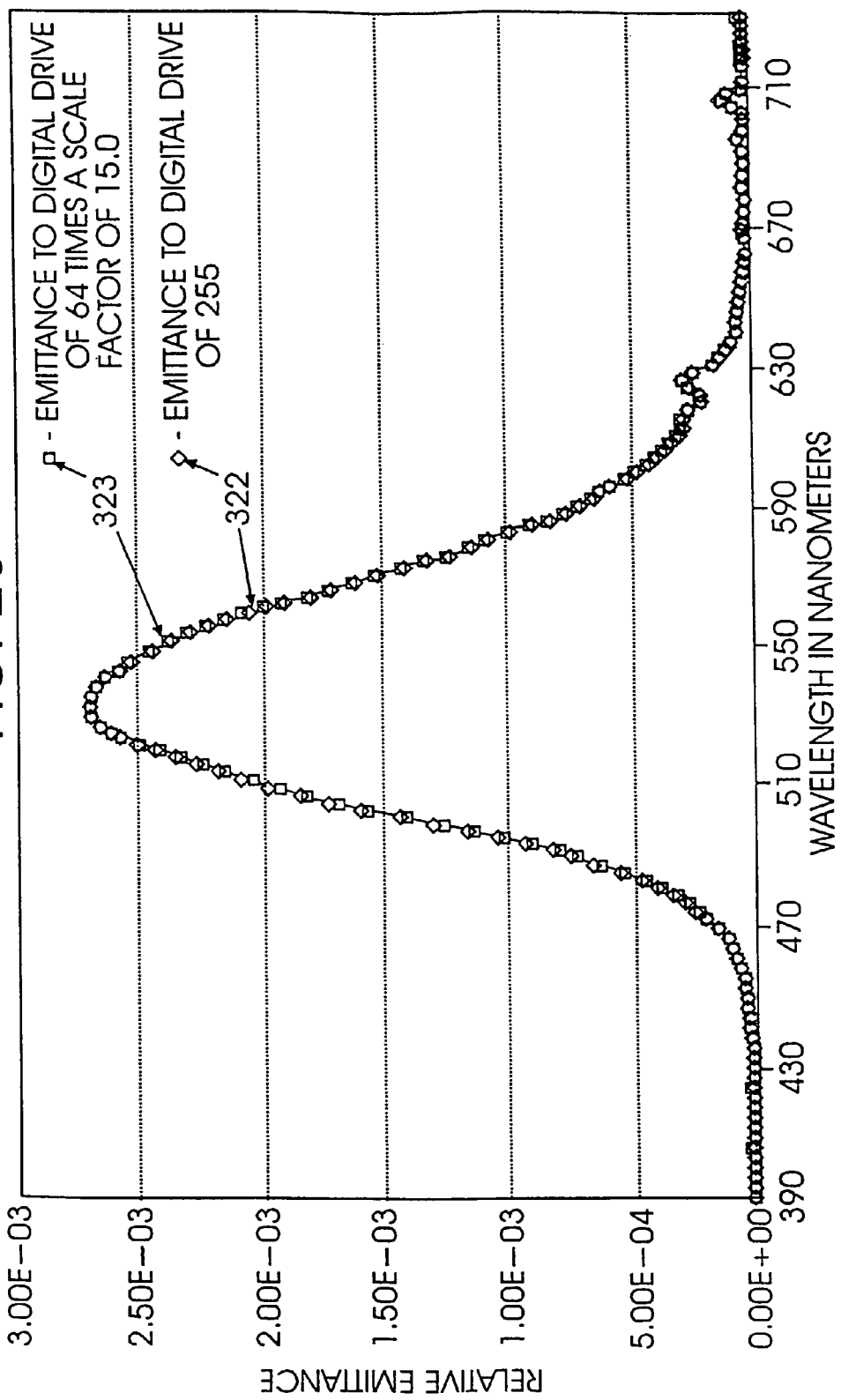

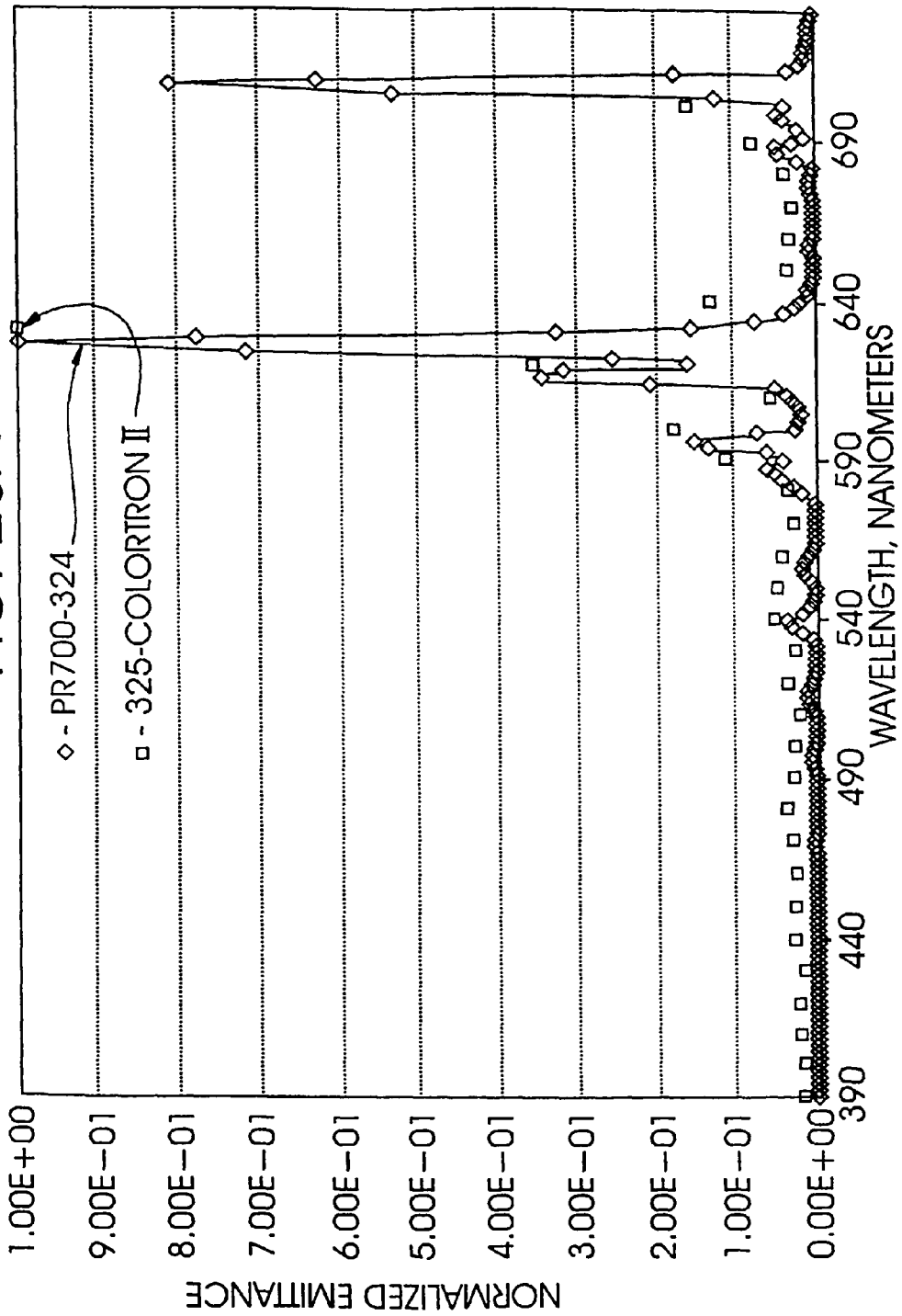

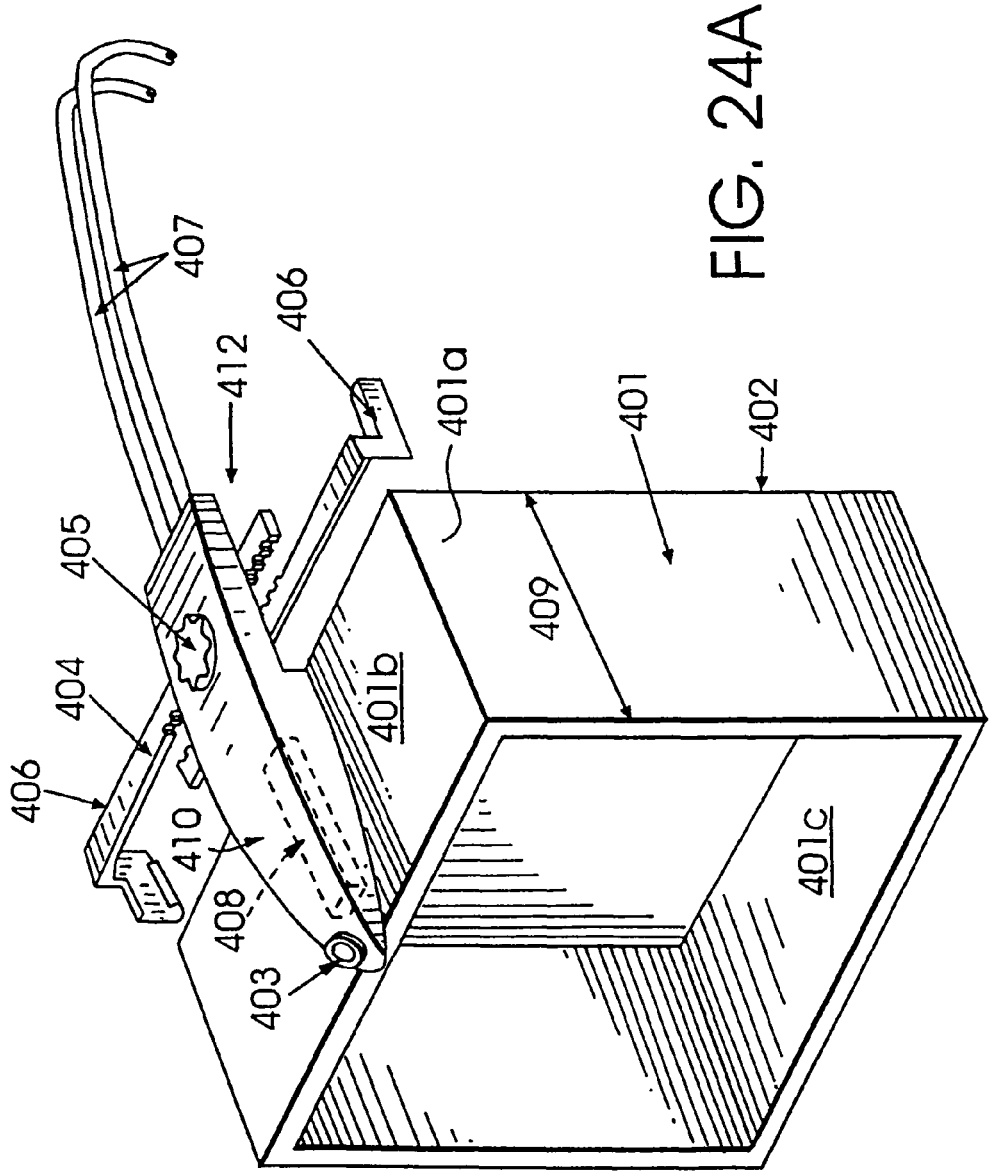

| | |
|---|---|
| D0 | SET OUTPUT-FREQUENCY SCALING TO DIVIDE BY 1. |
| D1 | SET OUTPUT-FREQUENCY SCALING TO DIVIDE BY 2. |
| D2 | SET OUTPUT-FREQUENCY SCALING TO DIVIDE BY 10. |
| D3 | SET OUTPUT-FREQUENCY SCALING TO DIVIDE BY 100. |
| S0 | SET INPUT SENSITIVITY TO 1x. |
| S1 | SET INPUT SENSITIVITY TO 10x. |
| S2 | SET INPUT SENSITIVITY TO 100x. |
| P0 | POWER DOWN SENSOR UNTIL 'S' COMMAND. |
| P1 | POWER DOWN SENSOR UNLESS READING. |
| Tx $(0 \leq x \leq FFFF)$ | SET SAMPLING PERIOD TO $(3.2768)(x)$ MILLISECONDS. |
| R | TAKE READING. |
| E0 | TURN ECHO OFF. |
| E1 | TURN ECHO ON. |
| Q | QUERY VERSION OF SOFTWARE. |

FIG. 29

SYSTEM FOR DISTRIBUTING AND
CONTROLLING COLOR REPRODUCTION
AT MULTIPLE SITES

This application is a divisional of U.S. patent application Ser. No. 11/413,949, filed Apr. 28, 2006, now U.S. Pat. No. 7,710,560, which is a divisional of U.S. patent application Ser. No. 10/209,431, filed Jul. 31, 2002, now U.S. Pat. No. 7,075,643, which is a divisional of U.S. patent application Ser. No. 09/139,498, filed Aug. 25, 1998, now U.S. Pat. No. 6,459,425, which claims the benefit of U.S. Provisional Patent Application Ser. No. 60/056,947, filed Aug. 25, 1997, and is related to co-pending patent application Ser. No. 08/606,883, filed Feb. 26, 1996, now U.S. Pat. No. 6,043,909.

FIELD OF THE INVENTION

The present invention relates to a system (method and apparatus) for distributing and controlling color reproduction at multiple sites, and particularly to, a system for distributing and controlling the color output of rendering devices, such as color monitors, proofing devices, and presses, at multiple sites or nodes of a network to provide a uniform appearance of color within the output colors attainable at each rendering device. The invention utilizes a color measurement instrument associated with each rendering device for obtaining color calibration data for calibrating the rendering device. The system is controlled by computers at each node and utilizes a data structure, referred to herein as a Virtual Proof, to store and distribute color transformation information in the network. Color image data representing one or more pages or page constituents can be distributed to the nodes separately from the Virtual Proof.

BACKGROUND OF THE INVENTION

In the printing and publishing industry, the increasing modularity of manufacturing operations is enabling customization of products. At the same time, pressures to reduce inventories and to keep them fresh are driving a trend toward just-in-time production and stocking. Wherever the manufacturing can be decentralized and distributed geographically, just-in-time production is facilitated because producers are closer to consumers in space and time. There is an ecological dividend, as well, in reduced demands on the transportation system. Overall product cost may decrease with shipping expense. At the same time, however, the challenge of maintaining uniform quality across a network of production sites increases. Minimizing startup waste gains in importance as does compensating for uneven skill and experience of operators. Color is a key variable to control because it affects product appearance and perceived quality.

Today for example, a magazine with a national circulation of 5 million may be printed at 5 regional plants scattered across the nation. Distribution (transportation and postage) generally account for one third of the cost of the product while transit time has a significant impact on product "freshness," i.e., the timeliness of the information delivered.

Production is as centralized as it is partly in order to maintain reasonably homogeneous quality. Nevertheless, printed color varies within a press run and from site to site because there have been only limited means of coordinating control of product appearance among sites. The scope and significance of this problem is apparent when one considers how much commerce and economic activity are leveraged by advertising and that generally more than 60% of all printing is advertising-related. Analogous problems also arise in other media, particularly now that digital video images can be edited in real time and broadcast directly.

The preceding paragraphs have spoken about parallel mass-production at multiple sites. Publishing is also distributed in the sense that the sequential steps of preparation for volume production occur at distinct sites, as illustrated in FIG. 1. Oftentimes, the sites represent different business entities (for example, an advertising agency, a publisher, or an engraver) which are geographically separated. Solid lines in FIG. 1 represent links connecting the sites in the production process. Overlaid in FIG. 1 are dotted boundaries indicating a cluster of pre-publishing facilities which handle sequential phases of the process under Product Prototype 1, and printing facilities which may be involved in parallel Volume Production 2.

Currently prevalent volume printing technologies such as offset lithography, employ a printing "plate" which bears fixed information and is the tool or die of volume production. The tool is mounted on a press and numerous copies of the printed product are stamped out. For technologies such as ink jet and electrophotography the information on the plate can be changed from one revolution of the press to the next. This technological development enables significant product customization and is compatible with just-in-time production scenarios. It also enables process control in which the electronic data flowing to the device are modified to adapt to changes in the marking engine. However, the consistency (or repeatability) of these processes makes them even more susceptible to regional variations in quality across the production sites than lithography and its relatives.

For all of the printing technologies mentioned, there is a common problem of uniform and accurate color reproduction. Analogous problems also exist in other media for distributing color graphic or image content, such as CDROM or the Internet. Consider an advertiser in New York, physically removed from the five production sites mentioned above, or the more numerous sites that may be involved in the future. There is a keen interest in having the product portrayed in as faithful an accord with the advertiser's artistic conceptions as possible, even when the ad is to appear in different publications printed on different substrates by different machinery or in the same publication disseminated through different media.

Today, the approval cycle, the means by which print buyer and printer reach contractual agreement about the acceptability of product, often proceeds as outlined in FIG. 1 in the publication segment of the industry. Phases or functions of production are enclosed in ellipses 1a, 1b and 1c and key products of theses functions are enclosed by rectangles 3, 5, 6, 7, 8 and 9. The dashed line between creation 1a and prepress 1b shows the blurring of those functions in the development of intermediate products, such as page constituents like lineart, images, text and comps. Prepress 1b on the way to film 5 may include rasterization, separation and screening 4. However, acceptance of computer-to-plate technology will blur the boundary between prepress 1b and production 1c.

The long, heavy boundary line between press-proofing in low volume reproduction 1c and high volume production 2 represent the distinctness of the two functions: the former is carried out by engravers or commercial printers. Note that volume production 2 may occur at multiple sites. Linkages in the approval process are shown by arcs 10a and 10b at the bottom of FIG. 2, where 10a is the traditional off-press proof and 10b is a press proof. The transactions in the approval process involve one or more generations of static proofs which are prepared with limited regard for the capabilities of the final, volume-production devices. In other words, there is no feedback from production to earlier functions. The process results in idle time for equipment and personnel and waste of consumables (paper, ink etc.) Furthermore, it usually does not give the print buyer any direct say about the appearance of the ultimate product unless the buyer travels to the printing plant, an expensive proposition.

The workflow for commercial printing is slightly different from that described above, since press-proofs are seldom used and the print buyer or his agent often go to the printer's for approval. However, the essential lack of feedback is also prevalent in the commercial environment as well.

It is clear that a common language of color could insure improved communication, control and quality throughout the sites of FIG. 1. The common language is a color space, typically based on the internationally accepted Standard Observer which quantifies color in terms of what normal humans see, rather than in terms of specific samples or instances of color produced by particular equipment. The Standard Observer is the basis of device-independent, colorimetric methods of image reproduction and is defined by the Commission Internationale de L'Eclairage in CIE Publication 15.2, 1986. Central Bureau of the CIE. Box 169. Vienna, Austria. Approximately uniform perceptual color spaces based upon the Standard Observer are also discussed in this publication.

Color Space is defined as a three-dimensional, numerical scheme in which each and every humanly perceivable color has a unique coordinate. For example. CIELAB is a color space defined by the CIE in 1976 to simulate various aspects of human visual performance. Color in the next section will refer to CIE color or what we see, while colorant will refer to particular physical agents, such as dyes, pigments, phosphors, and the like that are instrumental in producing sensations and perceptions of color in a human at rendering devices, such as presses and video screens.

An early machine for converting color image data to colorant specifications for a 3 or 4-channel reflection reproduction process was described by Hardy and Wurzburg (Color correction in color printing. J. Opt. Soc. Amer. Vol. 38, pp. 300-307, 1948.) They described an electronic network provided with feedback to control convergence to the solution of an inverse model of colorant mixture and produce 4-colorant reproductions indistinguishable from 3-colorant reproductions made under like conditions. The set point for the control was the color of the original. This work serves as a starting point for many subsequent developments in the art particularly as regards device independent color reproduction technologies and color separation, i.e., the preparation of printing plates for 3 or more colorants.

In U.S. Pat. No. 2,790,844, Neugebauer discloses a system to extend the Hardy-Wurzburg machine. It describes the capture and representation of color imagery in a colorimetric (or device independent) coordinate system. To enable an operator to judge the effect of color corrections while he is making these color corrections, the system provides for a soft proof realized by projecting video images onto the type of paper stock to be used in the final reproduction with careful regard to making the surround illumination and viewing conditions comparable to those prevailing when the final product is viewed. The objective of the soft proof was to simulate a hard copy proof or final print. This is in contrast to U.S. Pat. No. 4,500,919, issued to Schreiber, which discloses a system to match the hard copy to the monitor image.

Concerning models of color formation by combination of colorants. Pobboraysky (A proposed engineering approach to color reproduction. TAGA Proceedings, pp. 127-165, 1962) first demonstrated the use of regression techniques (curve fitting) to define mathematical relationships between device independent color (in the CIE sense) and amounts of colorant with accurate results. The mathematical relationships took the form of low order polynomials in several variables.

Schwartz et al. (Measurements of Gray Component Reduction in neutrals and saturated colors, TAGA Proceedings, pp. 16-27, 1985) described a strategy for inverting forward models (mathematical functions for converting colorant mixtures to color.) The algorithm was similar to Hardy and Wurzburg's but implemented with digital computers; it consists of iteratively computing (or measuring) the color of a mixture of colorants, comparing the color to that desired and modifying the colorants in directions dictated by the gradients of colorants with respect to color error until color error is satisfactorily small. Color error is computed in CIE uniform coordinates. The context of the work was an implementation of an aspect of the art known as Gray Component Replacement (GCR.)

Because normal human color perception is inherently 3-dimensional, the use of more than 3 colorants is likely to involve at least one colorant whose effects can be simulated by a mixture of two or more of the others (primaries.) For example, various amounts of black ink can be matched by specific mixtures of the primary subtractive colorants cyan, magenta and yellow. The goal of Schwartz et al. was a method for finding colorimetrically equivalent (indistinguishable in Hardy and Wurzburg's words) 4-colorant solutions to the problem of printing a given color that used varying amounts of black. Additional colorants (more than 3) are used to expand the gamut; black enables achievement of densities in reflection reproduction processes that are not otherwise available. A gamut is the subset of human perceivable colors that may be outputted by a rendering device. However, increased reliance on black through GCR has other important dividends: a) there is an economic benefit to the printer and an environmental benefit at large in using less colored ink, b) use of more black affords better control of the process.

Boll reported work on separating color for more than four colorants (A color to colorant transformation for a seven ink process. SPIE Vol. 2170, pp. 108-118, 1994, The Society for Photo-Optical and Instrumentation Engineers. Bellingham, Wash.). He describes the Supergamut for all seven colorants as a union of subgamuts formed by combinations of subsets of 4-at-a-time of the colorants. Because of the manner in which his subsets are modeled, the method severely limits flexibility in performing GCR.

Descriptions of gamuts in colorimetric terms date at least to Neugebauer (The colorimetric effect of the selection of printing inks and photographic filters on the quality of multicolor reproductions, TAGA Proceedings, pp. 15-28, 1956.) The first descriptions in the coordinates of one of the CIE's uniform color spaces are due to Gordon et al. (On the rendition of unprintable colors, TAGA Proceedings, pp. 186-195, 1987.) who extended the work to the first analysis of explicit gamut operators—i.e., functions which map colors from an input gamut to correspondents in an output gamut.

A detailed review of requirements of and strategies for color systems calibration and control was published by Holub, et al. (Color systems calibration for Graphic Arts, Parts I and II, Input and output devices, J. Imag. Technol., Vol. 14, pp. 47-60, 1988.) These papers cover four areas: a) the application of color measurement instrumentation to the calibration of devices, b) requirements for colorimetrically accurate image capture (imaging colorimetry) c) development of rendering transformations for 4-colorant devices and d) requirements for soft proofing.

Concerning the first area (a), U.S. Pat. No. 5,272,518, issued to Vincent, discloses a portable spectral colorimeter for performing system-wide calibrations. The main departure from the work of Holub et al., just cited, is in the specification of a relatively low cost design based on a linearly variable spectral filter interposed between the object of measurement and a linear sensor array. Vincent also mentions applicability to insuring consistent color across a network, but does not discuss how distributed calibration would be implemented. There is no provision for self-checking of calibration by Vincent's instrument nor provision for verification of calibration in its application.

U.S. Pat. No. 5,107,332, issued to Chan, and U.S. Pat. No. 5,185,673, issued to Sobol, disclose similar systems for performing closed-loop control of digital printers. Both Chan and Sobol share the following features: 1) They are oriented toward relatively low quality, desktop devices, such as ink jet printers. 2) An important component in each system is a scanner, in particular, a flat-bed image digitizer. 3) The scanner and printing assembly are used as part of a closed system of calibration. A standardized calibration form made by the printing system is scanned and distortions or deviations from the expected color values are used to generate correction coefficients used to improve renderings. Colorimetric calibration of the scanner or print path to a device independent criterion in support of sharing of color data or proofing on external devices was not an objective. 4) No requirements are placed upon the spectral sensitivities of the scanner's RGB channel sensitivities. This has ramifications for the viability of the method for sets of rendering colorants other than those used in the closed printing system, as explained below.

In Sobol, the color reproduction of the device is not modeled; rather the distortions are measured and used to drive compensatory changes in the actual image data, prior to rendering. In Chan, there appears to be a model of the device which is modified by feedback to control rendering. However, colorimetric calibration for the purposes of building gamut descriptions in support of proofing relationships among devices is not disclosed.

Pertaining to item (b) of the Holub. et al. paper in J. Imaging Technology and to the foregoing patents, two articles are significant: 1) Gordon and Holub (On the use of linear transformations for scanner calibration, Color Research and Application. Vol. 18, pp. 218-219, 1993) and 2) Holub (Colorimetric aspects of image capture, IS&T's 48th Annual Conference Proceedings, The Society for Imaging Science and Technology, Arlington. Va., pp. 449-451, May 1995.) Taken together, these articles demonstrate that, except when the spectral sensitivities of the sensor's channels are linear combinations of the spectral sensitivity functions of the three human receptors, the gamut of an artificial sensor will not be identical to that of a normal human. In other words, the artificial sensor will be unable to distinguish colors that a human can distinguish. Another consequence is that there is generally no exact or simple mathematical transformation for mapping from sensor responses to human responses, as there is when the linearity criterion set forth in this paragraph is satisfied by the artificial sensor.

To summarize the preceding paragraphs: The objective of measuring the colors of reproduction for the purpose of controlling them to a human perceptual criterion across a network of devices in which proofing and the negotiation of approval are goals is best served when the image sensors are linear in the manner noted above.

Results of a colorimetric calibration of several printing presses were reported by Holub and Kearsley (Color to colorant conversions in a colorimetric separation system. SPIE Vol. 1184. Neugebauer Memorial Seminar on Color Reproduction, pp. 24-35, 1989.) The purpose of the procedure was to enable workers upstream in the production process in a particular plant to be able to view images on video display devices, which images appeared substantially as they would in production, consistent with the goals of Neugebauer in U.S. Pat. No. 2,790,844. Productivity was enhanced when design could be performed with awareness of the limitations of the production equipment. The problem was that the production equipment changed with time (even within a production cycle) so that static calibration proved inadequate.

In U.S. Pat. No. 5,182,721, Kipphan et al. disclose a system for taking printed sheets and scanning specialized color bars at the margin of the sheets with a spectral colorimeter. Readings in CIELAB are compared to aim values and the color errors so generated converted into corrections in ink density specifications. The correction signals are passed to the ink preset control panel and processed by the circuits which control the inking keys of the offset press. Operator override is possible and is necessary when the colorimeter goes out of calibration, since it is not capable of calibration self-check. Although the unit generates data useable for statistical process control, the operator must be pro-active in sampling the press run with sufficient regularity and awareness of printed sheet count in order to exploit the capability. The process is closed loop, but off-line and does not read image area of the printed page. Important information regarding color deviations within the image area of the press sheet is lost by focussing on the color bars.

On page 5 of a periodical Komori World News are capsule descriptions of the Print Density Control System, which resembles the subject of Kipphan et al. Also described is the Print Quality Assessment System, which poises cameras over the press. The latter is primarily oriented toward defect inspection and not toward on-line color monitoring and control.

Sodergard et al. and others (On-line control of the colour print quality guided by the digital page description, proceedings of the 22nd International Conference of Printing Research Institutes. Munich. Germany. 1993 and A system for inspecting colour printing quality. TAGA Proceedings. 1995) describe a system for grabbing frames from the image area on a moving web for the purposes of controlling color, controlling registration and detecting defects. The application is in newspaper publishing. Stroboscopic illumination is employed to freeze frames of small areas of the printed page which are imaged with a CCD camera. The drawback of the Sodergard et al. system is that color control lacks the necessary precision for high quality color reproduction.

Optical low pass filtering (descreening) technology relevant to the design of area sensors for imaging colorimetry is discussed in U.S. Pat. No. 4,987,496, issued to Greivenkamp, and Color dependent optical prefilter for the suppression of aliasing artifacts, Applied Optics. Vol. 29, pp. 676-684, 1990.)

Paul Shnitser (Spectrally adaptive acousto-optic tunable filter for fast imaging colorimetry, Abstract of Successful Phase I Proposal to U.S. Dept. of Commerce Small Business Innovation Research Program. 1995) and Clifford Hoyt (Toward higher res. lower cost quality color and multispectral imaging, Advanced Imaging, April 1995) have discussed the applicability of electronically tunable optical/spectral filters to colorimetric imaging.

In Thin-film measurements using SpectraCube™, (Application Note for Thin Film Measurements. SD Spectral Diagnostics Inc., Agoura Hills, Calif. 91301-4526) Garini describes a spectral imaging system employing " . . . a proprietary optical method based on proven Fourier spectroscopy, which enables the measurement of the complete visible light spectrum at each pixel . . . "

The applicability of neural network (and other highly parallel and hybrid) technologies to the calibration and control of rendering devices has been considered by Holub ("The future of parallel, analog and neural computing architectures in the Graphic Arts." TAGA Proceedings, pp. 80-112, 1988) and U.S. Pat. No. 5,200,816, issued to Rose, concerning color conversion by neural nets.

A formalism from finite element analysis is described in Gallagher. "Finite element analysis: Fundamentals." Englewood Cliffs. N.J. Prentice Hall, pp. 229-240, 1975, for use in the rapid evaluation of color transformations by interpolation.

Area (d) of the earlier discussion of Holub et al.'s review referred to principles guiding the design and application of softproofing: methods of calibrating video displays, evaluation of and compensation for illumination and viewing conditions, representation of how imagery will look on client devices and psychophysical considerations of matching appearance across media.

In the article "A general teleproofing system." (TAGA Proceedings, 1991, The Technical Association of the Graphic Arts, Rochester, N.Y.) Sodergard et al. and others discuss a method for digitizing the analog image of an arbitrary monitor for transmission through an ISDN telecommunications link to a remote video display. The method involves the transmission of the actual image data, albeit at the relatively low resolution afforded by the frame buffers typical of most displays. This method lacks any provision for calibration or verification of the devices at either end of a link and also lacks the data structures needed to support remote proofing and negotiation of color approval.

In U.S. Pat. No. 5,231,481, Eouzan et al. disclose a system for controlling a projection video display based on cathode ray tube technology. A camera is used for capturing image area of a display. The procedures are suited to the environment in which the displays are manufactured and not to where they are used. Concepts of colorimetric calibration of the display and control of display output to a-colorimetric criterion are not disclosed.

In U.S. Pat. No. 5,309,257, Bonino et al. disclose a method for harmonizing the output of color devices, primarily video display monitors. In a first step, measurements of the voltage in vs. luminance out relationship are made for each of the three display channels separately and then the V/L functions of all the devices are adjusted to have a commonly achievable maximum. This is assumed to insure that all devices are operating within the same gamut—an assumption which is only true if the chromaticities of the primaries in all devices are substantially the same. The single-channel luminance meter (a photometer) described as part of the preferred embodiment does not permit verification of the assumption. Bonino et al. thus employs photometric characterization of devices and lacks a colorimetric characterization.

The Metric Color Tag (MCT) Specification (Rev 1.1d. 1993. Electronics for Imaging. Inc. San Mateo, Calif. is a definition of data required in data files to allow color management systems to apply accurate color transformations. The MCT thus does not provide a file format defining the full specification of color transformations in the context of distributed production and color-critical remote proofing.

In contrast to the MCT, the International Color Consortium (ICC) Profile Format is a file format, and is described in the paper, International Color Consortium Profile Format (version 3.01, May 8, 1995). A profile is a data table which is used for color conversion—the translation of color image data from one color or colorant coordinate system to another. The ICC Profile Format provides for embedding profiles with image data. This generates large data transfers over a network whenever profiles are updated. Further, the ICC Profile. Representation of devices in the ICC Profile Format is limited in supporting "scnr" (scanner). "mntr" (video display monitor) and "prtr" (printer) device types, and is not readily extendable to other types of devices.

Interactive remote viewing is described for imagexpo application software from Group Logic, Inc., in the article "Introducing imagexpo 1.2: Interactive remote viewing and annotation software for the graphic arts professional" and "Before your very eyes." (reprinted from Publishing & Production Executive, August 1995), which acknowledges that extant tools do not enable remote handling of color-critical aspects of proofing.

Color management refers to the process of converting digital image data from a format or representation suited for one device to one suited for another. Often, the conversion employs a device independent intermediary color space such as one promulgated by the Commission Internationale de L'Eclairage (CIE.) A device-independent color space provides a means of quantifying colors as a color-normal human perceives them (or, more precisely, matches them) rather than as particular samples or instances of color produced by a device.

For example, image data may be introduced to a computer system by scanning. The data are initially in a coordinate system which is specific to the scanner and not understandable by any other device. In order to reproduce the image with a printer so that a human recognizes the print as a faithful replica of the original image, it is necessary to translate scanner codes to printer codes.

Color translation may be performed by an expert human knowledgeable in the languages of the two devices. This is the traditional method of color management. Alternatively, both devices may be calibrated by instruments which simulate human color-matching. The instruments analyze a sample to produce a set of color coordinates identical to those selected by the CIE Standard Observer in the original color matching experiments. The Standard Observer represents an average, color-normal human.

The calibration data acquired from a device with a color matching instrument are commonly used in the preparation of translators which convert the color coordinates of one device to those of another through intermediate, device-independent coordinates. An important motivation for introducing color instrumentation and color management to the workflow is reduction of the level of skill required of the human operator (s.) The benefits of the automation are enlargement of the market for color in documents and a reduction of the cost of color.

Typically, calibration devices are limited in one or more of the following ways. First, many of the devices require manual measurements of samples under circumstances conducive to operator error. An unskilled operator is ill-equipped to recognize likely problems in the data. Second, an instrument may require physical contact with the copy and consequent scuffing or transfer of fingerprints and skin oils. Samples are routinely affected by this before they are measured and the accuracy of a dataset is compromised. Instruments used with monitors are affixed with suction devices leaving rings of residue which have to be cleaned up or which affect subsequent measurements. The devices clutter the workspace when not in use and require significant operator involvement in measurement. Third, an instrument may require calibration by the operator. A black trap may be provided whose purpose and proper application is not understood by an unskilled operator and which constitutes desktop clutter most of the time. Likewise, proper use, cleaning and maintenance of white calibration plaques often used in calibration are not usually performed. Fourth, instrument-to-instrument variation precludes calibration of devices at different sites to a tolerance that will support confident, remote proofing. Thus, typical calibration instrumentation of a rendering device is not sufficiently fool-proof to serve the intended purpose of automating the process of interdevice color reproduction.

SUMMARY OF THE INVENTION

It is the principal object of the present invention to provides an improved color imaging system in which color measurements are accurately provided by rendering devices using a calibration system including the computer coupled to each rendering device and a color measurement instrument.

Another object of the invention is to provide improved color measuring systems, methods, and apparatuses for a rendering device, such as a color display or printer, for enabling color calibration and Virtual Proofing.

A further object of the present invention is to provide improved color measuring systems, methods or apparatuses for a rendering device which are self- or auto-calibrating, minimize user involvement, and are non-contact with the sample being measured.

Yet a further object of the present invention is to provide an improved system for controlling color reproduction on network of nodes having rendering devices, in which a computer server at one node stores a database of color profiles for calibrating rendering device at other nodes.

Briefly described, a system embodying the present invention for calibrating a color display includes an assembly of a first member surrounding the outer periphery of a display, and a color measuring instrument coupled to the first member and spaced from the screen at an angle with respect to the screen for receiving light from the screen. The color measurement instrument comprises a housing, at least one sensor in the housing for converting light received by the sensor from the screen into electrical signals representative of the light, optics in the housing for focusing light onto the sensor, and a control circuitry for receiving the electrical signals from the sensor and converting the electrical signals into signals representative of the color or the light received by the sensor. A computer coupled to the color display receives the signals from the color measurement instrument for calibrating the display and enabling Virtual Proofing utilizing the color display.

Another system embodying the present invention provides for measuring color samples rendered by a printer includes a mechanism for transporting a sheet rendered from the printer having color samples, and at least one optical sensor coupled to the mechanism which is directed to the sheet to measure the color of the color sample. The mechanism may be separate from the printer or integrated in the printer. The sensor has at least one fiber optic probe coupled to a spectrograph. The spectrograph can automatically obtain references for checking its calibration.

A method is also provided by the present invention for maintaining calibration of a color display having a screen. The method comprises the steps of adjusting the amount of light from the screen when the screen is dark to account for ambient light, neutral balancing the color of the display, measuring the gamma in each color channel of the display, and adjusting the color produced by the display in accordance with the gammas measured in each color channel. This method is especially useful for cathode ray tube type color displays.

Apparatuses are also provided by the present invention for measuring color from samples rendered by a rendering device which utilizes a spectrograph and incorporates references for autocalibration of the spectrograph.

One of such apparatuses includes a dual beam spectrograph having first and second inputs, and a light source. A first fiber optic transmits light from the light source to illuminate the sample. A second fiber optic transmits light from the light source to the first input of the spectrograph. A third fiber optic receives light from the sample, and transmits the received light to the second input of the spectrograph. One or more sensors also receive light from the first fiber optic, wherein signals from the sensors provided information for checking the calibration of the spectrograph.

Another of such apparatuses includes a light source for illuminating a sample, and a one-dimensional array of fiber optics. A first fiber optic of this array receives light from said light source. A second fiber optic of this array receives light representing a dark reference. A third fiber optic of this array transmits light of one or more known wavelengths, while the remaining fiber optics of this array receive light along one-dimension from the sample. A spectrograph is provided which receives the light from the array of fiber optics and outputs a spectrum in accordance with the light received from the array of fiber optics, where the part of the spectrum related to the first, second, and third fiber optics provide information for checking the calibration of the spectrograph. Thus, the part of the line of light from the first, second, and third fiber optics automatically provide calibration references.

The color measuring instruments incorporating the systems, method, and apparatuses described herein provide for self-calibration by incorporating calibration references into the instrument. Measurements of the reference may be made frequently so that measurements of unknowns can be compared to them. Preferably, a reference measurement is taken either simultaneously or successively with each reading of an unknown sample. The computer, coupled to the rendering device, outputs images upon the rendering device corresponding to the calibration references, and the calibration mechanism read color calibration data from the outputted images. The color measurement instrument for a color display may be self-calibrating by the use of a second sensor which is protected from receiving any light. In addition to self-calibration, the color measuring instruments described herein further improve accuracy by requiring only a minimum of user involvement. In the case of reflection or transmission measurements, a transport mechanism may be actuated by click of computer mouse or, preferably, by insertion of the sheet in the transport mechanism. Upon actuation, samples inserted in the transport mechanism are measured and the measurements processed without further operator intervention. In the case of a color display, the sensor (i.e. light-collecting optics) are located in a circumferential member surrounding the periphery of the color display. The device is positioned and measurement scheduled unobtrusively and the user is relieved of responsibility other than linking the pickup to a control unit.

The color measuring instruments may be located in modules to facilitate their incorporation with rendering device. For example, the transport mechanism for physical copy and associated light-collecting optics constitute a module distinct from the module which attaches to video display and from the module containing sensor(s) and control electronics. Light-collecting modules may be connected to the control module by fiber optic links.

A further system embodying the present provides for controlling color reproduction in which one of a network of nodes has a computer server having a database which stores data for calibration rendering devices at other of the nodes. The data may represent one or more color profiles.

BRIEF DESCRIPTION OF THE DRAWINGS

The foregoing and other features, objects, and advantages of the invention will become more apparent from a reading of the following detailed description in connection with the accompanying drawings, in which.

FIG. 3B shows a configuration of a color measuring instrument sensor for a video screen display;

FIG. 3C shows geometries of a color measuring instrument sensor for making non-contact color measurements of reflective substrate;

FIG. 14 is an illustration of the construction of a simple gamut operator of the gamut configuration data embodying properties of invertibility and reciprocality:

FIG. 16B is a flow chart of the process for calibrating a rendering device having more than four colorants by adding a neutral auxiliary colorant to a rendering transformation, in which FIGS. 16A and 16B are shown connected:

FIG. 21E is a menu at the third level of hierarchy of the GUI which depicts the User interface to black utilization tools in providing black color data, and to neutral colorant definitions;

FIG. 21F is a menu at the third level of hierarchy of the GUI which depicts the User interface to gamut processing at a rendering device in the network;

FIG. 23 is a graph illustrating the spectrum of the green phosphor emission from a cathode ray tube (CRT) color display;

FIG. 23A is a graph illustrating the spectral emission of a red phosphor emission from two different models of colorimeters;

FIG. 24A is a perspective view showing an example of an assembly for mounting a color measuring instrument to a video screen display;

FIG. 29 is table of the a command set uses by a computer to communicate with the color measurement instrument of FIG. 28:

DETAILED DESCRIPTION OF THE INVENTION

Figure 3A:
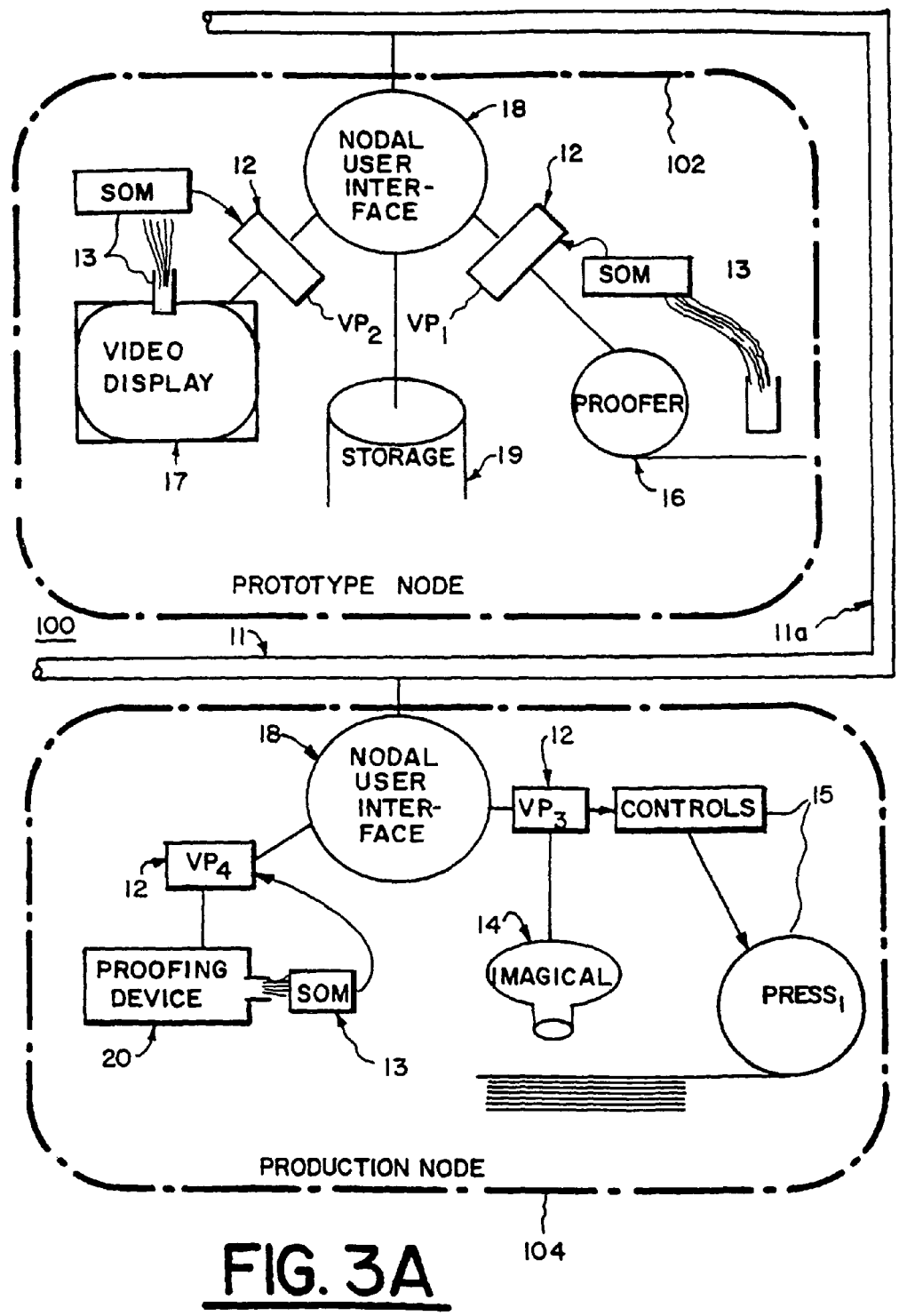
FIG. 3A shows the system in accordance with the present invention.

Referring to FIG. 3A, the system 100 of the present invention is shown. System 100 has a network 11 having a pipe 11a through which multiple nodes (or sites) of network 11 can be linked for data flow between nodes. Network 11 may be a telecommunication network, WAN, LAN (with a server) or Internet based. Two types of nodes are present in system 100, prototype nodes 102 and production nodes 104. For purposes of illustration, only a general node of each type is shown in FIG. 3A, however there may be multiple nodes of each type in network 11. Network 11 is modifiable to be configured by any one node to connect any two or more nodes in system 100. Each node has a micro-processor based computer: with a network communication device, such as a modem, which is part of a system having a rendering device for producing color reproduction and color measuring instrument (CMI) for measuring the color output of the rendering device. The computer may be a programmable general purpose computer or mainframe computer. Although a computer at a node is preferred, alternatively, the computer may be omitted at a node and the node operated remotely via pipe 11a from another node.

Prototype nodes 102 allow a user to perform pre-publishing functions in system 100, such as proofing (hard or soft), as well as the input of digital color image data. A user may interface with the node through standard interface devices, such as a keyboard or mouse. Rendering devices in system 100 define any type of system or device for presenting a color reproduction in response to digital color signals. The rendering devices of prototype node 102 are proofing devices, such as video screen display device 17 or proofer device 16. Proofing device 16 are hard copy devices, such as analog film-based devices, dye diffusion thermal transfer devices, ink jet printers, xerographic printers, and other similar devices. Video screen display 17 is useful for soft proofing (without a hard copy) and may be a high resolution video projection display for projecting images onto paper substrate(s) to be used in volume reproduction with resolution sufficient to reveal moiré, i.e., halftone frequency beating patterns. Note that proofing devices are typically used to represent the performance of a client, such as a production rendering device described below at production node 104. The CMI associated with each proofing device is referred to as a standard observer meter (SOM) 13 and provides color measurement data from images from the proofing device. SOMs 13 have the capability of measuring color as humans see it using the internationally accepted Standard Observer mentioned earlier, and will be described in more detail later.

One of the pre-publishing functions supported by prototype node 102 is designing page layouts. Accordingly, a user or designer at nodes 102 can input digital color graphical/image data from a storage 19, which may be a hard drive, or from other sources. The color image data may consist of page layouts having images at low and high resolutions, such as RGB. A user at the node can define color preferences for rendering of the color image data, and later modify such preferences. The rendering of the inputted color image data at rendering devices to create soft or hard proofs is discussed later.

Production nodes 104 of network 11 control a production rendering device via the device's control system. Production rendering devices include volume production machinery, such as press 15, which includes gravure presses, offset presses, electrophotographic printing machines, ink jet printers, flexographic presses, and the like. In addition, production nodes 104 may also have one or more rendering devices and SOMs 13 of a prototype node 102, such as proofing devices 20, which allows proofing to occur at a production site. CMIs of node 104 are called imagicals. Like SOMs 13 of prototype nodes 102, imagicals 14 provide color data for images rendered by press 15 in color coordinates of the Standard Observer. Proofing devices at prototype nodes 102 may also be outfitted with imagicals 14 which may incorporate a SOM 13. The differences between SOMs 13 and imagicals 14 will be described later. The main distinctions between production rendering devices and proofing devices are that the proofing devices are typically called upon to represent some other device, referred to herein as a client, such as printing press 15 of a production node 104 and such presses may have interfaces to and mechanisms of control that are different from those of proofers.

At a production rendering device, the circuitry at node 104 differs from node 102 because it interfaces with inking control systems of the production rendering device to maintain its color quality during volume reproduction. This allows control of the actual marking process, including variables such as ink film thickness, toner density, and the like, by supporting on-line colorimetry from a CMI within image areas of printed sheets. Analysis of the CMI data can be used to produce error signals in CIELAB color difference units or in other units suitable for interface to commercially available inking control systems.

The nodes 102 and 104 each provide circuitry, which includes the computer and modem described above, for computation and communication. This circuitry operates responsive to programming of interface and application software stored at the nodes 102 and 104, and received user commands at the nodes. The processes defined by such programming operate system 100. The circuitry perform several functions. First, it accepts measurement data from CMIs and computes color transformation function is to translate between human-perceptible colors of the measurement data into rendering device colorant values. Second, it processes and transmits color graphical/image data from one node or site in a network 11 to another. Third, it can issue reading instructions to CMIs mounted on a rendering device to measure rendered color images, and issue rendering instructions to a rendering device at the node using a stored color transformation. Fourth, the circuitry performs communications in system 100 in accordance with protocols for local or wide area networks, or telecommunications networks based on modem (either direct or mediated by Internet connection—note that Internet connectivity is not limited to modem.) satellite link. T1 or similar leased line technologies, ISDN, SMDS and related switched linkages, including Asynchronous Transfer Mode-enabled versions. TCP/IP, token ring, and the like. Fifth, the circuitry implements calibration of rendering devices to a common, human perceptible language of color, such as CIE, defined earlier, by producing and storing color transformation information. Sixth, the circuitry performs verification of the calibration of the rendering device to maintain accuracy of the stored color transformation information. These and other capabilities of the circuitry at a node will become apparent from the below discussion which describe further the processes referred to above.

A feature of the present invention is a data structure operating within system 100 called a Virtual Proof, hereafter called VP 12. The VP data structure is a file structure for storing and transmitting files representing color transformation information between network 11 nodes. The contents of these files is outlined later. The VP is dynamic because it can be revised by nodes to assure the output color (colorants) of a rendering device using data from CMIs. Preferably, the VP does not contain color image data representing page layouts, and is associated with the page layouts. However, it can alternatively have files storing some image data, although being separable from the often bulky high resolution image data representing the page layouts. The VP has components or files shared by the nodes in network 11, and local components or files present only at each node. Shared components are those useful by more than one node in network 11, while local components are particular to information of each individual node's rendering device. Shared components are transmitted by the circuitry of each node to other nodes of network 11 via pipe 11a. Preferably. VP shared components are compact for transmission from node to node in network 11 quickly. These shared VP components include files representing the user color preferences inputted at node 102 or 104, which is needed by each node in calibrating its rendering device. Each rendering device has its own version of a VP stored at its associated node which represents the shared VP components and local components for that particular rendering device. In FIG. 3A, $VP_1$ $VP_2$ $VP_3$ and $VP_4$ represent the versions of the virtual proof for each rendering device. The arrows from SOM 13 or imagical 14 represents the measurement data received by the node incorporated into color calibration data, which is stored in a local component of the VP.

The VP provides system 100 with many useful features, which include remote proofing for both intermediate and final approval of color products, conferencing at multiple nodes in the network between users which may have different rendering devices, and distributing color preference data with or without page layout image data. The conferencing mentioned above allows users to negotiate over the colors appearing in page layout and to confer about color corrections. For example, conferencing may use video displays 17 (soft proofs) of the page layouts using remote annotation software, such as imagexpo. Another important feature of the VP is that it is modifiable such that as changes occur at a rendering device, such as in inks or substrates, system 100 can automatically adjust the rendering device's calibration. In addition, adjustments to calibration may be performed on demand by a user. This allows a user to update color preferences, such as color assignments of page layouts being rendered by rendering devices in the network without retransmitting the entirety of the image data.

A feature of system 100 is that it compensates for differences in the gamuts of different devices. As described earlier, a gamut is the subset of humanly perceivable colors that may be captured or rendered by a device. The preceding definition implies that the ideal or limiting gamut is the set of all colors that a normal human can see. It is important to distinguish between receptive and rendering gamuts. The former refers to the gamut of a sensor or camera of a CMI, or human. The latter refers to the colors that an output rendering device is capable of producing in a medium by application of its colorants. Although it may be possible to design a rendering device that may produce all the colors we can see under suitable circumstances, rendering gamuts are generally smaller than the human perceptual gamut due to the properties and limitations of practical reproduction media. For example, the gamut of a color print viewed in reflected light is generally smaller than that of a video display device viewed in controlled illumination which is generally smaller than the gamut available with positive photographic transparencies. All the foregoing rendering gamuts are generally smaller than receptive gamuts.

The CMI's of FIGS. 3B and 3C are colorimeters such as discrete (unitary) colorimeters (SOM 13) or imaging colorimeters (imagical 14) which may be used in conjunction with single-channel light-detectors. These colorimeters may be stand-alone units or built-in to a rendering device. As stated earlier, the CMIs are controlled by their associated nodes in system 100 for calibration and verification of rendering devices. SOMs 13 and imagicals 14 are specialized to measure color in different ways. SOMs are suited for measuring a spatially homogeneous patch of color, preferably in a multiplicity of spectral bands. Preferably, at least 15 spectral bands spanning the visible spectrum are sampled, making a SOM more-than-3-channel input device. The transformation from relative spectral energy or reflectance to image colors employs the convolution, a similar technique is described in CIE Publication 15.2, page 23, cited earlier. An example of a SOM is a unitary colorimeter or a spectrophotometer of a U.S. Pat. No. 5,319,437 issued to Van Aken et al.

However, the distinction between SOMs and imagicals is not intrinsic. A SOM with a sufficiently restricted aperture and area of view and which could perform the spectral integrations sufficiently rapidly and which could scan rasters of image data may qualify as an imagical. Imagicals are suited for multi-scale (i.e., variable resolution) imaging colorimetry, consisting of an array of photosensors, such as CCDs, capable of sensing color, as would the Standard Observer.

SOM 13 is calibrated against a reference standard illumination source whose calibration is traceable to the U.S. National Institute of Standards and Technology or similar organization. The calibration of SOM 13 is generally set by the factory producing the device. SOM 13 should be periodically recalibrated to assure its reliability. Calibration of imagicals will be described later.

Further, SOM 13 may be used in conjunction with an imagical. SOM 13 can provide a check on the calibration of imagical 14 by sampling some of the same colors measured by the imagical and providing reference data to compare against the imagical measurements. Under suitable circumstances the SOM enables a spectral interpretation of what is seen by the imagical so that a spectral illumination function characteristic of viewing can be substituted for that used in measurement as described in connection with FIG. 3D.

Referring to FIGS. 3B and 3C, preferred configurations for, sensors for CMIs in system 100 are shown. Because colorimetric accuracy of CMIs and their ease-of-use are desirable, the preferred configuration of CMI device colorimetric sensors is to have them be as unobtrusive as possible to the user. Thus, in the preferred embodiment, CMIs are built-in to the rendering device.

In the case of a conventional video display or monitor, FIG. 3B shows the preferred embodiment for sensor of a CMI. A cowel 26 attaches to a upper chassis 27(a) to frame a faceplate or screen 24 of video display 22 and to shield the display from most ambient illumination. A fiber optic pickup (not shown) coupled to a projection type lens or lens system 28 plugs into cowel 26 in order to measure color of screen 24 without actually touching the screen or requiring placement by the user. Path 30 shows that the line of sight of the lens and fiber optic pickup reflects off faceplate 24 and views the blackened inner surface of a lower cowel 32 attached to lower chassis 27(b) such that it does not see specularly reflected light reflected from faceplate 24. Nonetheless, operation of display 22 is preferably in an environment with subdued illumination.

Preferably the CMI for a display screen is as a unitary colorimeter SOM 13. The unitary colorimeter takes color measurements via lens system 28 when needed in response to instructions from circuitry at a node. Unitary colorimeter SOM 13 can measure relatively small areas of screen 24 using a sensor connected to the fiber optic pickup. This sensor can be a spectral sensor, a 3 or 4 filter colorimeter or a single channel sensor. A spectral sensor must be able to resolve 2 nanometer wavebands across at least the long wave (red) end of the spectrum in order to make an adequate measurement of the red phosphor of conventional CRTs. This could be accomplished with a grating monochromator and linear photodiode array, or linearly variable interference filter and diode array. Scanning the red end of the spectrum may be performed with a narrowly, electronically-tuned, spectrally variable optical filter in order to locate red phosphor peaks exactly. If a 3 or 4 channel filter colorimeter is used, compatibility with system 100 requires that the spectral sensitivity of the arrangement be a linear combination of the human color matching functions with acceptable precision. The video display 22 phosphors change on a slow time scale. Therefore, provided that the primary chromaticities of the display are measured on a regular schedule, the SOM of FIG. 3B may be replaced by a single-channel meter for routine measurements of gamma (the voltage in-photons out characteristic of the device) very accurately for the three channels.

Alternatively, an imagical may be used instead of a unitary colorimeter SOM 13 in FIG. 3B. In this case the sensor of the imagical may be centered in a door (not shown) which is attached to cover the aperture 29 of cowel 26 and 32 (the cowel may surround the entire perimeter of the chassis) so that the sensor views faceplate 24 center along a line of sight. Imagical may acquire data needed to flatten the screen, i.e., make it regionally homogeneous in light output or to compensate for interactions among adjacent pixels in complex imagery. However, both of these factors are second-order effects.

It was noted earlier that the preferred embodiment utilizes a video display 17 that projects the image, preferably onto printing paper. In this configuration, the CMI which monitors output is situated near the source of projected light, as close as possible to being on a line of sight. Preferably, a projection video display is capable of resolutions exceeding 1200 lines per inch. In this way, it is possible to simulate rosettes, moirés and details of image structure on the hard copy and to show the actual structure of images captured from prints with a CMI equipped with macro optics. To provide high resolution projection, butting together a composite image using several limited-area-displays may be performed. Regardless of type of display 17, the display may use additional primaries in order to extend gamut or better simulate subtractive colorants.

FIG. 3C shows an example of a sensor of a CMI for measuring a substrate 34 (hard proof), such as produced by a proofer device. In the case of a digital proofing device, such as a dye sublimation or ink jet printer, it is desirable to position a dual fiber optic pickup/illuminator 36 arrayed for 45 and 90 degrees measurement geometry near the print head in order to sample recently printed color pixels of substrate 34. Pickup/illuminator 36 have projection-type lenses coupled to both a sensor fiber and a illumination fiber within a light shielding sleeve to implement non-contact measurements and to protect against stray light. Pickup 36 relays light to an analysis module of a CMI in which, preferably, a spectral colorimetric measurement is made. If placement near the print head is not practical, then placement over the exit path of printed sheets is preferred. This sort of placement is preferred for proofing devices which are page printers, such as electrophotographic or conventional, analog proofers. As was the case with monitors, the use of a single-channel device to monitor linearization is compatible, provided that the nature of the device variation over time is compatible with intermittent, full, colorimetric calibration. For example, it may be sufficient to calibrate a dye sublimation proofer only once for each change of ribbon. Although it is preferred to build the CMI into the proofing device in order to minimize user involvement with the process, system 100 can alternatively require the user to place the printed copy on a X-Y stage equipped with the dual fiber optic pickup/illuminator 36.

At production node 104 of system 100, it is preferred that images rendered from a press are captured as soon as possible after they are printed, i.e., after all the colorants are applied. In this way the data necessary for control are available promptly. Although system 100 may estimate the color-error of printed sheets relative to an aim value, the preferred embodiment applies imaging colorimetry of a CMI to the analysis of the image area. Preferably, there is a spectral component to the CMI measurement such that interactions of the colorants with the stock or printing substrate can be analyzed and it is easier to compute the colors as they will appear under standardized viewing conditions.

Figure 3D:
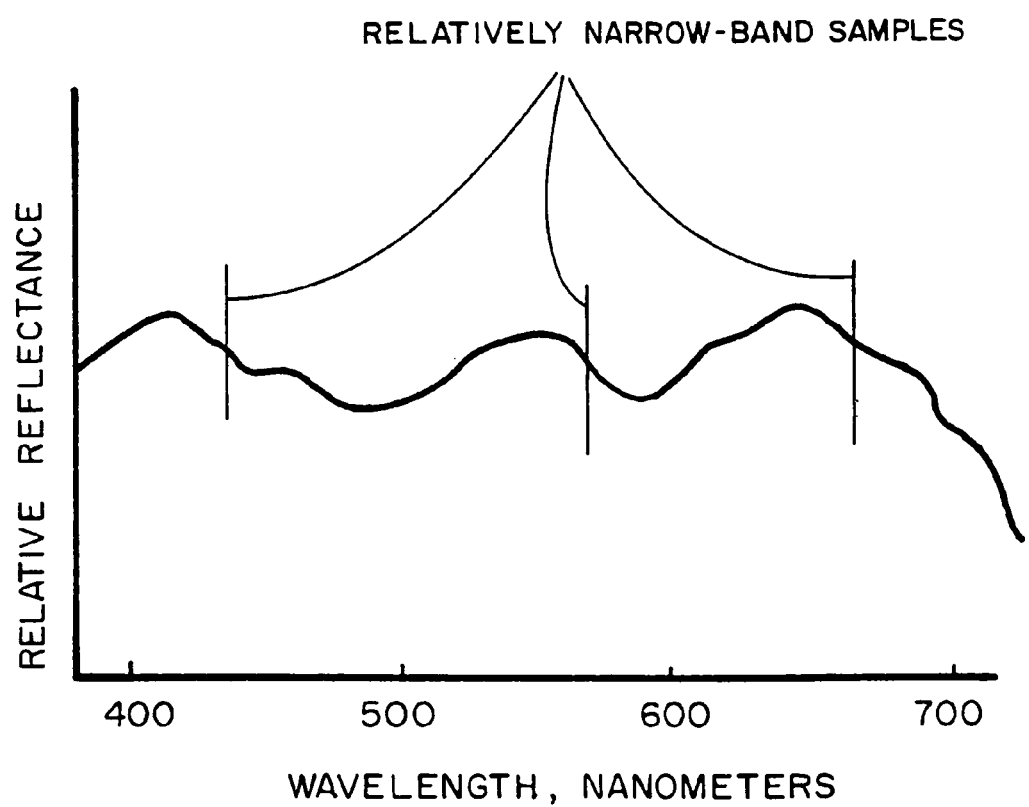
FIG. 3D shows use of a color measurement instrument to estimate a composite spectral function given knowledge of the underlying spectral functions of the colorants being mixed.

Imagical 14 of a production node 104 may employ SpectraCube technology, reference cited earlier, or cameras using any filtering technology that can simulate Standard Observer response adequately. The preferred embodiment, imagical 14 has one or more cameras, such as solid state area arrays, in which the light can be filtered through at least three wavebands, either simultaneously or sequentially, in conjunction with a unitary type colorimeter which views a determinable region of the image viewed by the camera. This provides for the possibility of a spectral interpretation of each pixel as needed. A spectral interpretation is desirable in order to be able to control color to a criterion of how it will appear under the final viewing illuminant. For example, an on-press camera could be several cameras/sensors, each equipped with a relatively narrow-band filter. The cameras, used in conjunction with a unitary colorimeter, can sample composite spectral curves, as shown in FIG. 3D, in such a way that inference of the total spectral reflectance function is possible. The minimum number of camera channels depends on the number of colorants and the complexity of their spectral absorption curves. The cameras may include an infrared-sensitive camera to differentiate the black contribution to a spectral curve from contributions of non-neutral colorants.

Preferably, imagical 14 is capable of multi focus or variable focus imaging so that larger areas of the image can be viewed at lower resolution or vice versa. Views of small areas at high resolution enable simulation of fine image structure by proofing devices capable of sufficiently high resolution display. It is also preferred that imagical 14 is equipped with anti-aliasing filters since much of the input to the imagical can be expected to be screened or pixellated. The article by Grievenkamp (cited earlier) describes an example of anti-aliasing. Also preferably, the viewing illuminant is controlled to simulate the viewing illuminant during the measurement. This may be achieved using a spectrally-adaptive, electronically tunable filter to match the illumination spectrum of any desired light source, which is described in references by Shnitser and Hoyt (cited earlier).

Ease of use and accuracy requirements indicate that CMIs are calibrated or self calibrating in the preferred embodiment. The preferred embodiment of the unitary device SOM 13 approximates a dual-beam device, such as spectrophotometer of Van Aken et al. cited earlier. The spectrum of light reflected from the unknown sample is compared either simultaneously or successively with the light of the same source reflected from a known reflector. In this way it is possible to separate the spectral contributions of colorants, substrates and illumination sources and to estimate their true functional forms over multiple impressions. This increases the CMI's accuracy. Even with such measuring, however, regular recycling of instruments for factory re-calibration or field recalibration using standardized reflectance forms should be performed. Also, if video display 17 is a self-emissive monitor, the above dual-beam functionality although not useful in computing a difference spectrum, provides a means of evaluating possible drift or need for re-calibration in the instrument.

System 100 operates in accordance with software operating at the nodes, which is preferably based on object oriented coding, a well known programming technique. However, other programming techniques may also be used. The discussion below considers the different input and output devices, e.g. CMIs and rendering devices, as objects. Each object refers to software applications or routines in system 100 which provides input to or accepts output from other applications (or devices).

Figure 4A:
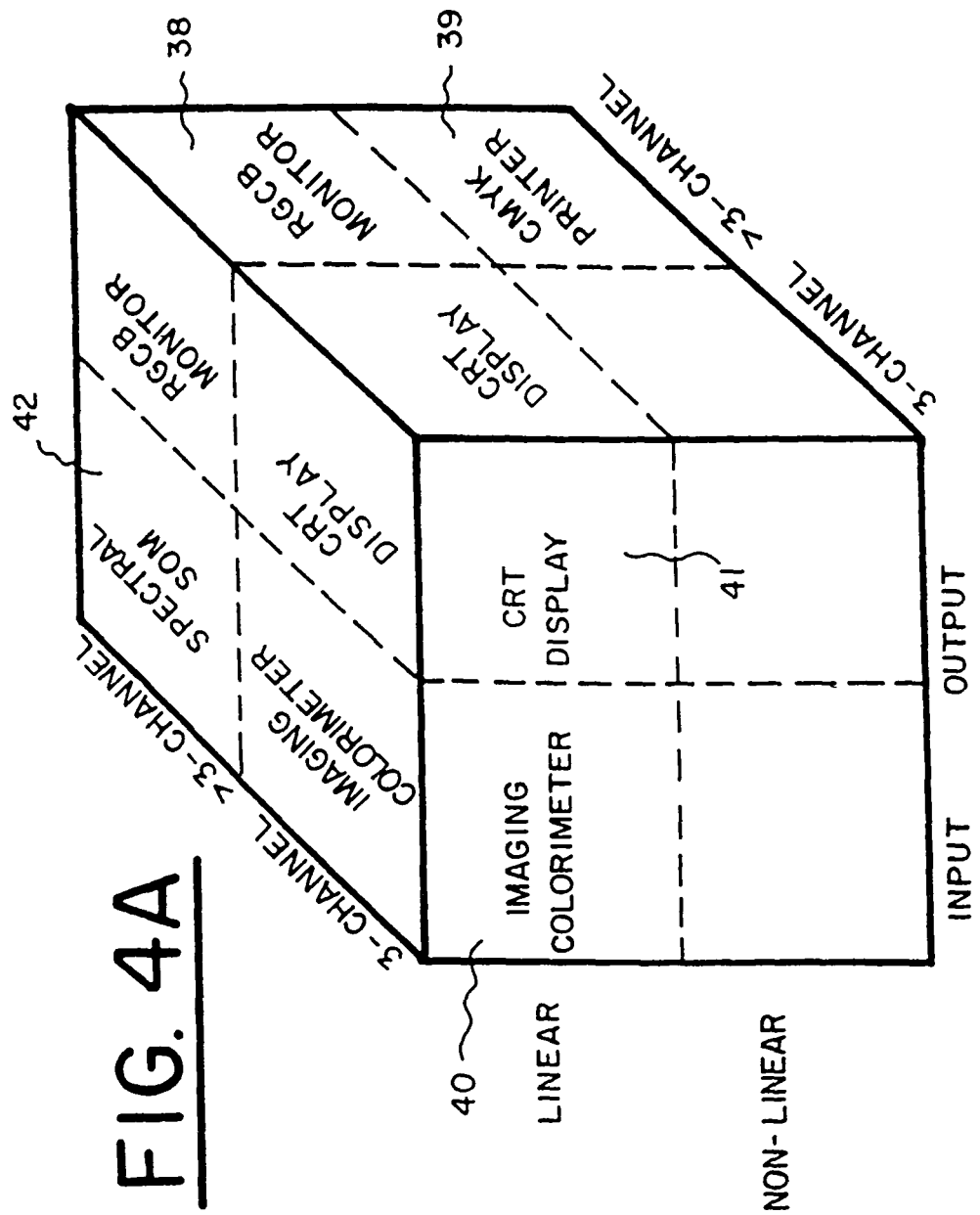
FIG. 4A illustrates the devices of the system separated into device classes inheriting various structures and procedures for color calibration and transformation.

Referring to FIG. 4A, a three-dimensional matrix model of the abstract class device/profile is shown. For example, a device may be instantiated as a linear input device or non-linear output device and derive properties through inheritance. An object created from a certain class is called an instance, and instances inherit the attributes of their class. Inheritance is a functionality of object-oriented coding and provides for grouping objects having common characteristics into a class or subclass. The matrix is extended in a third dimension to include 3-colorant-channel devices and more-than-3-colorant-channel devices. Display devices may have 4 or more colorant channels (for example, Red, Green, Cyan, Blue, indicated by RGCB Monitor 38) in order to enhance gamut or better simulate subtractive color reproduction processes. In other circumstances, a display device may appear to fall into the same class as a CMYK printer 39, which it represents in a soft-proofing/client relationship. The appropriate models and transforms are those associated by inheritance with the subclass into which the new device falls within the general matrix.

A CMYK printer 39 exemplifies the (sub)class output/non-linear/more-than-three-channel. By inheritance, client-proofer relationships are shared by members of subclass output, since the ability to enter into client-proofer relationships can be passed to all members of the subclass by inheritance. Note that the subclass of input devices is distinguished by conservation of gamut among its linear members. Likewise, specific instances of subclass linear inherit an association with linear matrix models of color transformation, whereas non-linear subclass members associate with color transformation by polynomial evaluation, interpolation or other form of non-linear color mixture function. Procedures performing the color transformations are incorporated in the data structures defining the objects, and are discussed later in more detail. More-than-three-channel devices require procedures for rendering with the extra colorants, which is also discussed later in more detail.

Note that the class hierarchy depicted herein supports instantiation of devices of types "scnr" "mntr" and "prtr" as promulgated by the prior art ICC Profile Specification (cited earlier). However, the class hierarchy disclosed herein is considerably more general, flexible and extensible. The properties of flexibility and extensibility are illustrated by the following practical example: a video display ("mntr" in prior art ICC Profile Spec) in system 100 may occupy any of a number of cells within the class structure depending on its physical properties (for example, the number of colorant channels it has) and purpose (stand-alone design workstation or soft proofer representing a four-colorant device.)

The term "linear" herein, when applied to a device, means that linear models of color mixture can successfully be applied to the device (see previously cited art by Gordon and Holub and by Holub.) It does not imply that a video display is intrinsically linear. For example, among input devices, linear defines that linear color mixture models can be used to convert from CIE TriStimulus Values to linearized (or gamma compensated) device signals and vice versa. Further note, that one application can be an output device with respect to another. For instance, application software may convert RGB TriStimulus Values into CMYK colorants and occupy the same cell as a CMYK printer 39.

The calibration of devices in system 100 is indicated by the classes of the devices 40, 41, 42 and 39 in FIG. 4A. Calibration herein includes the process of obtaining color transformation data in uniform color space. Once devices at nodes in a configured network 11 of system 100 are calibrated, the colorants produced by nodal rendering devices can then be controlled, however such calibration remains subject to recalibration or verification processes, as described later. There are four classes of devices 40, 41, 42 and 39 which require calibration:

1) imaging colorimeters or imagicals 14 (class input/linear/3-channel):

2) video displays 17 (generally in class output/linear/3-channel):

3) unitary, spectral colorimeters or SOM 13 (class input/linear/more-than-3-channel); and 4) printers or presses (generally in class output/non-linear/more-than-3-channel).

Optionally, non-linear input devices may be used in system 100, as described in the article by Sodergard cited earlier, but are less preferred. An example of a procedure for calibrating non-linear input devices to a colorimetric standard is described in Appendix B of the American National Standard "Graphic technology—Color reflection target for input scanner calibration" (ANSI IT8.7/2-1993).

In the first class of devices, the calibration of imagicals 14 involves preparing compensation functions for the separable non-linearities of the device's transfer function, which are usually addressed in each color channel individually. These compensation functions may be realized in one-dimensional look-up-tables (LUT), one for each color channel. The compensation functions may be defined in a calibration step in which measurement signals from imagical 14 are generated in response to observation of step wedges of known densities. Next, specifying the constant coefficients of a linear color mixture model expressed as a 3×3 matrix transformation, hereinafter referred to as matrix M, which converts linearized device codes into CIE TriStimulus Values, such as XYZ, or related quantities. The formation of matrix M is described in Gordon and Holub (cited earlier). Last, the gamut of the input is scaled to fit within the color coordinate scheme in which images are represented. Because inputs to the system are printed copy (proofs and press sheets) gamut scaling is often unnecessary except when the image representation is a space such as calibrated, monitor RGB which may not encompass all the colors of the print. Occasions on which this would most likely be a problem are those involving extra colorants used for "Hi Fi" effects, although limited ranges of conventional printing cyans and yellows are out-of-gamut for some monitors. Preferably, imagicals 14 are self-calibrating to assure the accuracy of their color measurements. The compensation function LUTs, matrix M, and possible gamut scaling data are considered the calibration transforms for each imagical 14.

Figure 4B:
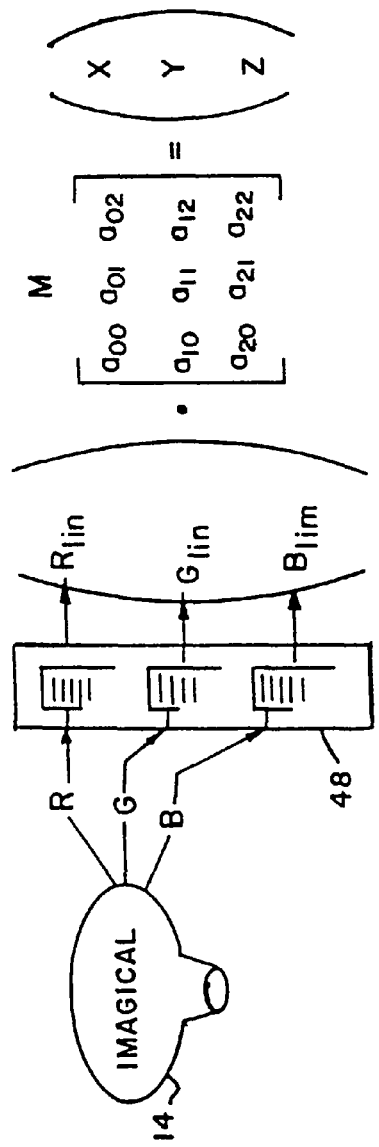
FIG. 4B is a process diagram for color transformation of a class of devices including linear color measuring instruments.

The color transformation in imagicals 14 into uniform color space based on the above calibration is generally shown in FIG. 4B. Imagicals 14 output measurement signals R, G and B, also referred to as device codes. The measurement signals are passed through compensation function LUTs 48 (or interpolation tables) to provide linearized signals $R_{lin}$, $G_{lin}$ and $B_{lin}$, in order to compensate for any non-linearities in the relationship between light intensity sensed by imagical 14 and the device codes. Matrix M then operates on the linearized signals $R_{lin}$, $G_{lin}$ and $B_{lin}$ to provide X, Y, and Z coordinates. Matrix M is shown consisting of the 3×3 coefficients ($a_{00}$-$a_{22}$) defining the linear combinations of $R_{lin}$, $G_{lin}$ and $B_{lin}$ needed to match X, Y and Z, the TriStimulus Values (TSVs) of the CIE Standard Observer. Although not shown in FIG. 4B, gamut scaling is performed after TSVs are converted to Uniform Color Space coordinates such as those of CIELAB. Scaling of an input gamut onto an output gamut in this case is entirely equivalent to processes detailed for rendering devices later in this description.

Calibration of video displays 17 in the second class of devices follows the same steps for imagicals 14 described above, however since video displays 17 are output rendering devices, matrix M and compensation function LUTs are inverted. Calibration of video displays for soft proofing is well known, and discussed by Holub, et al. (J. Imag. Technol., already cited.)

Figure 4C:
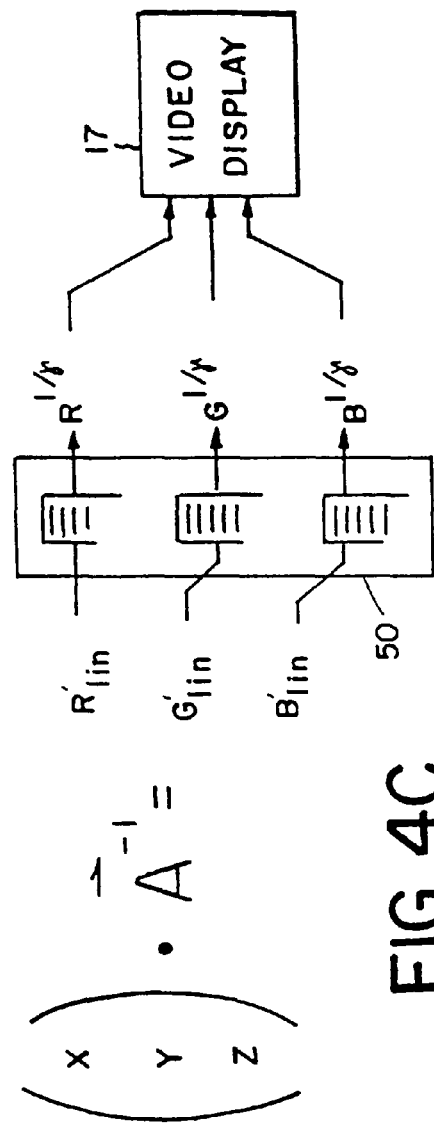
FIG. 4C is a process diagram for color transformation of a class of rendering devices including video-color displays.

Referring to FIG. 4C, device independent color coordinates XYZ are input signals to display 17. Rendering employs the inverse of the operations used for imagical 14. The inverse of the calibration matrix M is called $A^{-1}$ (to emphasize that we are considering numerically different matrices for the two devices) and is used to convert the XYZ input signals to linear device signals $R'_{lin}$, $G'_{lin}$, and $B'_{lin}$. The linear device signals $R'_{lin}$, $G'_{lin}$ and $B'_{lin}$ are postconditioned using the inverse of the compensation function LUTs which define the non-linear relationship between applied signal and luminous output of display 17, a function which is defined and adjusted in a separate, empirical step of calibration. The output from the LUTs are gamma corrected signals $R^{1/\gamma}$, $G^{1/\gamma}$, and $B^{1/\gamma}$ representing the input to display 17. Note that there is no necessary relationship between the matrices $A^{-1}$ and M in FIGS. 4B and 4C. Further, since the LUTs of FIGS. 4B and 4C may be used with various types of transformations in system 100, they are preferably represented by a separate data structure, within the software architecture, which may be combined like building blocks with other structures, such as 3×3 matrix, or multidimensional interpolation table, to form more complex data structures.

As stated earlier video displays 17 generally belong to the subclass output/linear/3-channel in FIG. 4A: However, there are two important exceptions to this: a) when display 17 is used to represent a more-than-3-channel printer, the transforms used to drive the display are non-linear—in other words, a proofing device manifests attributes of its client: and b) when display 17 is used as an accomplice in the creation of computer-generated art, the video display can be considered a linear input device, since new, digital, RGB data are created in the medium and color space of the display. Likewise, calibration for a RGCB Monitor (device 38 of class linear/output/>3-channel) is a simplification of procedures for calibrating the class of non-linear/output/>3-channel devices, which is described below.

In the third class of devices, the calibration of unitary, spectral colorimeters or SOM 13 is set by the factory, as discussed earlier, and thus does not require the preparation of calibration data to provide device independent color coordinates.

Figure 5:
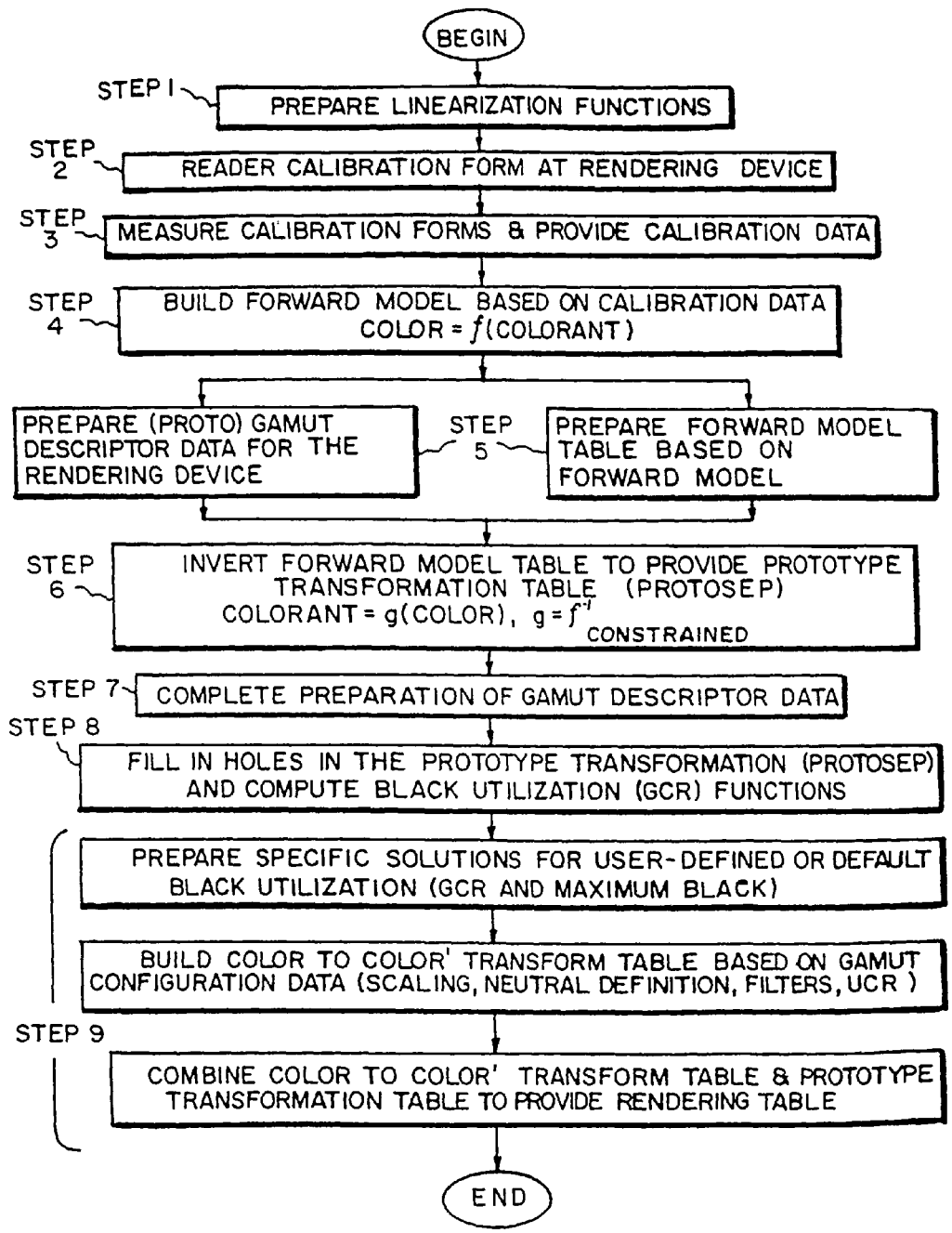
FIG. 5 is a process diagram for calibrating a class of rendering devices including printers and presses at a node in the system of FIG. 3A to provide color transformation information.

Referring to FIG. 5, the process of calibrating the fourth class of devices is shown. It should first be noted that for proofing devices in order to represent one device on another (to proof) it is necessary to have an accurate model of the color reproduction of both devices. It is preferred that the proofing device has a larger gamut than the client and that accurate knowledge of gamut boundaries be derivable from the models of colorant mixture. Because proofing is an issue with output devices, it is necessary to develop rendering transformations that invert the models of colorant mixture and that mix colorants on the proofer in such a way as to match the colors produced by the client as closely as possible. In other words, this should involve respecting the gamut limitations of the client device when rendering on the proofer. In summary, the following four kinds of color transformations are developed in calibration of the fourth class of devices:

1) forward models that enable calculation of the color, in device independent coordinates, of a mixture of colorants;

2) forward model inverses that enable calculation of the amounts of colorants needed to render a desired device independent color coordinate;

3) descriptions of gamuts in terms of boundaries specified in device independent color coordinates; and 4) mappings of colors realizable on one device onto those realizable on another in a common, device independent coordinate system (gamut configuration data).

The above four color transformations are discussed in more detail below. The following is in reference to a hard copy proofing device or proofer, but is applicable to other devices in the fourth class, including high and low volume presses.

Figure 6A:
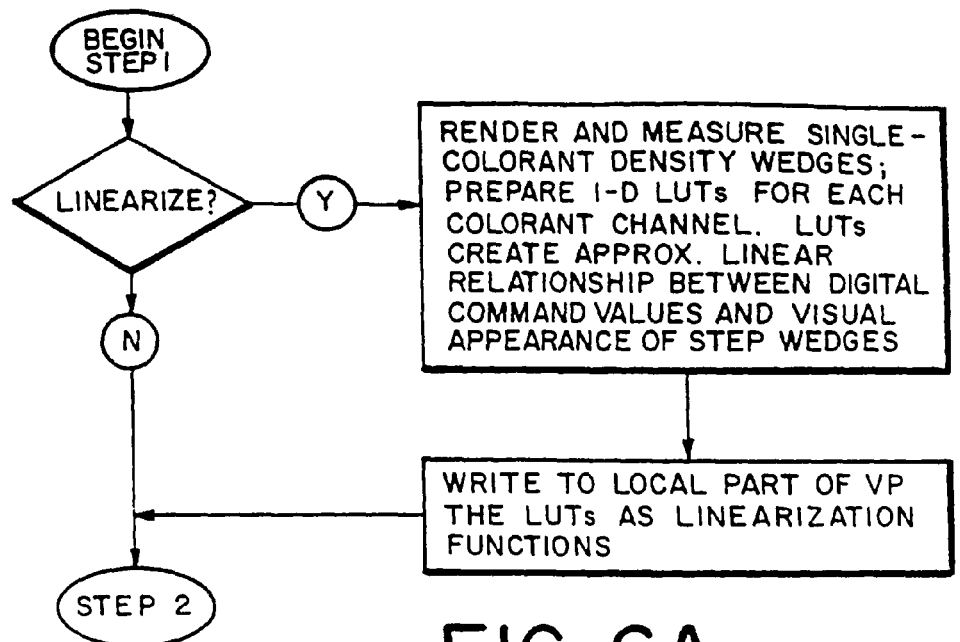
FIG. 6A is a flow chart detailing step 1 in FIG. 5, preparing linearization functions.

Step 1 of FIG. 5 is the process of preparing linearization functions, which is shown in more detail in FIG. 6A. This process establishes a linear relationship between the digital codes sent to the proofer and the output of the proofer, measured in units such as visual print density. Linearization improves the utilization of the available digital resolution and is usually implemented by means of one-dimensional Look Up Tables (LUTs) that map linear digital codes from the nodal computer onto signals that drive the marking engine of the proofer to produce an output that is approximately linear. For example, step wedges printed in C, M, Y and K respectively should produce gradations in measurable visual density that increase linearly as a function of the digital codes commanded by the host.

Usually, linearization involves printing a step wedge on the marking engine without the benefit of the LUT—if data are passed through the LUT, it applies an identity mapping. The color samples of the wedge are analyzed by the CMI associated with the proofer and the measurements are supplied to the nodal processor so that it can compute the transfer function from command codes to print densities. The measured transfer function is compared to the desired one and a function that compensates for the errors in the measured function is prepared—this is what is loaded into the LUT for use in normal image transmission. The LUTs are written to the local part of the VP as linearization functions.

Linearization is not a strict prerequisite for the remaining procedures because a multidimensional color transformation could be designed to accomplish what the one-dimensional LUTs are supposed to do. Thus, linearization of step 1 although preferred in system 100, may optionally be incorporated into other color transformations in FIG. 5. However, it is generally advantageous to exclude as many sources of non-linearity as possible from the transformation function which is specified by the procedures outlined here.

Figure 6B:
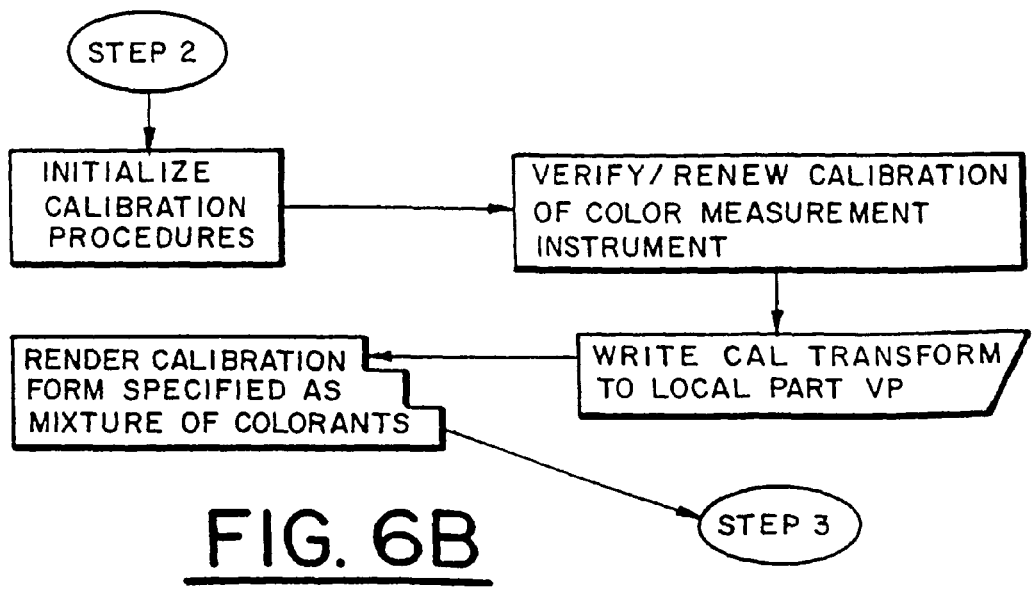
FIG. 6B is a flow chart detailing step 2 in FIG. 5, rendering calibration forms.

Step 2 of FIG. 5 involves verifying or renewing the calibration of the CMI and rendering calibration forms, and is described in the flow chart of FIG. 6B. After initializing calibration procedures, if the CMI associated with the rendering device is an imagical 14, it is calibrated to provide calibration transforms, as described above. Preferably calibration of the CMI is performed automatically in response to instructions from circuitry at the node.

After the CMI associated with the rendering device is calibrated, a calibration form is rendered on the proofer. For example, this form may have the following attributes: 1) a sampling of all combinations of four levels of all of the colorants. 2) inclusion of approximately neutral step wedges. 3) several samples of flesh tones, 4) a number of redundant patches—these are common inkings placed at different locations on the proof to provide information about spatial non-uniformities of the proofing process. It also is useful to include at least short step wedges in each of the colorants and their overlaps, for example, cyan, magenta and yellow as well as blue (cyan+magenta) green (cyan+yellow) and red (magenta+yellow.)

The calibration form described consists of about 300 samples in the case of 4 colorants and can fit on an 8.5×11 inch (21.5×28 cm) sheet with patch sizes of 1 cm on a side. However, generally, the number of patches should be three times the number of polynomial terms fitted to the data (discussed later in step 4, FIG. 8.) Patch sizes are scaleable for compatibility with various CMIs. In addition to the tint samples, the target has markings similar to pin registration marks and demarcated handling zones to facilitate transfer of the target from the proofer to the CMI if the CMI is not incorporated into the proofer. The registration marks indicate clearly where and how to insert the copy in a stand-alone CMI so that the instrument will find the patches where they should be and the handling zones will emphasize to the user that the image area should not be touched. Hard copy proofers may write an identifying number and/or bar code for the device and for the specific proof (including date and time) on the proof.

Alternatively, a device in the fourth class, such as a running press, may be calibrated by analysis of live imagery (rather than a calibration form) digitized by an imagical provided 1) that the images analyzed sample the gamut of the device adequately and 2) that the effects of page adjacency within a signature on color reproduction can be accounted for (for example by reference to stored historical data at the node.) As always, the relevant data for calibration are the known colorant specifications embodied on the printing plate and the colors resulting on the printed sheets.

Figure 7:
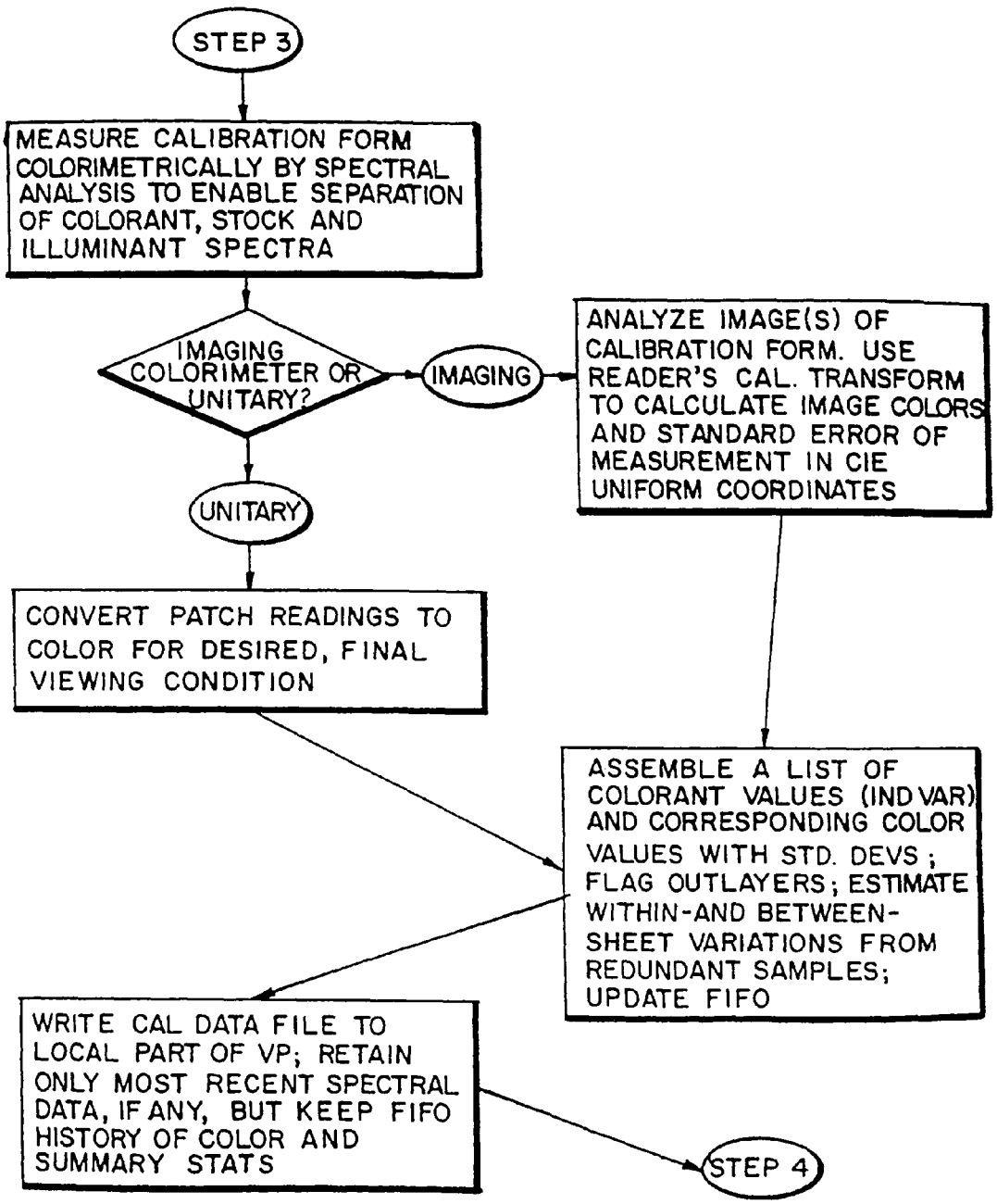
FIG. 7 is a flow chart detailing step 3 in FIG. 5, measuring calibration forms and providing calibration data.

After rendering the calibration form, the form is measured by a CMI and calibration data is provided (Step 3 of FIG. 5). The processes of step 3 are detailed in the flow chart of FIG. 7. As stated earlier, the preferred CMI is a linear colorimeter, such as a imaging or unitary colorimeter, which is capable of providing spectral analysis data which supports illuminant substitution. The CMI should produce several readings of color to the node; if one is an outlyer compared to the others because of a blemish on the copy or some malfunction, then the software at the node excludes it from the averaging for that patch. If no two of the measurements agree, then the patch should be flagged so as to identify it as a problem in subsequent processing. More generally, the number of measurements of each patch is odd to permit voting by the software in the interest of selecting trustworthy measurements.

If imaging of the calibration form is performed by an imaging colorimeter or imagical 14, then the imaging colorimeter analyses the images on the form, and uses its calibration transforms from step 2 to calculate image colors and standard error of measurement in CIE Uniform Coordinates, such as $L^*$, $a^*$, $b^*$. Also the imaging colorimeter provides many sample values of each patch color; regional checks for nonuniformity of color in the sampled area should be performed. However, if imaging of the calibration form is performed by an unitary colorimeter or SOM 13, then the patch readings from the form are converted to color measurements in CIE Uniform Coordinates.

Each patch measurement may include information about sensitivity, integration time, wavelengths sampled, illuminant substitutions, and the like. The series of measurements from each calibration form are accompanied by at least one record of the reference spectrum, although, obviously, reference spectral data will be collected and used on every reading, at least for reflection measurements.

Regardless of the type of CMI, a list of colorant values (the Independent Variables. IVs, to the fitting procedure) to corresponding color values (Dependent Variable) with standard deviation are assembled. On this list of measurements outlyers are flagged. An estimate of sheet variation from redundant sampling is produced.

In addition to multiple measurements within a given sheet, two other means for enhancing the reliability of the data are provided. First, the software supports measurements of multiple sheets and second, an historical record of measurements from a particular proofer or press is preferably maintained at a node. Historical data can be stored more compactly and compared more readily to current data if the measurements are converted from spectral form to colorimetric form. Spectral data of the measurement is stored in a database at the node in terms of color and summary statistics.

Preferably, the database maintains a FIFO history of color and summary statistics from the most recently measure forms. Because step 5 involves least squares error minimization, flagging of outlyers is preferred to reduce the influence of one bad reading. A decision on whether a current reading is legitimate is made by comparing CIE ΔE values rather than the two spectra. The assembled list with flagged outlyers and standard deviation of each patch measurement is written to a calibration (cal.) data file in the local part of the VP, for later use in building the forward model.

After step 3 is complete, processing continues to step 4 of FIG. 5, building a forward model based on the calibration of step 3. Step 4 is flow charted in FIG. 8. This model will represent color as a function of colorants of the proofer or press. It should first be noted that generic polynomials provide a satisfactory form for models of color generation by colorant mixture on printing devices. However, this does not exclude any other mathematical or physical modeling procedure capable of producing transformation functions of sufficient colorimetric accuracy. Polynomials of relatively low order in each of the colorant variables may be fitted very nearly to within the device variation. In other words, the uncertainty of the model prediction is not much greater than the uncertainty of color rendered in response to a given set of digital codes. Low order implies that the colorant variables are not represented as powers greater than 2 or 3 and that the sum of the powers of the independent variables in a single term of the polynomial is limited to 4. Therefore, if the inks C, for cyan. M, for magenta. Y, for yellow, and K, for black are the independent variables, a valid term could be $C^2MK$, but not $C^2M^2K$. Analytical derivatives are easily computed, which makes them advantageous for model inversion.

A polynomial forward model is fitted to a data set consisting of independent variables of colorant and dependent variables of device independent color coordinates (stored in the calibration data file of the VP) by the method of least squares. A polynomial is a linear combination of each of its terms which are called, mathematically, basis functions at step 82. Without loss of generality, discussion can be simplified by considering functions of two variables, C and M, in which each variable may be raised to a power of up to 2 and the sum of powers may not exceed 4:

$$R = a_{00} + a_{10}C + a_{20}C^2 + a_{01}M + a_{11}CM + a_{21}C^2M + a_{02}M^2 + a_{12}CM^2 + a_{22}C^2M^2$$

$$G = b_{00} + b_{10}C + b_{20}C^2 + b_{01}M + b_{11}CM + b_{21}C^2M + b_{02}M^2 + b_{12}CM^2 + b_{22}C^2M^2$$

$$B = c_{00} + c_{10}C + c_{20}C^2 + c_{01}M + c_{11}CM + c_{21}C^2M + c_{02}M^2 + c_{12}CM^2 + c_{22}C^2M^2$$

In the foregoing, color is the vector valued function |R G B| of the variables C and M and the a's, b's and c's are constant coefficients which give the proportions of their corresponding terms to be mixed in forming the linear combination. The purpose of the fitting procedure is to find the set of coefficients which results in the least squared error when comparing the color measured at a given patch with the color calculated by substituting the patch's colorant values into the forward model. The polynomials are untruncated within the constraints on the powers. The DV may also be L*, a*, b* coordinates of CIELAB uniform color space.

Figure 8:
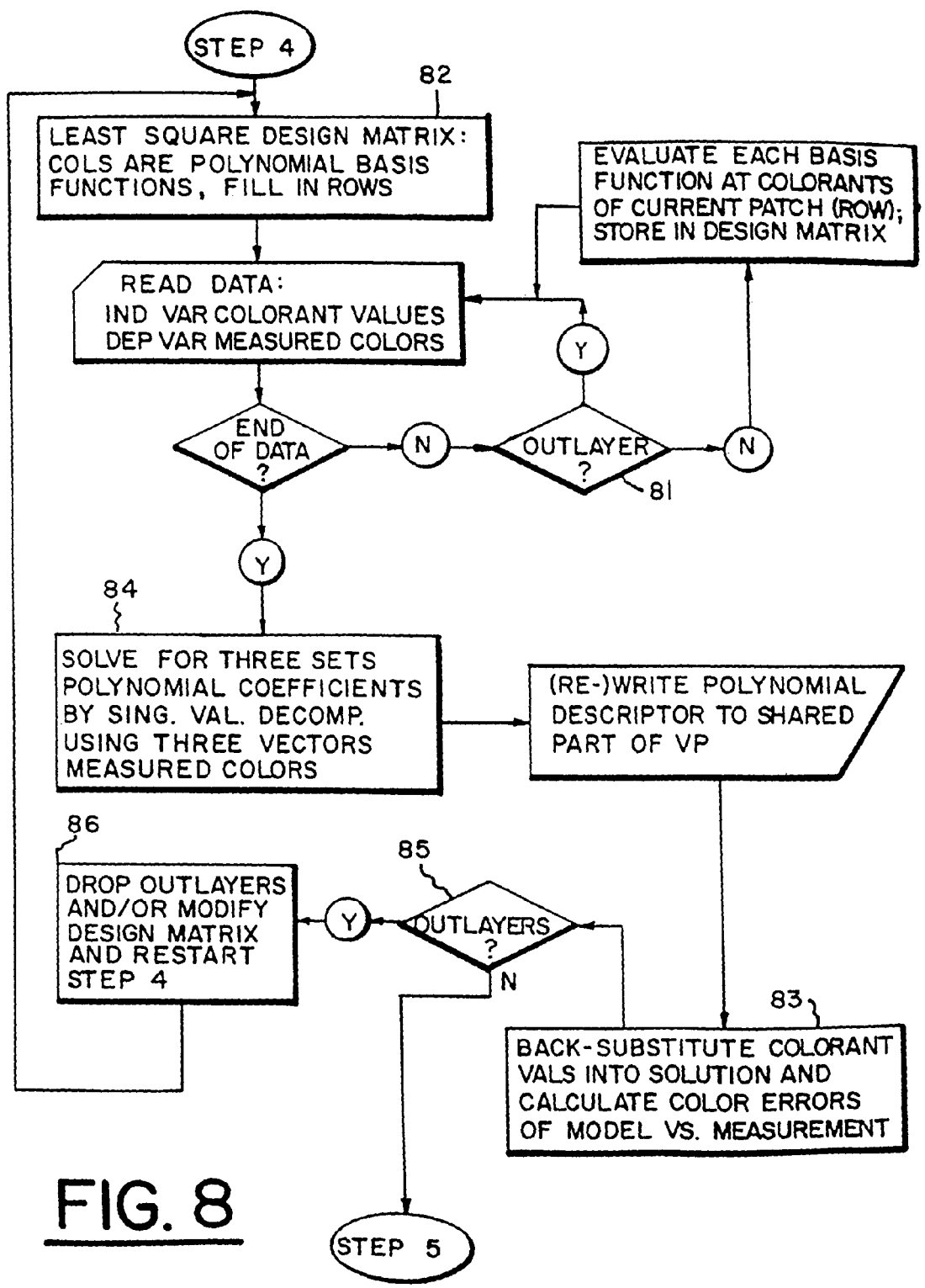
FIG. 8 is a flow chart detailing step 4 in FIG. 5, building a forward model based on the calibration data from step 3 of FIG. 5.

In FIG. 8, the process of building a forward model begins by building a design matrix for the problem (step 82). The design matrix has M columns, one for each basis function, and N rows, one for each patch measurement. The number of rows should exceed the number of columns; practically, the ratio of N to M should be greater than 3 for good results. After reading the cal. data file, each cell in the matrix is filled with the value of the basis function for the column at independent variables (inks) given by the row, divided by the standard deviation of the patch measurements, if available, else by 1 (step 83). Note that the patch measurements themselves do not enter the design matrix. Then use the design matrix and vectors of patch measurements for each of the three, color, dependent variable dimensions to write matrix equations that can be solved for the desired coefficient vectors preferably by Singular Value Decomposition, SVD (step 84).

The numerical methods outlined in the preceding and the following paragraphs are similar to those described by Press, et al. (*Numerical Recipes*, Cambridge University Press. Cambridge, UK. 1986.) Sections 14.3. "General Linear Least Squares." with SVD fitting, and 5.3. "Polynomials and Rational Functions".

The model and its derivatives can be evaluated efficiently by a method of recursive factorization. The method depends on use of polynomial terms as basis functions. However, it permits evaluation of the function with no more than 1 multiplication and 1 addition per polynomial term. Because the independent variables never need to be raised to a power, the demands for precision on the computational machinery are not as great. The principle can be seen most readily in one dimension; the function $y = a_0 + a_1 x + a_2 x^2$ can be factored to yield $a_0 + x(a_1 + a_2 x)$ which evaluates with 2 multiplies and 2 adds. Generalizing this to the two-dimensional function described above:

$$a_{00} + a_{10}C + a_{20}C^2 + M(a_{01} + a_{11}C + a_{21}C^2) + M^2(a_{02} + a_{12}C + a_{22}C^2), \text{ or}$$

$$a_{00} + C(a_{10} + a_{20}C) + M[(a_{01} + C(a_{11} + a_{21}C)) + (a_{02} + C(a_{12} + a_{22}C))M].$$

How to generalize to three or four dimensions is apparent.

At step 81, the patches that were flagged during measurement as outlyers are excluded from the fitting. The fitting program estimates the variation in the device based on deviations of color in redundant patches and/or measurements of multiple copies. The average error of fit is calculated as the average ΔE* (CIE Color Difference Unit) over the set of measurements of patch colors compared to the colors predicted by the fitted polynomial (step 83). This average should not exceed the estimated device variation by more than 1 ΔE* unit. When it does, or when the software detects individual patch discrepancies exceeding 4 or 5 ΔE units, the software flags apparently outlying points (step 85). It then computes trial fittings with outlyers omitted to see if average error can be improved (step 86). It also is informed with a strategy for applying various sets of basis functions in the interest of achieving an acceptable fit. However, the fitting procedure will reject a dataset at step 86 rather than get too involved with it.

Principal Component Analysis, or an equivalent method, may be employed to reduce the number of polynomial terms (complexity of the model) consistent with a given average error criterion. This technique is similar to those described in Johnson and Wichern. Applied Multivariate Statistical Analysis. 3rd ed. Englewood Cliffs, N.J.: Prentice Hall. 1992, ch. 8.

Fitting concludes with writing a final polynomial model descriptor (a data structure and a file) consisting of a header and lists of coefficients. The header includes information such as the identity(ies) of proofs measured, relevant dates and times, the ingredient data files, the form of the polynomial (maximum powers of the independent variables and maximum order of a term) goodness of fit statistics. The polynomial descriptor will be needed later by the polynomial evaluator of the software and is written into the shared portion of the Virtual Proof.

Although this discussion is directed to a 4-colorant printer or press, the polynomial forward model is, potentially, part of a soft proofing transform which enables a video display to represent a client printer. It can be used to compute a colorant$_A$ to colorant$_B$ transformation for what is effectively a CMYK, subtractive-color video display, in that CMYK colorant values are processed through a transformation to produce device-specific RGB for a monitor. This can generalize to use of more-than-four-colorant-printers and more-than-three-colorant displays.

After the polynomial model descriptors are computed, a forward model table (FMT) and prototype gamut descriptor data are prepared (step 5 of FIG. 5). The processes of step 5 are detailed in the flow chart shown in FIG. 9A. As described above, the polynomial based on the model descriptors represents the forward model. The forward model enables us to predict the colors resulting when certain colorant mixtures are asked for on the printer or press. System 100 includes a polynomial evaluator to evaluate this polynomial either in hardware circuitry or software at the node. Referring to FIG. 9B, a topology of operators is shown (multipliers 86 and adders 87) to implement the polynomial evaluator for the two-colorant case, cyan (c) and magenta (m). Each operator receives two inputs. Inputs (operands) designated by two numerals are the constant coefficients and inputs designated by C 89 or M 90 stand for the independent variables, amounts of colorant. For instance, 21 88 denotes the coefficient which corresponds to the second power of C times M. In order to evaluate a function of three variables, 3 of the units shown in FIG. 9B are needed. Four variables require 27 such units for an untruncated polynomial. In a hardware realization of the evaluator, it is preferable to retain the generality of the polynomial form and zero poly terms (or their coefficients) that are missing due to truncation. If 27 units are too many for a cost-effective device, then the calculation may be staged and the successive stages pipelined through a subset of the 27 units, albeit at some cost in control logic and speed. Given the opportunities for parallelism in a hardware implementation, the preferred embodiment benefits by a chip to transform ink values to colors at video rates. Such a chip may be a component of nodal circuitry encompassing a graphics accelerator to drive a video display device for soft proofing at the node. It accelerates the generation of color separation transformations because evaluation of the colorant to color model is a major factor in that computation. It also accelerates the evaluation of color separation transformations in situations where the data of the inverse, color-to-colorant conversion can be fitted by polynomials with a sufficiently small average error of fit. Data for fitting can be the addresses and entries of an interpolation table of sufficient size, as discussed below.

Figure 9A:
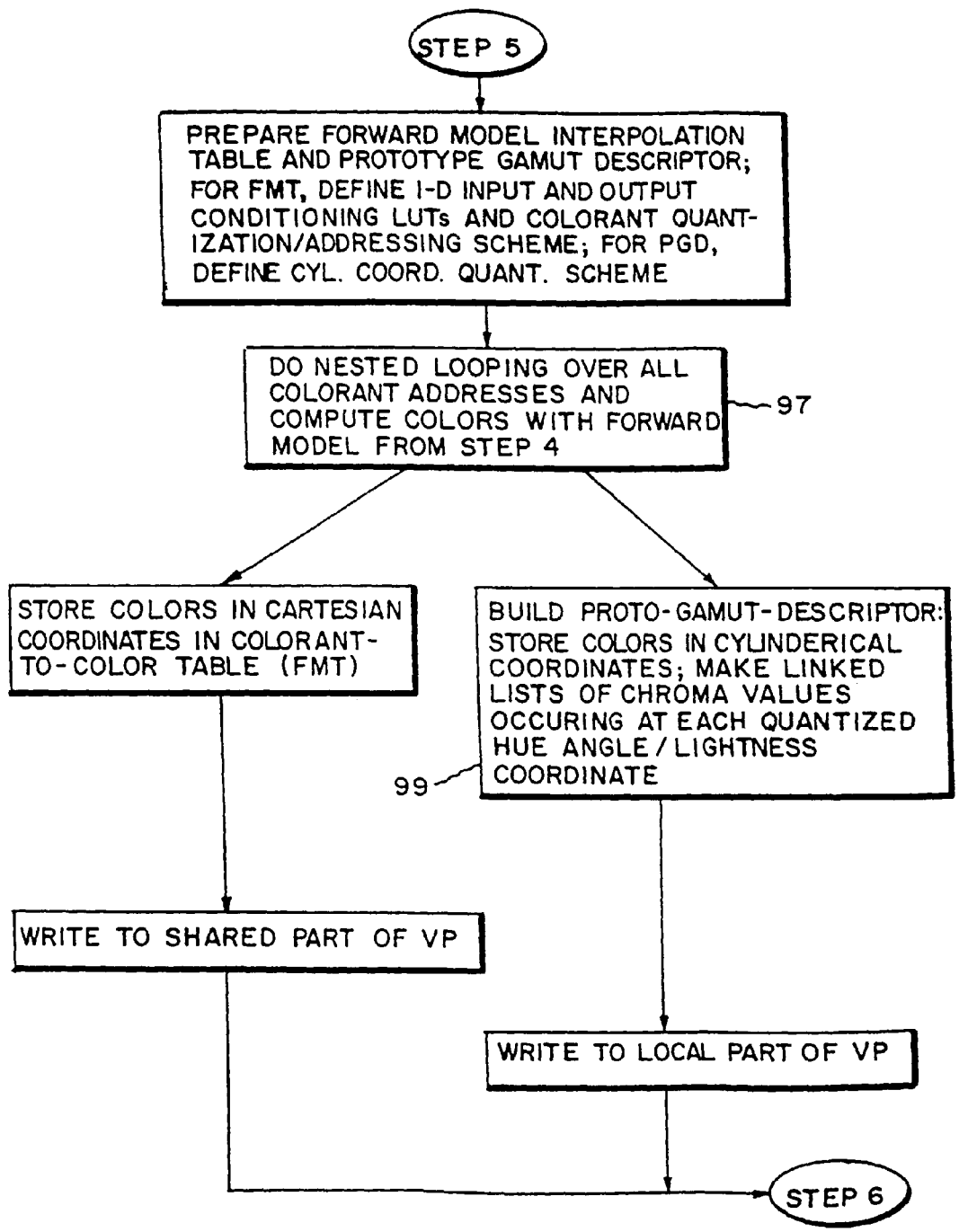
FIG. 9A is a flow chart detailing step 5 in FIG. 5, preparing gamut descriptor data for the rendering device and preparing a forward model table based on the forward model from step 4 in FIG. 5.
Figure 9B:
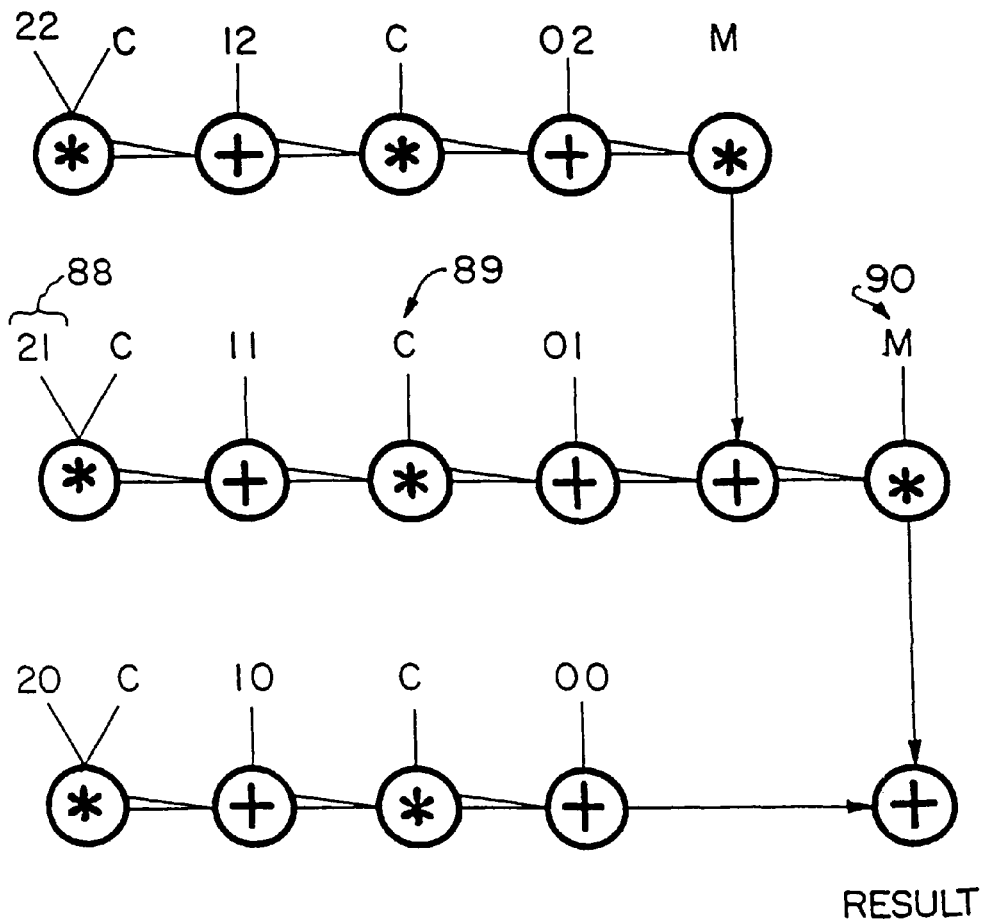
FIG. 9B is an illustration of the operators and operands evaluating the polynomial function of the forward model in the case of two independent (colorant) variables. C and M.
Figure 9C:
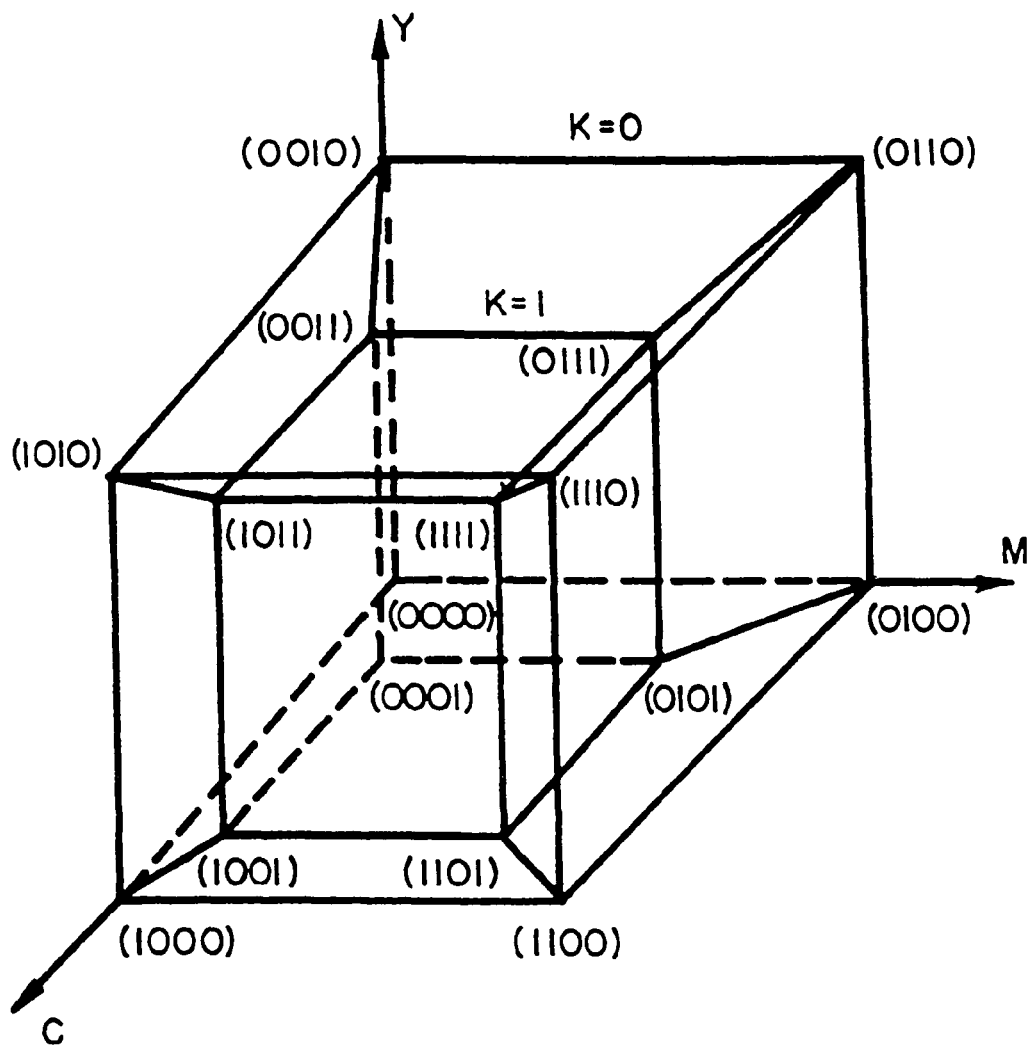
FIG. 9C depicts a hypercube in the coordinates of the Cyan, Magenta, Yellow and Black colorants in which all colors producible with a CMYK printer are contained within the hypercube.

The FMT stores the results of the polynomial evaluator in a data structure and colorant quantization/addressing scheme shown in the CMYK hypercube of FIG. 9C, which contains the entire gamut of colors reproducible by a CMYK printer. The hypercube may be subdivided into a FMT having 17 points (16 intervals) per colorant dimension for sufficient accuracy. However, the software architecture supports more or less, within the constraint that the numbers of grid points per dimension satisfy the equation $2^{n+1}+1$, where n is integer. Depending on the requirements of the rendering applications and equipment, a software switch controls whether the tables are written in pixel interleaved (each address of a single table holds the values of all dependent variables) or frame interleaved format. In the latter case, three M-dimensional tables are prepared, where M is the number of colorants. Each "cell" of a table has an M-dimensional address and contains a color coordinate computed by evaluation of the forward model at step 97 of FIG. 9A. At step 97 nested looping over all colorant addresses is performed and computed colors from the forward model are stored at each address. Thus, each model evaluation yields three color coordinates each of which is deposited in a cell corresponding to the M colorants which produce it in the appropriate table. Colors of inkings in the midst of a hypercuboid are estimated by interpolation.

Figure 9D:
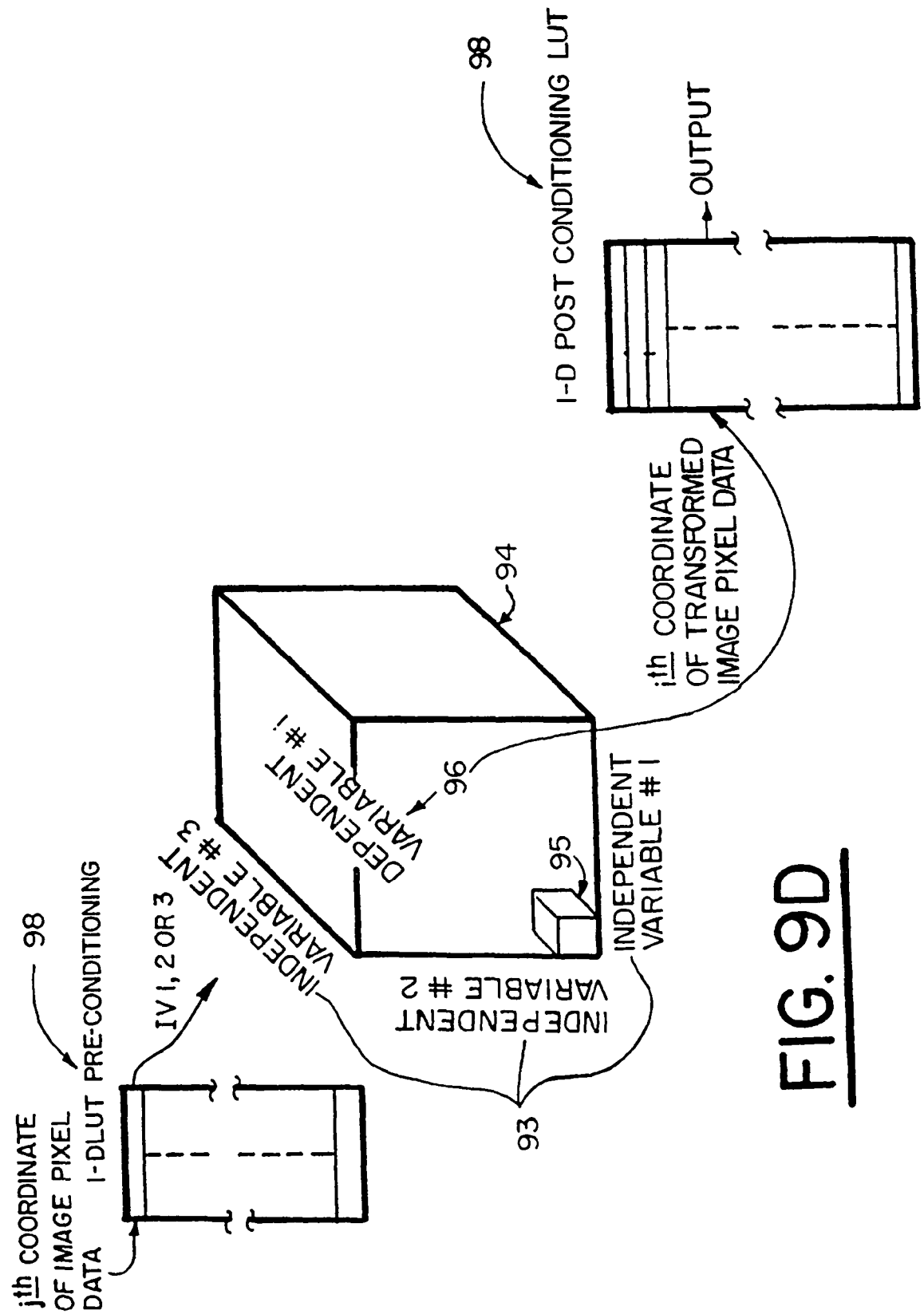
FIG. 9D is an illustration of a data structure for interpolation in 3 dimensions which may use either pre- or post-conditioning look-up tables.

Referring now to FIG. 9D, each of the M channels of input to the FMT may be provided with preconditioning LUT for each of the Independent Variables and each output channel may be processed through a 1-dimensional postconditioning LUT. Interpolation is preferably performed by linear interpolation in the nodal circuitry or software.

The data structure in FIG. 9D accommodates the preconditioning of j address variables by j 1-dimensional transformations which may be implemented as look-up tables with or without interpolation 98. The preconditioning transformation may pass one or more of the j inputs Independent Variables (IVs) through to the multidimensional transform unaltered (identity transformation) or may apply a functional mapping such as a logarithmic conversion. The multidimensional transform 94 has j input variables and i outputs. The preferred implementation of the transformation is by interpolation in a sparse table of function values or by evaluation, in hardware, of a set of polynomials fitted to the tabular values (where fitting can be done with sufficient accuracy.) In FIG. 9D, a 3-dimensional IV 93 is applied to the multidimensional transform 94. Multidimensional transform 94 consists of many smaller cuboids 95 whose corner points are the sparsely sampled values of the IV at which values of one (or more) of the dimensions of the dependent variable, DV, 96 are stored. The IV provides addresses and the DV contents. The subcuboid 95 is shown at the origin of the addressing scheme. Interpolation is used to estimate values of the DV occurring at value of the IV which are between corner points.

The data structure of FIG. 9D also accommodates the post-conditioning of the i output variables (DVs) of the transformation by i 1-dimensional transformations which may be implemented as look-up tables with or without interpolation 98. One of the transforming functions which may be included in the post-conditioning is the linearization function optionally produced by step 1 of FIG. 5.

The purposes of the 1-dimensional pre- and post-conditioning functions include improving the extent to which the relationship between variables input to and output from the multidimensional transformation 94 is approximated by whatever interpolation function is employed in evaluating the transformation. Therefore, the form of the functions should be known from preliminary studies of the device and the pre- and post-conditioning transforms must be in place during calculations of Steps 2 through 9 if they are to be used at all. For example, a linearization function which may be defined in step 1 should be used in rendering the calibration target in step 2.

Figure 9E:
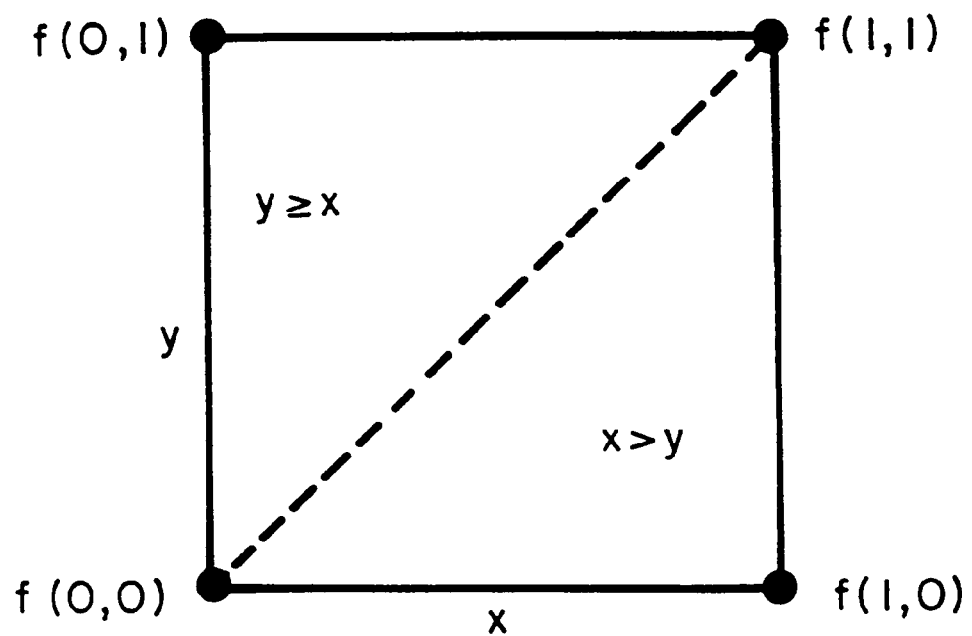
FIG. 9E is a graphical illustration of linear interpolator in two dimensions.

A linear interpolation formula for two dimensions which generalizes to higher dimensions with a simple, proportional scaling in the number of operations is described in Gallagher, "Finite Element Analysis", cited earlier. For example, given a cell in a two-dimensional array of sparsely sampled points as shown in FIG. 9E, the interpolated value of a function f(x,y) at a point (x,y) interior to the cell may be calculated as the weighted average of the endpoints in the direction of the longer of the components x or y plus the weighted average of the endpoints in the direction of the second longest component. In other words, order the distances of the point with respect to the axes of the cell and then sum the fractional distances along those ordered dimensions. Written as an equation:

for $y<x, f(x,y)=f(0,0)+x*(f(1,0)-f(0.0))+y*(f(1,1)-f(1.0))$ and for $x>=y, f(x,y)=f(0,0)+y*(f(0,1)-f(0.0))+x*(f(1,1)-f(0.1))$.

FIG. 9A also flowcharts the preparation of the prototype gamut descriptor (GD) data. As colorant addresses are converted into colors to populate the FMT (step 97), the colors are also converted into cylindrical coordinates of CIE hue angle, chroma and lightness. Hue angle and lightness are quantized to become addresses into a 2-D gamut descriptor, preferably dimensioned at least 128×128 for adequate resolution (step 99). The Chroma component of the color is not quantized, but is stored in linked lists of Chroma values associated with each hue angle, lightness coordinate. The finished gamut descriptor data is prepared from the prototype GD data later at step 7 of FIG. 5, and consists only of surface chroma values for each coordinate. Therefore, the prototype is not a shared file and is written to the local portion of the VP, while the FMT is written to the shareable portion.

Next, at step 6 of FIG. 5, the FMT is inverted into a prototype transformation table, also called Proto SEP table. Rendering image at a rendering device requires this inversion step. i.e. finding the colorant mixtures to realize a desired color which may be given in device independent coordinates or in the color coordinate system of some other device (such as the CMYK monitor mentioned above.) Due to the complexity of the problem, it is generally not feasible to perform forward model inversion in real time as imagery is rendered. Practical approaches rely on interpolation in a sparse matrix of inverse function values. However, offering interactive control over key aspects of the separation transformation (also called SEP) implies that at least some parts of the calculation occur nearly in real time. Because inversion of the forward model involves evaluating it, potentially numerous times, acceptable performance requires a very rapid means of evaluating the forward model. One method involves design of specialized hardware for polynomial evaluation. When specialized hardware is unavailable, software performance can be significantly enhanced via the same strategy as used for speeding rendering transformations: interpolate in a sparse table of forward model values, in particular in the FMT.

The proto SEP represents a color to colorant transformation with color coordinates as inputs and inkings as outputs. For illustration purposes, we will consider the case in which color coordinates are expressed in CIELAB units. L*, a* and b*. In order to build a sparse table of inverse function values for the proto SEP, the following addressing scheme is defined. If address variables, or inputs, are represented at 8-bit resolution, the span of the table in each dimension is 0-255 ($2^8$) digital levels. Continuous perceptual dimensions are mapped onto those levels so as to satisfy two criteria: a) the entirety of the input and output gamuts of interest must be represented, and b) adjacent digital levels are not perceptually distinguishable. Input and output gamuts will be detailed later: briefly, an input gamut is that of a device or application which supplies images (in this case for separation) and an output gamut is that of a device or application which receives the image—in this case for rendering. With the above addressing scheme, a prototype separation table is computed. The following outlines the general process for building the proto SEP table.

For each grid point, or address, of the table, the amounts of the colorants needed to produce the input color are found. There are N tables, one for each of N colorants, assuming frame interleaved formatting. First, a starting point of the correct inking is speculated. Calculate its color by the forward model and compare the calculated color to the desired, address color. Save the color error, modify the inking, recalculate the color and see if the error is reduced. The forward model is also employed to calculate the partial derivatives of color with respect to ink. The resulting matrix, shown in the equation below, yields the direction of the movement in color occasioned by the change in colorants. The partials of color error with respect to each of the colorants indicate whether movement is in the correct direction. If negative, this indicates movement in the correct direction along that ink zero: then store each of the inkings in their respective tables.

$$\begin{array}{c} da^* \\ db^* \\ dL^* \end{array} = \begin{array}{c} \left|\frac{\partial a^*}{\partial C}, \frac{\partial a^*}{\partial M}, \frac{\partial a^*}{\partial Y}, \frac{\partial a^*}{\partial K}\right| \\ \left|\frac{\partial b^*}{\partial C}, \frac{\partial b^*}{\partial M}, \frac{\partial b^*}{\partial Y}, \frac{\partial b^*}{\partial K}\right| \\ \left|\frac{\partial L^*}{\partial C}, \frac{\partial L^*}{\partial M}, \frac{\partial L^*}{\partial Y}, \frac{\partial L^*}{\partial K}\right| \end{array} * \begin{array}{c} dC \\ dM \\ dY \\ dK \end{array}$$

The foregoing paragraph gives a simplified explanation of the algorithm embodied in procedures which use Newton's Method for finding roots ("Newton-Raphson") or one of many optimization methods for searching out "best" solutions in linear (e.g. the Simplex method of linear programming) or non-linear multidimensional spaces. The algorithm can also be implemented with neural networks, fuzzy logic or with the aid of content addressable memory, as detailed in prior art by Holub and Rose, cited earlier. A neural network can be trained on the results of repeated evaluations of a mathematical model. Further, neural networks may also be utilized to perform any of the color transformations of FIG. 5. e.g. building the forward model or rendering transform table. Color transformation with neural networks is described, for example, in U.S. Pat. No. 5,200,816, cited earlier. Newton's method is applied to find the root of an error function. i.e., the solution is at the point at which the derivative of the error function goes to zero. Strictly. Newton's method is only applicable in situations where a solution is known to exist. Therefore, although it is an efficient procedure, it is supplemented by other optimization methods, such as "Simulated Annealing." (The model inversion technique described above is similar to those in Press. et al. sections 9.6, 10.8 and 10.9, respectively, already cited.)

Optimization methods can produce a useful result when no exact solution exists, as in the case when the desired color is unprintable by (or out of the gamut of) the device. The optimization is driven by an error function which is minimized, typically by using downhill, or gradient search procedures. In the case of Newton's Method, one of the colorant variables (in the four colorant case) must be fixed in order to find an exact solution: otherwise, there are infinitely many solutions. Usually, black is fixed. The algorithm for model inversion uses supporting search procedures in case the primary technique fails to converge to a solution.

Figure 10A:
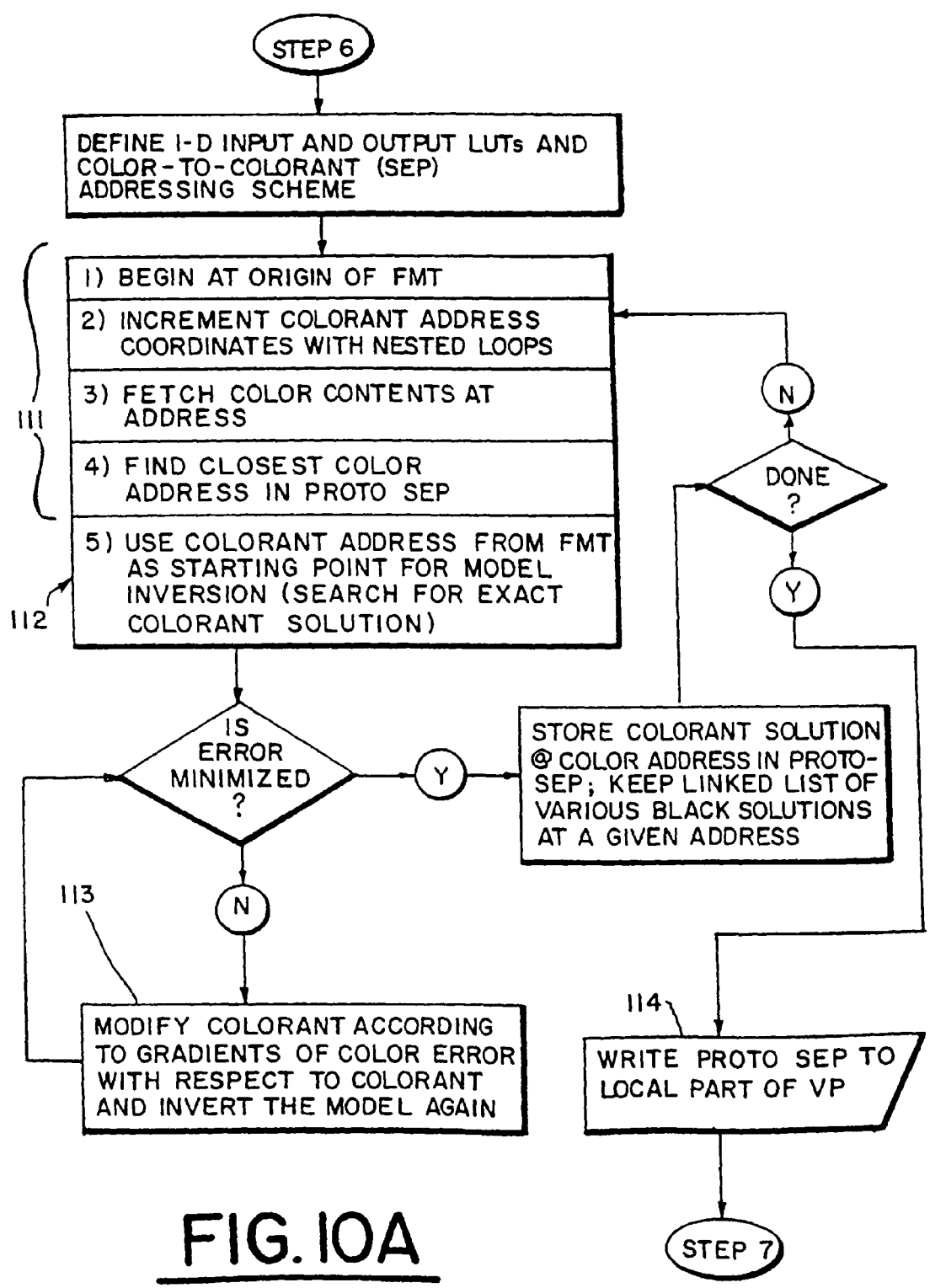
FIG. 10A is a flow chart detailing step 6 in FIG. 5 inverting the forward model table to provide a prototype transformation table.
Figure 10B:
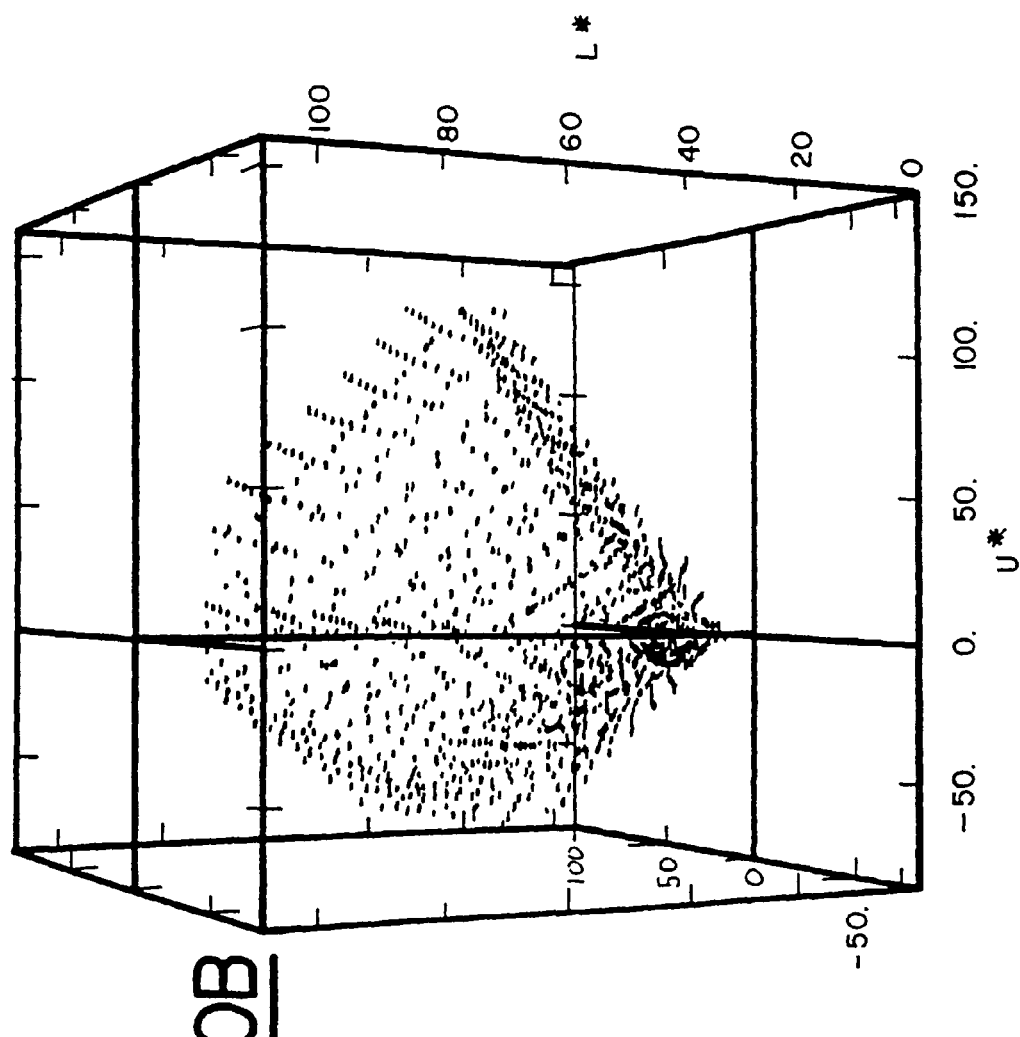
FIG. 10B is an example of the hypercube of FIG. 9C where the colorant values are transformed into device independent color coordinates.

The foregoing, simplified account overlooks the possibility that the gradient surface on the way to the solution has local minima in it which thwart the search procedure. This risk is minimized by the present inventors' technique of using the FMT to provide starting points which are very close to the solution. The above process for building the proto SEP Table is applied in system 100 as shown in the flow chart of step 6 in FIG. 10A. For each color entry in the FMT, find the closest color address in the prototype separation table (step 111). Then use the colorant address of the forward model table as the starting point in a search for a more exact ink solution at that color address of the proto SEP (step 112). The search and the addressing of the interpolation table can be in the cylindrical coordinates of hue, chroma and lightness or in the Cartesian coordinates $L^*$, $a^*$ and $b^*$. In the preferred embodiment, the forward model table has at most $17\times17\times17\times17$~=84K grid points and the prototype separation table has at most $33\times33\times33$~=35K grid points many of which will not be within the gamut of the printer and some of which may not be physically realizable. i.e. within human perceptual gamut. (This is the case because the gamut of a set of colorants is not likely to have a cuboidal shape suitable for representation in computer memory when it is converted from device coordinates to the coordinates of the color addressing scheme, as illustrated in FIG. 10B.) Therefore, there is a favorable ratio of starting points to solutions.

An important advantage of keying off the FMT is that most searches are guaranteed to be for printable colors. For colors near the gamut surface. Newton Raphson may fail because there is not an exact solution such that an optimization procedure is required. The search routine may use either the interpolative approximation to the polynomial (the FMT) for speed in a software-bound, system or the full-blown polynomial for greater precision. In either case, the derivatives are easily calculable and the iterative searching procedures driven by gradients of color error (step 113).

The result of step 6 is a prototype color to colorant transformation (proto SEP) table in which virtually all printable addresses contain one or more solutions. Because of the favorable ratio of starting points to required solutions, many addresses will have solutions based on differing amounts of the neutral (black) colorant. The multiple black solutions are very useful in preparing to perform Gray Component Replacement and are stored in linked lists at the appropriate addresses of the proto SEP, which is stored in the local portion of the VP (step 114). At this stage there are two ingredients of a final rendering transformation in need of refinement: the prototype gamut descriptor and the proto SEP.

An example of the results of step 6 is shown in FIG. 10B, in which coordinates which are plotted within a cuboidal structure suitable for representing the perceptually uniform color space coordinates. Addresses having data are shown by black crosses. If the cube were subdivided into numerous cuboids so as to create an interpolation table, as described in FIG. 9D, it is clear that many of the cuboids would not correspond to colors that are realizable on the device. The coordinates of the perceptually uniform space are $L^*$, $u^*$ and $v^*$ from the CIE's CIELUV color space in the example.

After step 6, the prototype GD data of step 5 is refined into finished GD data at step 7 of FIG. 5. Step 7 processes are shown in the flow chart of FIG. 11. System 100 needs a favorable ratio of FMT entries to proto GD addresses; therefore, most of the addresses get one or more solutions. Relatively few of these are surface Chroma points. The objective of step 7 is to use proto GD data as starting points for an iterative motion toward the gamut boundary using search and model inversion techniques described previously. Gamut surfaces often manifest cusps, points and concave outward surfaces. Therefore, quantization of the descriptor must be at fairly high resolution ($128\times128$ or more is preferred) and initiation of searches for a surface point from other surface points of different hue angle is often unfruitful. Because it is known what colorant mix (i.e. little or no colorant) is appropriate at the highlight white point of the gamut, it is best to begin refinement there, using solutions at higher luminances as aids at lower luminances (step 121).

At least one of the colorants must be zero at the gamut surface. Therefore, the strategy is to start near the desired hue angle from well within the gamut, move onto the desired hue angle and then drive outward until one of the non-neutral colorants goes to zero (step 123). It is often possible to zero the colorant that is expected to go to zero to hasten search procedures (such as Newton Raphson) which require constrained iterations. Starting points are usually available from a linked list stored in the proto GD: that failing, one may be had from a neighboring hue angle, lightness cell, or, that failing, by setting out from neutral in the desired hue direction (step 122). If polynomial evaluation hardware is available, it can accelerate on-the-fly calculation of surface points by forward model evaluation. Given a hue angle and lightness, the device coordinates bounding a small patch of the gamut surface are identified and colorant mixtures within the patch processed through the forward model until the maximum chroma at the hue/lightness coordinate is produced (step 124). In situations where it is necessary to fall back to methods involving model inversion, the hardware assist continues to be valuable because searching involves numerous evaluations of the polynomial and its derivatives, which are also polynomials. Once a refined gamut descriptor has been completed, it is written to the shareable portion of the VP (step 125).

Figure 12:
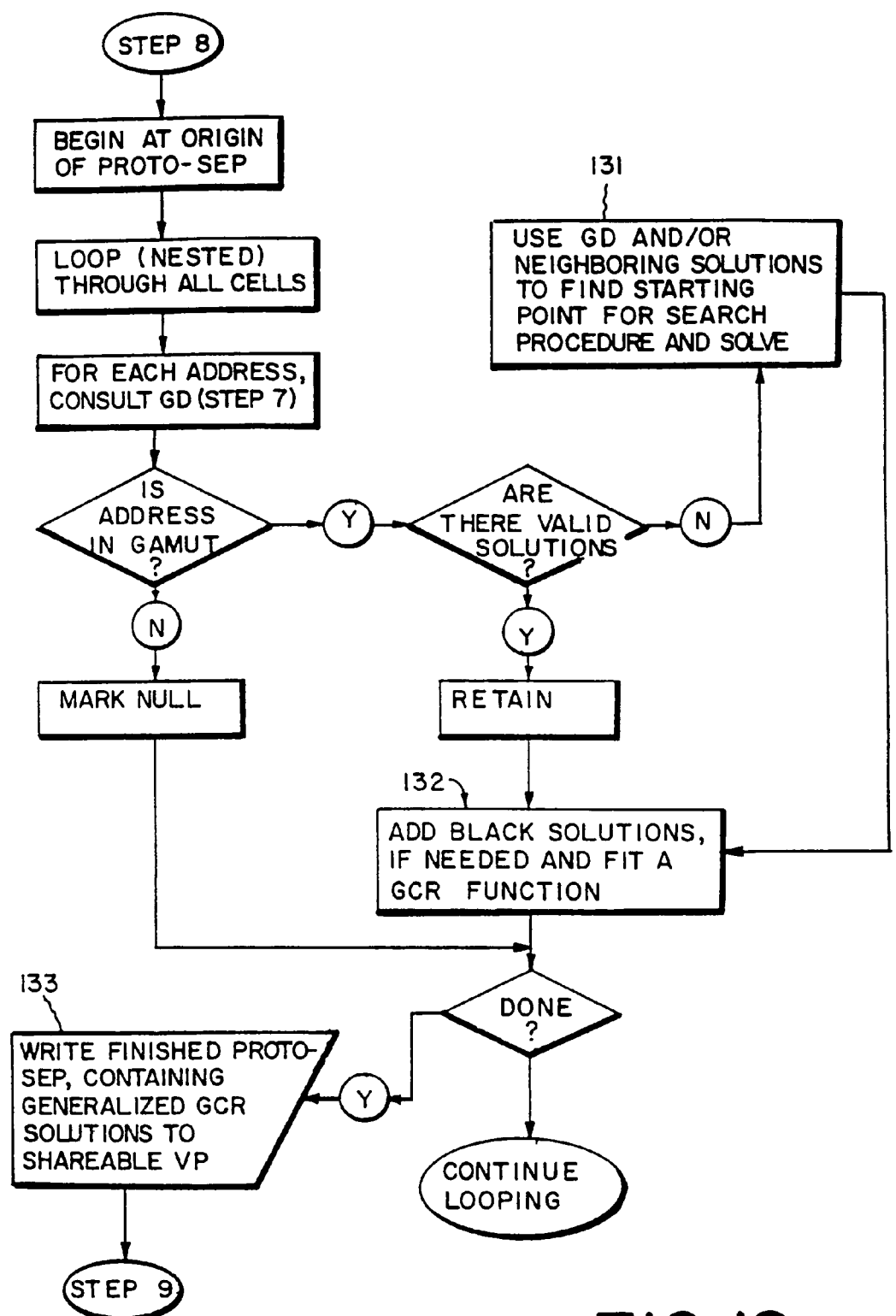
FIG. 12 is a flow chart detailing step 8 of FIG. 5, filling in any missing entries of prototype transformation table, computing black utilization (GCR) functions for all colors of the table having multiple black solutions and marking unprintable colors NULL.

Referring to FIG. 12, a flow chart of the processes in Step 8 of FIG. 5 is shown, filling in any holes which may exist in the Prototype Transformation and computing functions that summarize the trade-off (Gray Component Replacement. GCR) between neutral and non-neutral colorants at each color address. A "hole" is a color address which is printable but for which no inking solution has yet been found. The resulting proto SEP table is called a generalized color-to-colorant table because it does not provide solutions for a specific amount of black. Step 8 has two goals. First, it seeks solutions for any colors interior to the gamut which have none (step 131) and writes NULL into all unprintable addresses. The mapping of unprintable colors to within gamut occurs later in step 9 in response to gamut configuration data, which the user may select using the GUI screen of FIG. 21F, which is described later. Second, it stores at each address the means to exchange neutral for non-neutral colorants (Gray Component Replacement.) The preferred process is to store several solutions which can be interpolated amongst using LaGrangian. Spline or generic polynomial interpolating functions (step 132). The exact specification of black utilization is incorporated later in step 9, which also may be selected by the user via the GUI screen of FIG. 21E, which is also described later. The finished prototype color to colorant (proto-SEP) transformation table is written to the shareable portion of the VP (step 133).

Step 9 of FIG. 5 includes the following processes:
1) Converting colorants of the proto-SEP transformation table based on black utilization information specified in the black color data;
2) Building Color to Color' Transform Table based on gamut configuration data. e.g. gamut scaling, neutral definition or gamut filter(s); and
3) Combining Color to Color' Transform Table with a transformation table containing specific GCR solutions to provide a rendering table.

The black color data and gamut configuration data may be set to defaults or selected by the user as color preferences, as described in more detail later.

Figure 13:
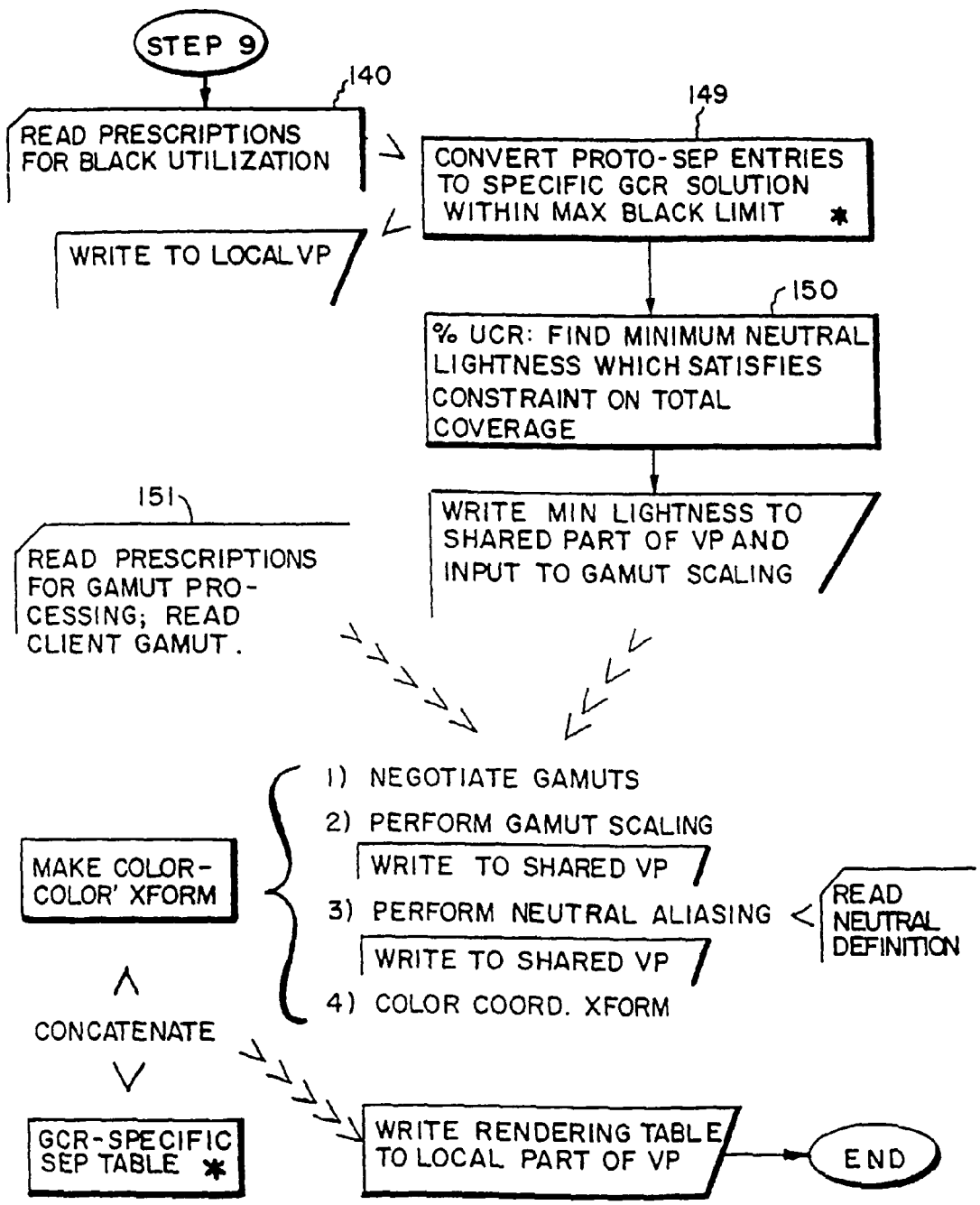
FIG. 13 is a flow chart detailing step 9 of FIG. 5 which includes: converting colorants of prototype transformation table based on black color data; building color to color' transform table based on gamut configuration data: and combining the color to color' transformation table and the converted prototype transformation table to provide a rendering table.

Referring to FIG. 13, the processes of step 9 are flow charted. Although step 9 is operative of four-colorant rendering devices, more-than-four colorant devices may also be provided with a rendering table as will be explained in discussion of FIGS. 16A and 16B. First, the finished proto SEP table (generalized color-to-colorant) and the black utilization data are read (step 140). The latter include Gray Component Replacement. % Under Color Removal (% UCR or UCR, a term referring to a limitation on total colorant application or Total Area Coverage. TAC) and possible constraints on the maximum amount of black or neutral colorant to be used; all three together are referred to herein as "black utilization."

The prescriptions for black utilization come from one or more of the following sources: a) local or system-wide defaults, b) broadcast of custom functions and limit values from a "boss node" configured in network 11 and c) values defined through a user interface which may be applied locally or transmitted and shared. Note that modifications of black utilization do not have colorimetric effects. For example, compensating increases in neutral colorant by decreases in non-neutral colorants in GCR does not change the color noticeably. Fields in the VP control selection of the source of prescriptions for black utilization under particular rendering circumstances. A user may select the black utilization in the Graphic User Interface of the model software, which is described later in connection with FIG. 21E. The black utilization data, which includes % UCR, maximum black, and the GCR function or black solution, are stored in the shared part of the VP.

The first step in preparing a rendering transformation, then, is to convert the data on GCR stored at each printable address into a particular black solution by referring to the curve giving % GCR as a function of density while observing the maximum black constraint (step 149). Thus, the entries in the proto-SEP transformation table are converted based on a specific GCR solution within a maximum black limit. The converted proto-SEP table is stored in the local part of the VP. The second step is to find the maximum neutral density at which the total area coverage limitation is satisfied, i.e., % UCR (step 150). This is done by moving up the neutral, or CIE Lightness, axis through the quantization scheme from the minimum printable Lightness, examining colorant solutions, until one is found that is within the limit. The minimum Lightness so identified is stored for use in the gamut scaling process to be discussed presently. Although it is conceivable to store min Lightness values as a function of color, rather than simply as a function of Lightness, for purposes of gamut scaling, this is usually an unwarranted complexity.

In order to convert the GCR-specific result of the foregoing methodology into a rendering transformation, it must be "married" with a "conditioning" transformation. The latter is a color-to-color' conversion expressible as an interpolation table of the format presented earlier. (Note that any transformation that is evaluated by interpolation and that can be fitted with acceptable color accuracy by a polynomial may be performed by suitable hardware for polynomial evaluation.) It serves the multiple purposes of scaling unprintable colors of the addressing scheme onto printable values. "aliasing" the color definition of neutral to accommodate user requirements (FIG. 21E, 270) and effecting conversions among color addressing variables.

An example of the latter is the conversion from Cartesian CIELAB addressing to "Calibrated RGB" addressing which is useful if the image data that will be processed through a rendering transformation are represented as RGB. It will be described later that Conditioning Transformations (CTs) play an important role in verification and device control. A CT is often the result of the "concatenation" of several individual, conditioning transformations serving the purposes just identified. The applications of transform concatenation include: 1) the method whereby a separation table with many NULL entries is made useful for rendering by concatenation with a conditioning transform which performs gamut scaling with considerable savings in transform-generation time and 2) feedback control of the color transformation process as will be detailed later.

In order to minimize cumulative interpolation errors, intermediate color to color transforms may be stored and/or evaluated at high precision. Wherever possible, exact conversions of table entries should be utilized. For example, once all the mappings of CIELAB color to CIELAB color' have been compiled, the conditioning table entries for a color coordinate conversion from CIELAB to "calibrated RGB." for example, may be computed using analytical expressions.

Note that system 100 does not preclude importation (as described in discussion of User Interface) of standardly formatted color transformations ("profiles") prepared by applications other than the Virtual Proofing application. Accordingly, the rendering transformation may incorporate user preferences indicated through a transformation-editing tool (called a "profile editor" by some Application Software Packages.)

A key purpose of the conditioning transformation is gamut scaling, described below. It is important to elaborate this point: If the target device for the rendering transformation is a proofer, then the output gamut to which colors are scaled may be that of its client. The relevant, conditioning data for all devices on the network resides in the Virtual Proof. If the client's gamut fits entirely within the proofer's, then substitution of client for proofer gamuts is used to render a representation of how imagery will appear on the client. The display and negotiation of compromises to be made when the client's gamut does not fit entirely within the proofer's is discussed in conjunction with FIG. 21F, below. Note that, in addition to accommodating a client's gamut, successful proofing may require other mappings. For instance, tone scale remappings to compensate for differences in overall luminance levels between video displays and reflection media may be performed. Likewise. "chromatic adaptation" transformations to compensate for changes in illumination, viewing conditions. etc. may also be implemented by means of data structures or tables of what are called "conditioning" or color-to-color transforms (output color transforms) herein.

Elaboration of the concept of color "aliasing." presented above is also appropriate: Neutrals are conventionally defined in terms of colorant in industry: elements of the default neutral scale which appears in FIG. 21E (step 270) generally do not have common chromaticity coordinates up and down the Lightness axis. In order to map colorimetrically neutral addresses onto the desired mixtures of colorants, it is necessary to convert the colorimetric addresses to the colors of the "colorant neutrals"—a process herein referred to as "aliasing" because one color address masquerades as another. The term has a different usage, familiar to signal processing, when used herein in connection with imaging colorimetry.

Specifically, the processes involved in making a color-to-color' transform (numbered 1 to 4 in FIG. 13) are as follows: (Recall that the goal is to be sure that only printable address colors are applied to the GCR-specific SEP table in the course of making a Rendering Table. Normally, color out=color in at the outset. More detailed discussion of input gamuts, output gamuts and gamut operators follows. The sequence of the processes is important.)

1) Negotiate gamuts: In preparing a rendering transform to enable a proofing device to represent a printing press the color addressing of the color-to-color' table may be defined by the input gamut—in terms of the color image data. The range of colors represented in the table is limited by the extreme image values in the three dimensions of Uniform Color Coordinates. Because the quantization scheme is regular (cuboidal) there will be color addresses which do not occur in the image data (recall FIG. 10B.) These may be ignored, or mapped approximately onto the surface of the image's gamut. In place of the image's gamut, a general representation of the gamut of the original medium of the image may be used.

This method is preferred, for instance, to using the gamut of the press as the input gamut because so doing would require conversion of bulky image data into coordinates that are all within the press's gamut. An objective of system 100 is to provide means of interpreting image data in various ways without creating a multiplicity of versions of that data. An exception would occur if image data specifically from a press sheet Were required to evaluate image structure due to screening, etc. as part of the proofing process.

The output gamut may be the lesser of the client's (printing press) AND proofer's gamuts, where "AND" connotes the Boolean operator whose output is the "least common gamut." This may be derived using gamut filters, as discussed later. In this negotiation, the proofer's gamut may be constrained to be that available within the Total Area Coverage (% UCR) limitation applicable to the press at the user's discretion. Other interactive tools may be used to control the definition of the output gamut subject to the ultimate restriction of what can be rendered on the proofing device within the default or selected % UCR constraint, if applicable. (Of course a video display proofer's gamut is not intrinsically subject to a UCR constraint.)

2) Perform gamut scaling: Using gamut operators to be discussed later, map color values to color' and store the color' values at the color addresses in the table.

3) Perform neutral aliasing: In each lightness plane, the color of the conventionally neutral inking (FIG. 21E, 270) is offset from the neutral color coordinate a'=b'=0 by an amount a*, b*. In order to map image neutrals to this offset color, the color' values in the conditioning table should be shifted in such a way that an address of 0,0 maps to a color' value of a*, b*. The function which performs the shift may be designed so that the amount of the shift decreases with distance from neutral.

4) Transform Color Coordinates (if necessary): The reason for this and a method of implementation were suggested previously, namely, it is preferred to perform gamut operations in Uniform Color Coordinates, but the image data may be represented in a color notation such as "calibrated RGB" so that a rendering table must be addressable by RGB coordinates. Because exact mathematical equations generally govern the relationship between Uniform CIE color and calibrated RGB, each color' value in the conditioning table is converted to RGB by means of the equations.

The Color-Color' Transform (XForm) is produced by the above steps and then concatenated with the GCR-specific SEP table. The result is a rendering table for transforming the color of input color image data into colorant data for the rendering device, which is stored in the local part of the VP.

The following discussion is related to providing gamut mapping data of the gamut configuration data. Color addresses that are not printable must be mapped onto printable ones. In the present application, the output gamut is that of the proofer of interest or the printer it represents. However, the input gamut is not fixed by the architecture or software design because it may vary and have a profound effect on the rendering of out-of-gamut and nearly-out-of-gamut colors. This is the case because the outermost, or limiting, colors vary greatly among possible input gamuts. Input gamuts that warrant distinctive processing include:

1) Other proofing devices include both hardcopy and video display devices (VDDs). Hardcopy devices are likely to have gamuts that are fairly similar, requiring only minor relative adjustments. Self-luminescent, additive-color devices such as video displays have very differently shaped gamuts from reflection devices so that the best mapping from input to output as a function of color will be unlike that for a reflection device. Computer-generated images originate in applications which are likely to exploit the gamut of a video device. Many retouching and page assembly applications use the RGB coordinate system of the monitor to store and manipulate images because it facilitates display on the VDD and interactivity. In this case, the input gamut is often that of the VDD, even if the image was originally scanned in from film.

2) Printing presses will usually have smaller gamuts than the proofing devices that represent them, restricting what is to be used of the available proofing gamut. If printed images are captured by an imaging colorimeter as part of calibration or verification so as to constitute the image data, the input gamut may be better approximated by the rendering gamut of the printer than the receptive gamut of the colorimeter.

3) Electronic or digital cameras will usually have much greater gamuts than any output device, necessitating a very significant restriction on what portions of the input gamut can be printed. Note, however, that the maximum gamut of a linear camera encompasses many colors that are not commonly found in natural photographic scenes. Accordingly, it may be preferable to design mapping functions for this class of device that are based on the scenery as well as ones based on device capabilities.

4) In conventional photography, the scene is first captured on film before being captured digitally. The relevant input gamut is the rendering gamut of film.

5) Regardless of the input medium and its gamut, there may be image-specific imperatives. For instance, a very "high-key" image, consisting almost entirely of highlights, lace, pastels, etc. may not make extensive use of the available gamut of a color reversal film. The best gamut mapping for this particular image is not the generic one for film.

The gamut mapping data is provided by a gamut operator which is a function which maps an input color to an output color. The process of constructing the gamut operator is shown in FIG. 14. It is a common practice to "clip" the input gamut to the output. In other words, all colors outside the output gamut are mapped onto its surface. This may be done in such a way as to preserve hue, saturation (Chroma) or Lightness or a weighted combination of the three. System 100 can work with such operators and supports access to them through the "Rendering Intents" function in the GUI, as shown latter in FIG. 21F. However, invertibility, reciprocality and smoothness are preferred properties of gamut operators, especially when processing and transforming image data.

Invertibility is an important property of the function because it insures that no information is lost except that due to quantization error. Reciprocality means that a mapping of input color to output color may involve either a compression or reciprocal expansion of the gamut, depending on which gamut is larger. Smoothness, or continuity of the first derivative, reduces the risk of noticeable transitions ("jaggies") in images which are due to gamut scaling. A simple exemplar of an invertible, reciprocal operator is illustrated in FIG. 14. It is presented to demonstrate and clarify key concepts and then an operator which is also smooth is explained. A mapping of Psychometric Lightness. L*, is shown, however, the same operator is applicable to CIE Chroma, C*, as well. It is assumed that hue is to be preserved in the mapping; a separate tool is supported within the GUI to gamut operations later shown in FIG. 21F, for situations in which users want to modify hues. FIG. 14 depicts the two cases of reciprocality, one in which the dynamic range of the input device must be compressed in order to fit the output gamut and the other in which input lightnesses can be expanded to fill the larger dynamic range of the output device. The operator introduced below is able to handle both cases without explicit user intervention, although operator override is also supported through the GUI of FIG. 21F.

Define $L_{pivot}$ as the greater ("lighter") of the minimum input and output L* values.

$$L_{pivot} = \max(L_{min\_in}, L_{min\_out}),$$

where the minimum input lightness may, for example, be the L* value of the darkest color that can be reproduced on a positive reversal film and the minimum output lightness the L* value of the darkest color printable on a reflection medium. $L_{pivot}$ is denoted in FIG. 14A by a plain dashed line.

For lightnesses higher than $L_{clip}$, the gamut operator maps input to output lightnesses identically as indicated by the equation in the open space below the maximum L* of 100. A "cushion" is put between $L_{pivot}$ and $L_{clip}$ in order to insure that the mapping is invertible:

$$L_{clip} = L_{pivot} + (L^*_{max} - L_{pivot}) * \text{cushion}.$$

0.1 is a reasonable value for cushion, chosen so as to reduce the risk of losing information due to quantization error to an acceptable level. In the limit in which cushion=1, the entire range of input L* values is scaled uniformly, or linearly, onto the range of output L* values.

In either case 1 or 2, all lightnesses between $L_{clip}$ and $L_{min\_in}$ are scaled onto the range of lightnesses between $L_{clip}$ and $L_{min\_out}$, whether the scaling-represents a compression or an expansion. A piecewise-linear scaling function is illustrated below for simplicity. Note that all L values refer to CIE Psychometric Lightness in these equations whether they appear with a * or not.

---

If ( $L^*_{in} > L_{clip}$ ) then
    $L^*_{out} = L^*_{in}$
Else
    $L^*_{out} = L_{clip} - [(L_{clip} - L^*_{in})/(L_{clip} - L_{min\_in}) * (L_{clip} - L_{min\_out})]$

---

The concept can be extended by adding the property of smoothness described earlier. The operator is based on a continuously differentiable function such as sine on the interval 0 to π/2, which generally resembles the piecewise linear function described above in shape but has no slope discontinuity. A table (Table I) of values of the function is given below; the first column is a series of angles in radians. X, from 0 to π/2 (90°), the second, the sine of the angle, Y. and the third the fraction Y/X. If we set Y/X=(1−cushion), we can control the "hardness" or abruptness of the gamut-mapping implemented by the operator stated below the table in for the case of cushion ~=0.1. For speed, the various evaluations implied may be implemented by interpolation in look-up tables. The operator described does not enable a purely proportional scaling (cushion=1.) The latter is not generally desirable but is available to users through the gamut options of the GUI in FIG. 21F.

TABLE I

| Angle, x (rad) | sin (x) | sin (x)/x | |
|---|---|---|---|
| 0.0000 | 0.0000 | * | |
| 0.0873 | 0.0872 | 0.9987 | |
| 0.1745 | 0.1737 | 0.9949 | |
| 0.2618 | 0.2588 | 0.9886 | |
| 0.3491 | 0.3420 | 0.9798 | |
| 0.4363 | 0.4226 | 0.9686 | |
| 0.5236 | 0.5000 | 0.9549 | |
| 0.6109 | 0.5736 | 0.9390 | |
| 0.6981 | 0.6428 | 0.9207 | |
| 0.7854 | 0.7071 | 0.9003 | <------ "cushion" ≅ 0.10 |
| 0.8727 | 0.7660 | 0.8778 | |
| 0.9599 | 0.8191 | 0.8533 | |
| 1.0472 | 0.8660 | 0.8270 | |
| 1.1344 | 0.9063 | 0.7989 | |

---

If ($L^*_{min\_in} < L^*_{min\_out}$)
  .707 * ( (100 − $L_{out}$) / (100 − $L_{min\_out}$) ) = sin [ .785 * ( (100 − $L_{in}$) / (100 − $L_{min\_in}$) ) ]
Else
  .785 * ( (100 − $L_{out}$) / (100 − $L_{min\_out}$) ) = arcsin [ .707 * ( (100 − $L_{in}$) / (100 − $L_{min\_in}$) ) ]

---

The operators presented above rely on gamut descriptors to find the limiting colors of the input gamut that must be mapped into the output gamut. Once corresponding surface points in the two gamuts have been identified, the scaling function is used to prepare the conditioning transformation.

In summary, input gamuts can be very different from output gamuts. They often have a larger range of luminances (or dynamic range) such that it is preferable to perform a scaling in Lightness before working on Chroma or saturation. Secondly, scaling of Chroma is performed along lines of constant hue. Compensation for imperfections in the CIE models (embodied in CIELAB and CIELUV) of hue constancy or for elective changes in hue are handled separately. An example of elective changes is the need to map highly saturated yellows from film input to highly saturated print yellows by way of a change of hue angle. Modifications of hue can be accomplished through the conditioning transformation by color aliasing.

Figure 15A:
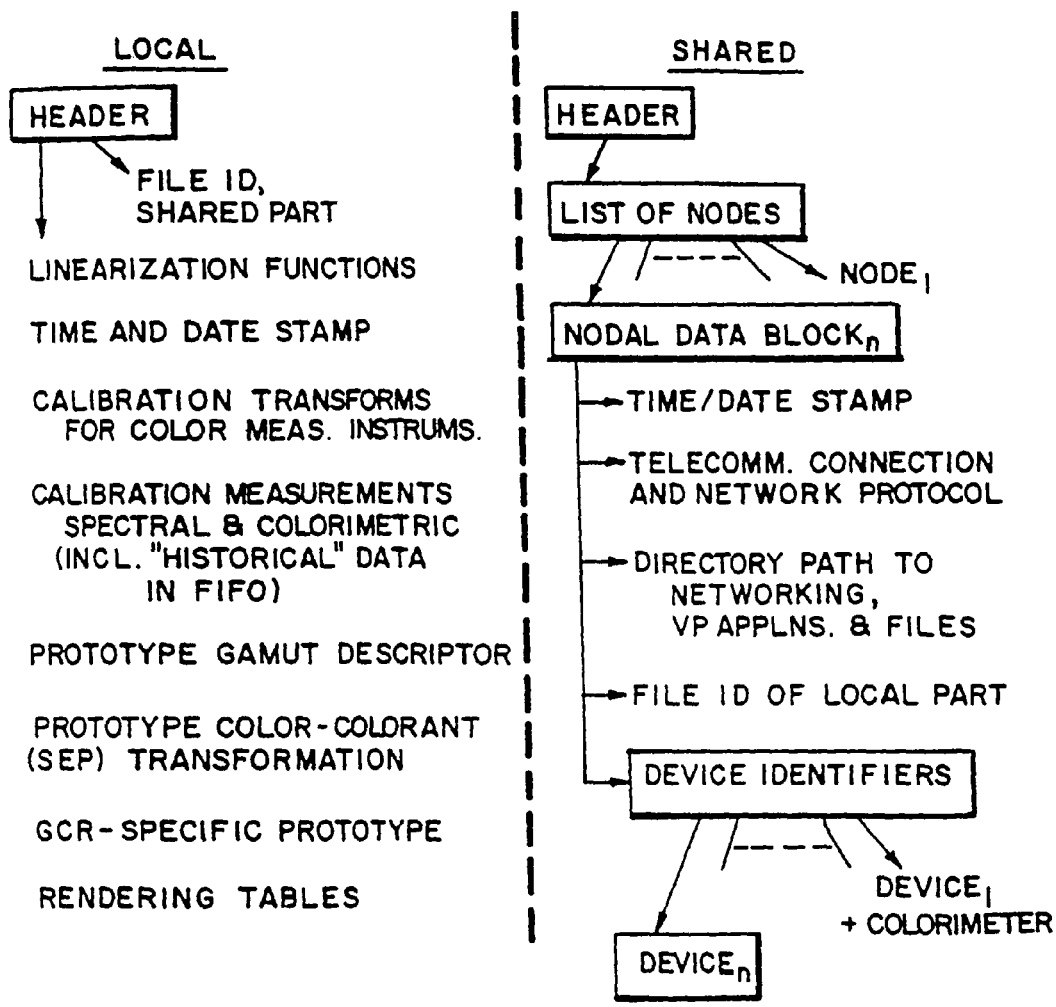
FIGS. 15A and 15B show the constituents of local and shareable components in the data structure of the Virtual Proof.
Figure 15B:
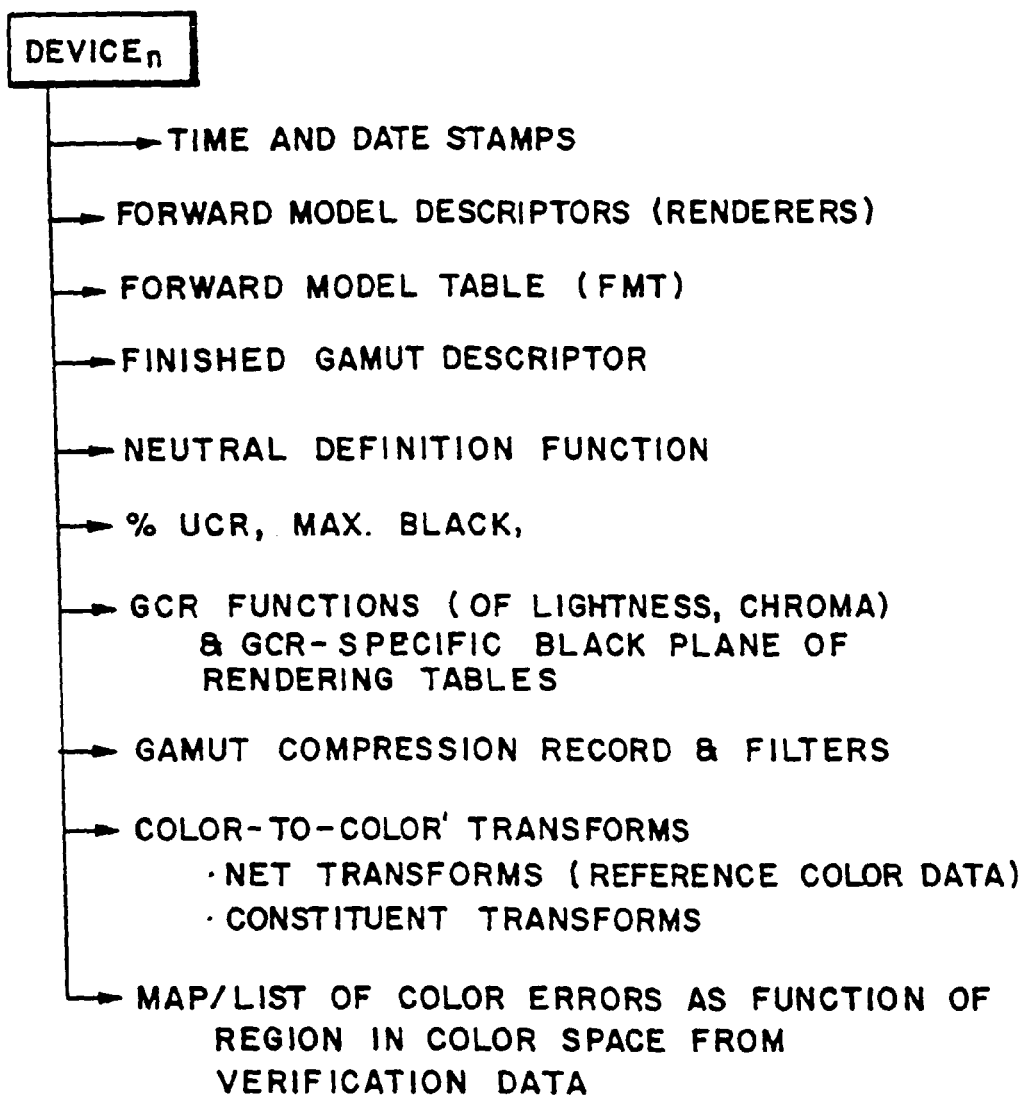

Referring now to FIGS. 15A and 15B, the shareable and local components described above in the VP are shown. In the interest of compact messages, not all shareable data need be transmitted in each transaction involving Virtual Proof. To the application software which administers the Graphical User Interface Software, both operating at a node, the VP is a set of data structures based around the classes Node and Device/Transform. The data structures map onto a general file structure which is not bound to a particular operating system, computer platform or processor. Object-oriented conventions of data-hiding are employed in the software to insure the integrity of transformations which are manipulated at a node. Accordingly, the VP files which store the data and transformations have local and shared components, as stated earlier; shared components consist of data which are read-only to all nodes except the one, assigned responsibility for the data. During initialization in preparation for virtual proofing described in connection with FIG. 18, participating nodes insure that appropriate data are written to the relevant nodal fields within the shared file system.

The VP enables revision of color aspects of page/image data up to and even during rendering. An important aspect of revisability is the customization of data for rendering on particular devices. An equally important property of revisability is that page/image data need not be altered directly; rather they are "interpreted" in various ways through the medium of the VP. This eliminates the need to maintain multiple, large versions of page/image data at a particular node or to move one or more versions around the network repeatedly as a result of re-interpretation. Therefore, although the VP allows for image specificity and linking, preferably it is not bound into page/image files. The structure of the VP is similar to that of the Tagged Image File Format (an example is described in "TIFF™ Revision 6.0", Jun. 3, 1992, Aldus Corp., Seattle Wash., pp. 13-16).

Figure 15C:
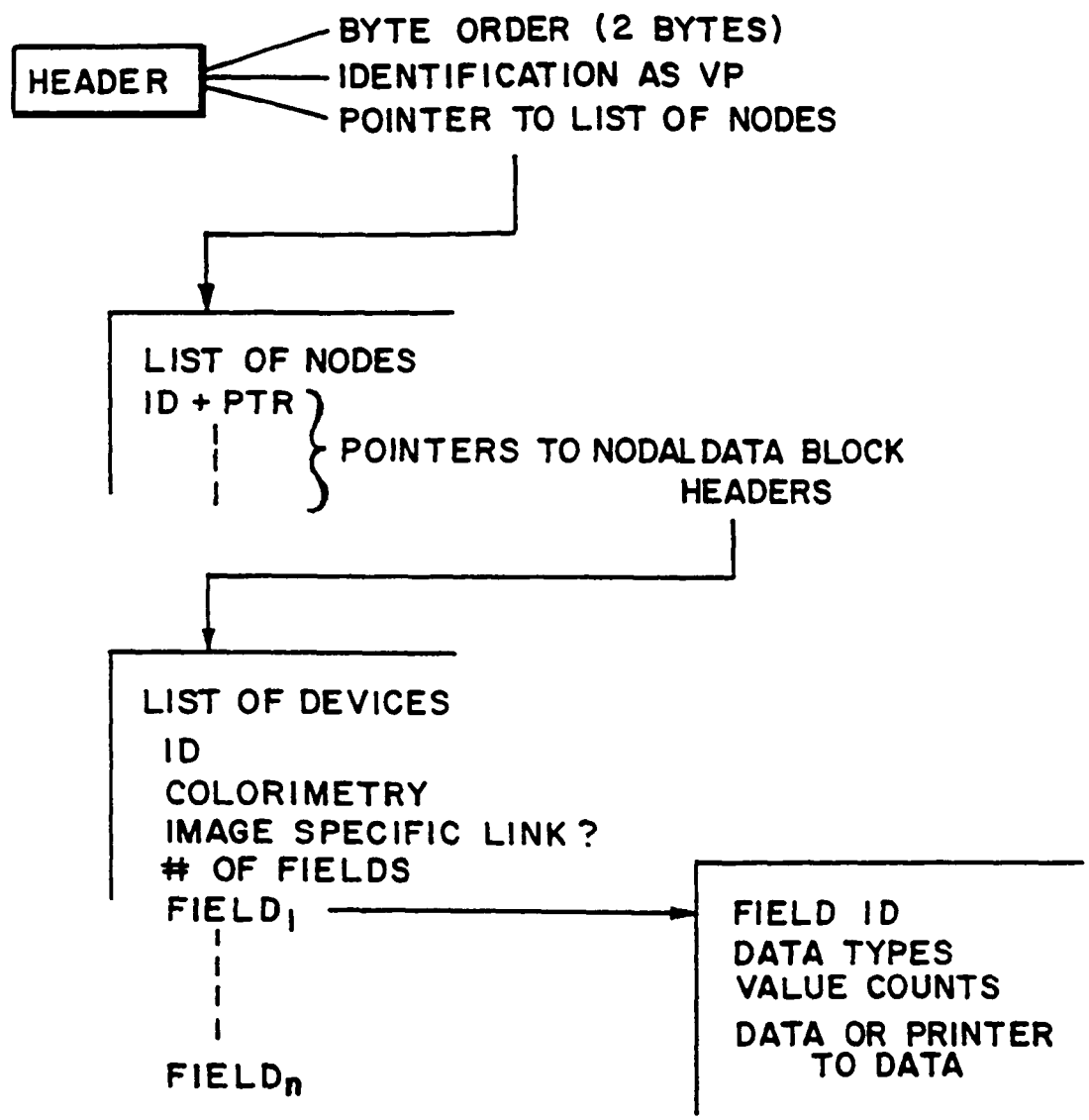
FIG. 15C is an example of a tagged file format for the shared components of the Virtual Proof of FIGS. 15A and 15B.

An example of the tagged or linked list file format for the shared parts of the VP is shown in FIG. 15C. The tags are referred to as Field IDs (bottom right of FIG. 15C.) It is possible for a given device to be present in a VP file more than once, specialized to represent images for different input gamuts or black utilization, etc.

Figure 16A:
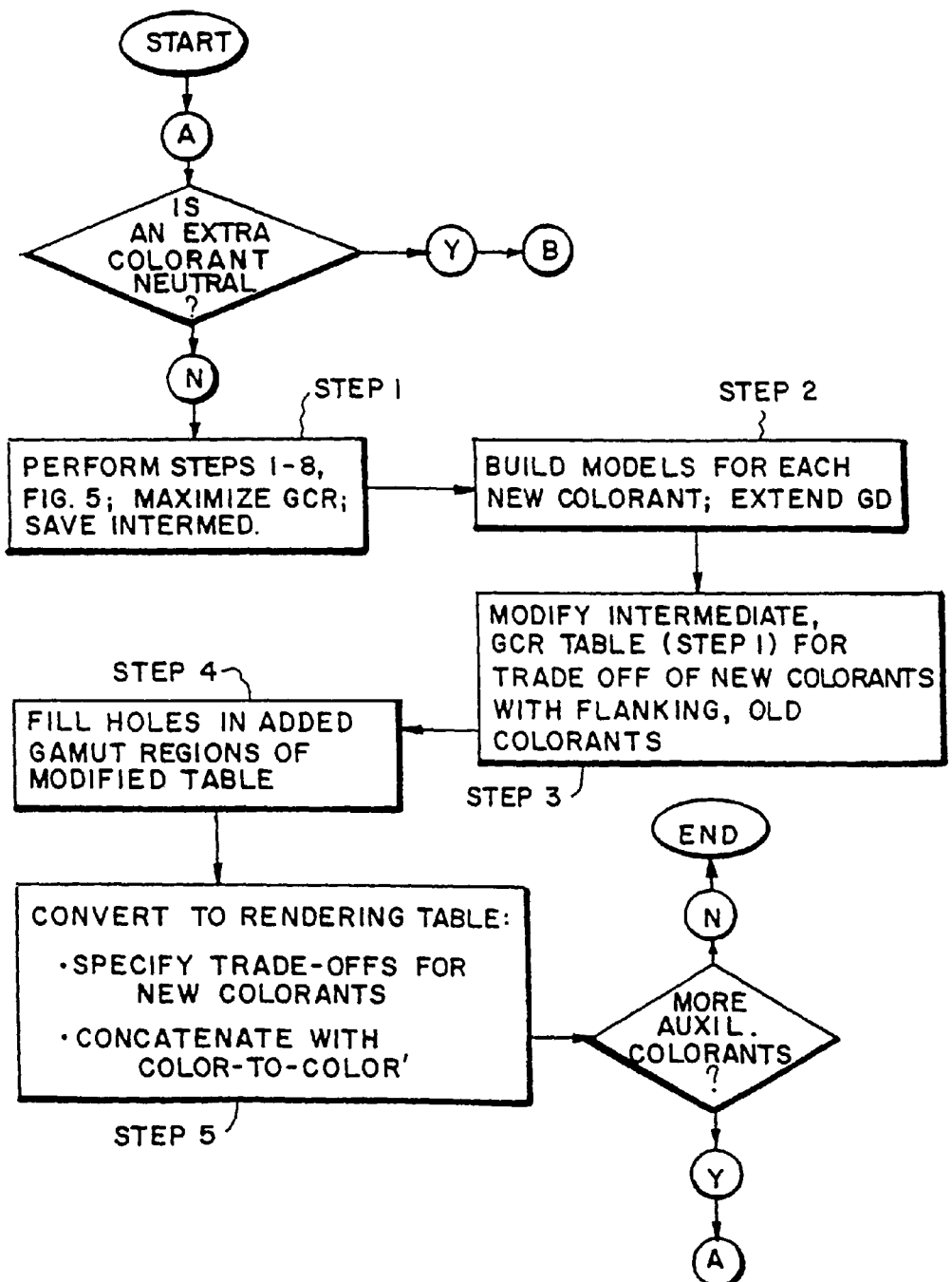
FIG. 16A is a flow chart of the process for calibrating a rendering device having more than four colorants by adding non-neutral auxiliary colorants to a rendering transformation.
Figure 16B:
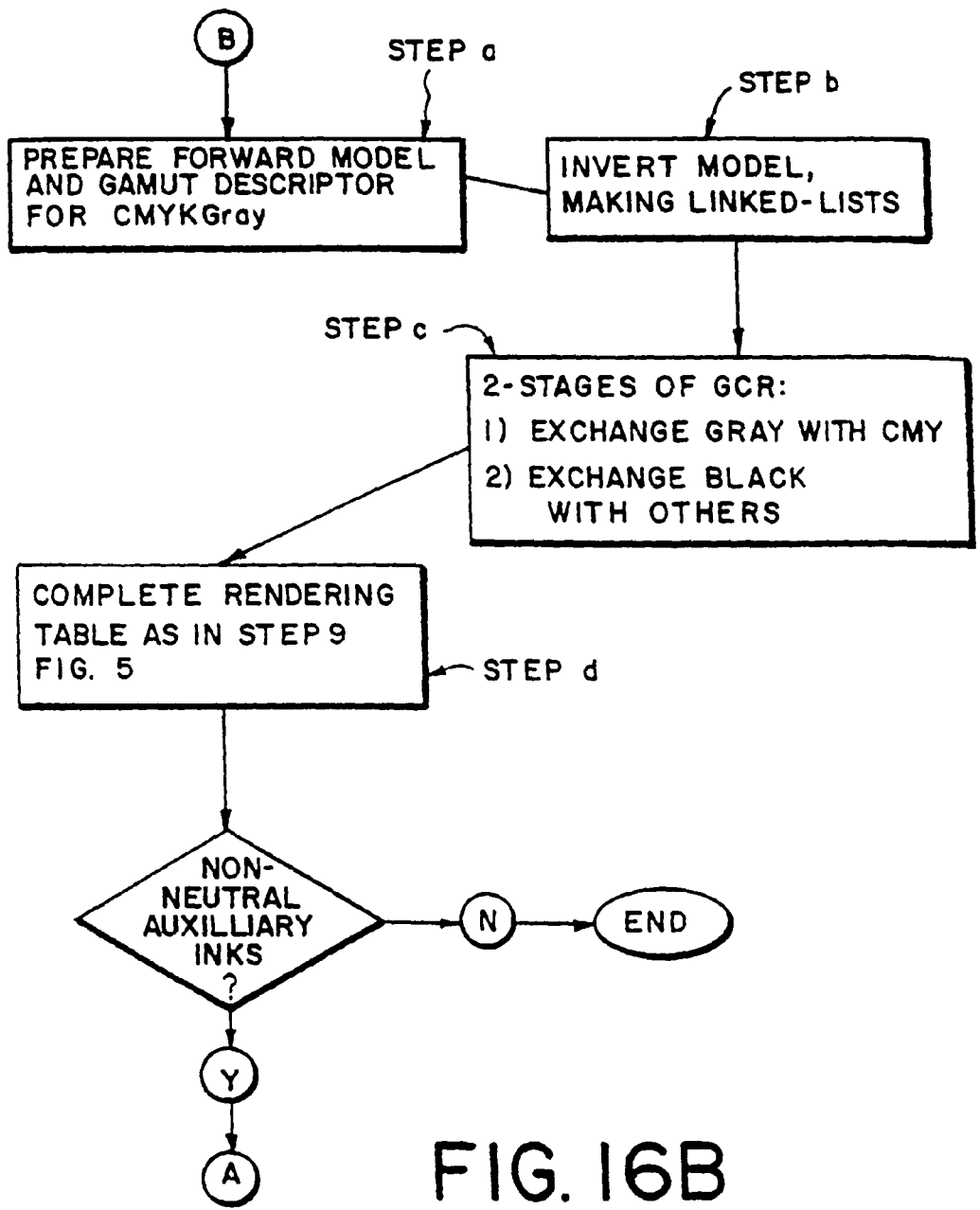

System 100 may incorporate rendering devices at nodes having more than four colorants. The processes for performing color to colorant conversions for more than four colorants is shown in FIGS. 16A and 16B, which are connected at circled letters A and B. In FIG. 16A, after starting, if the extra colorant is neutral, then proceeding continues to the start of FIG. 16B. Otherwise the following steps for adding additional non-neutral colorants (e.g. Red, Green and Blue) are performed:

Step 1) Proceed as for 4 inks through to the stage of gamut scaling. Use the Black Utilization tool which enables % GCR to depend on Chroma, to push towards maximum Black (2-colors+Black) solutions, with the complementary color pushed toward zero) solutions. Save this as an intermediate table. This intermediate is the equivalent of a GCR-specific SEP table.

Step 2) Build a model for converting C. M Blue and K (black or N) to color and omitting the colorant complementary to the "auxiliary." in this case. Yellow. Make a Forward Model Table and use the model to extend the original gamut descriptor prepared in (a). Do likewise for C. Y. Green and K and M. Y. Red and K. Note that the general rule is to add additional colorants one at a time, grouping each with the colorants which flank it in hue angle. Make FMTs for each new model for each auxiliary colorant and re-refine the Gamut Descriptor. Note, however, that the multiple models are used to refine only one GD.

Step 3) Modify the proto-rendering table (only one of these is maintained): Within the C.M.Blue, K gamut, there are not multiple solutions with different amounts of black at a given color; however, there are many solutions trading off CM vs. Blue. Store linked lists of these solutions at relevant color addresses in the intermediate table. Do likewise for CYGreenK and MYRedK.

Step 4) Treat the intermediate table as a "prototype table" in the 4-colorant case. Perfect it by making sure that all printable addresses in the new color regions of the table have at least one solution ("fill the holes.")

Step 5) Once the intermediate table has been reprocessed for all non-neutral auxiliary colorants, convert to a rendering table by performing the analog of GCR in the three new regions of the table. Check total area coverage, re-scale gamut and complete as for four inks (Step 9, FIG. 5.)

The foregoing procedure does not estimate the full gamut available: for example, the gamut at the hue angle of cyan is increased by the availability of blue and green. In other words, the BCGN gamut (where N stands for Neutral, or black) is not considered in the foregoing. Overprints of Blue and Green are likely to be substantially dark, compared to cyan. Therefore, the additional colors available in this gamut are not, in general, very numerous and need not be computed. However, in those cases in which the lost colors are important, the procedure outlined above is extended to include auxiliary gamuts centered on the standard subtractive primaries (C, M and Y) rather than on the additional colorants (R. G and B.) The result is overlapping auxiliary gamuts. By default, the decision regarding which of the overlapping auxiliary gamuts to search for a solution chooses the gamut centered on the ink of closest hue angle. There is nothing in the procedure which prevents its extension to even more colorants, which may be added in a recursive fashion. However, practical applications involving the overprinting of more than 7 (or 8, in the case of an extra neutral) colorants are very unlikely.

After the above steps are complete, if more colorants need to be added, processing branches to the circle A at the start of FIG. 16A, otherwise the process for adding additional colorants is complete. In the case of addition of auxiliary colorants which does not involve overprinting more than 3 or 4 colorants at a time (as in the case of multiple, "custom" colorants that might be used in package printing) the colorants are treated as separate sets according the procedures outlined previously.

If the process branched to FIG. 16B (to circle B), then the following steps for adding an approximately neutral colorant, such as gray, are performed: If additional non-neutral colorants are also to be added, add them according the procedure outlined in FIG. 16A above.

Step a) Prepare a colorant to color transformation for the 5-colorant set CMYKGray. Evaluate this model either with polynomial hardware or with a 9×9×9×9×9 interpolation table having about 60,000 five-dimensional cells. The simple linear interpolator is preferred and is particularly appropriate to this situation because the complexity of calculations scales linearly with the dimensionality of the interpolation space. As usual, make a Gamut Descriptor in tandem with building FMT.

Step b) Invert the model as in the 4-colorant case, fixing black and gray: build up linked lists of alternative solutions for a given color.

Step c) Proceed as in the 4-colorant case. When inverting the model, use only CMY and Gray wherever possible (i.e., fix black at zero) adding black only as necessary to achieve density. There are two stages of GCR. In the first, black is held to a minimum and gray is exchanged with C, M and Y. In the second, black may be exchanged, optionally, with gray and small amounts of the other colorants, as needed to keep the color constant. In the second stage, an error minimization routine is needed; Newton-Raphson is not appropriate.

Step d) UCR, preparation of a conditioning transformation, and so on as in the 4-colorant case, follow the second stage of GCR. Complete the rendering table, except for addition of auxiliary, non-neutral colorants.

After the above steps a-d, if additional non-neutral colorants are also to be added, processing branches to circled A in FIG. 16A, otherwise the process for adding additional colorants ends.

Figure 17:
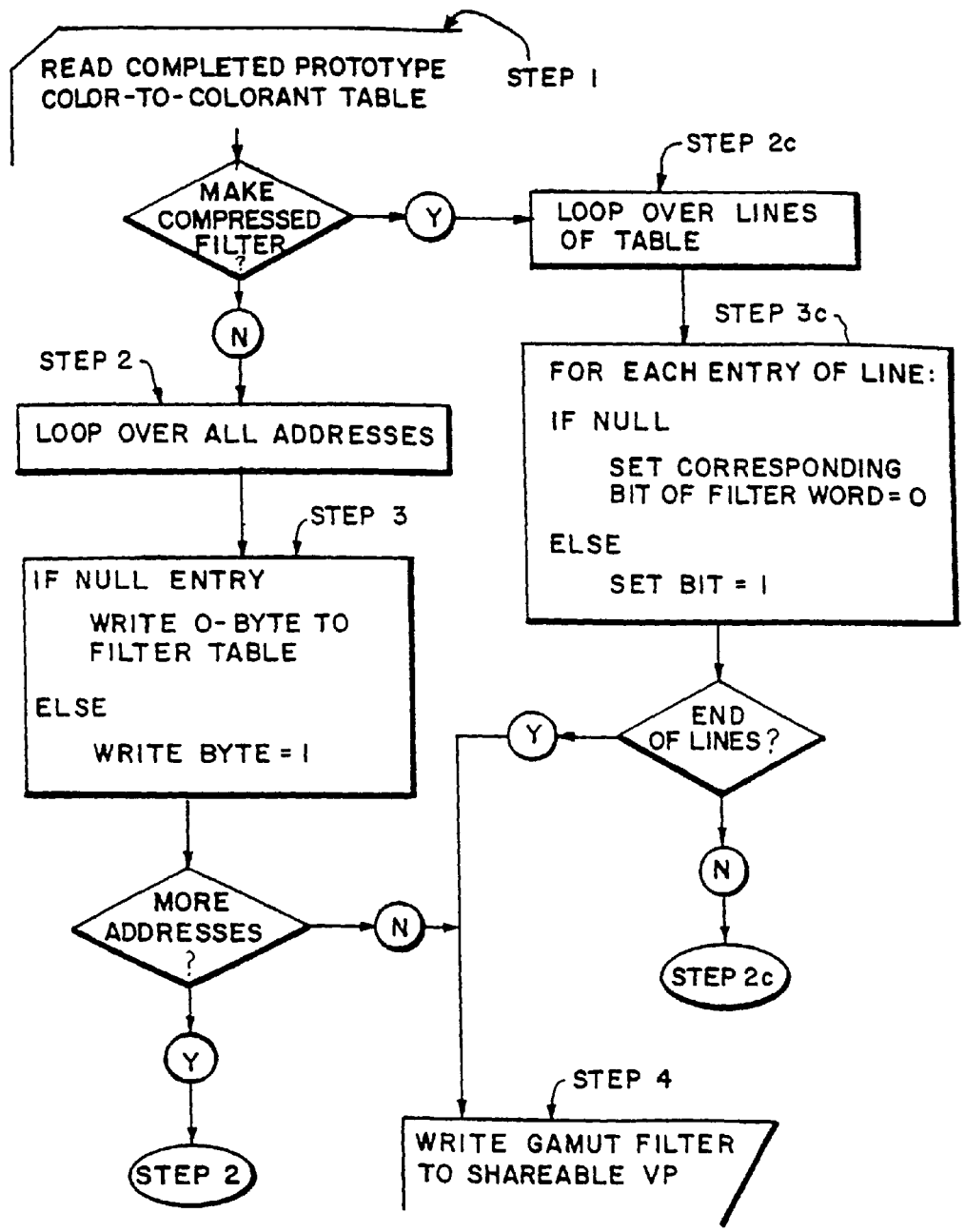
FIG. 17 is a flow chart showing the process for preparing a gamut filter, a data structure which facilitates the comparison of gamuts of two or more rendering devices.

Referring to FIG. 17, the process for building a gamut filter is shown. The finished prototype color to colorant table, filled with NULL cells and specific GCR solutions, is one manifestation of a device's gamut. It can be converted into a very useful filter in which each cell gets an indicator bit. 0 if the cell is NULL and 1 otherwise. The filters of two or more devices can be used to enhance visualizations.

Many graphics cards for driving video displays provide an alpha channel or overlay plane enabling the visualization of translucent graphical information on top of a displayed image. The results of performing Boolean operations on combinations of gamut filters for multiple devices may be converted into color-coded or pseudocolor overlay information to reveal things such as which image pixels are in gamut for one device but not another. With this tool, the intersection of the gamuts (the "Least Common Gamut") of five presses can readily be compared with each press's gamut in turn on common imagery, in support of a decision about what to use as a common criterion for color reproduction across the network.

Semi-transparent overlays are generally not possible for hard-copy devices without extensive image processing. In the case of a printer, a monochrome version of the image may be prepared and printed, overlaid with colored speckles indicating regions of overlap of multiple gamuts. The "overlay" is actually constituted by redefining subsets of the pixels in the image which belong to a certain gamut category as a particular speckle color. The foregoing method involves making a modified copy of the color image data with reference to the gamut filter.

An alternative, and preferred, method provided by the invention for readily identifying gamut overlaps is to filter the color-to-color' transform or actual rendering table. This may be done by leaving the contents of "in" addresses as they were while modifying the color or colorant contents of one or more varieties of "out" addresses to contain white or black or other identifying color. Different identifying colors may code different regions of intersection, overlap or disjointedness of the gamuts of several devices. When one or more channels of the (original) color image data are rendered through the "filtered rendering table." colors in the image which are out of gamut are mapped to one of the identifying colors and the resulting print reveals gamut limitations of various devices with respect to the imagery itself. An additional advantage of this method is that it is effective even when some of the colors under consideration are out of gamut for local proofing devices.

Another method of visualization available with the filters is to look at slices through Boolean combinations of the filters for two or more devices. Finished proto SEP tables are not generally useful other than in the preparation of rendering tables for a particular device: therefore, they are kept local. The filters are written to the shared portion of the VP.

More specifically, in FIG. 17 a flowchart of the process of making a gamut filter in either a compressed form, in which a single bit is 0 or 1 to denote NULL or "in-gamut." or in a form in which each color's status is coded with a byte equal to 0 or 1 is illustrated. In the compressed case, a computer word may be used to represent a row or line of the prototype color-to-colorant table with each bit packed in the word representing one color address. After reading the proto-table (step 1) the steps of making the compressed filter include 2c) looping over the lines of the table, 3c) setting or resetting the bits of a word depending on printability and 4) finally writing the filter to shareable VP. The steps for making a byte table are completely analogous, except that a byte is devoted to each color address.

The two basic processes of calibration and verification (monitoring) rely on instrumentation and interact to produce the rendering transform which embodies the VP and can interpret color image data.

Figure 18A:
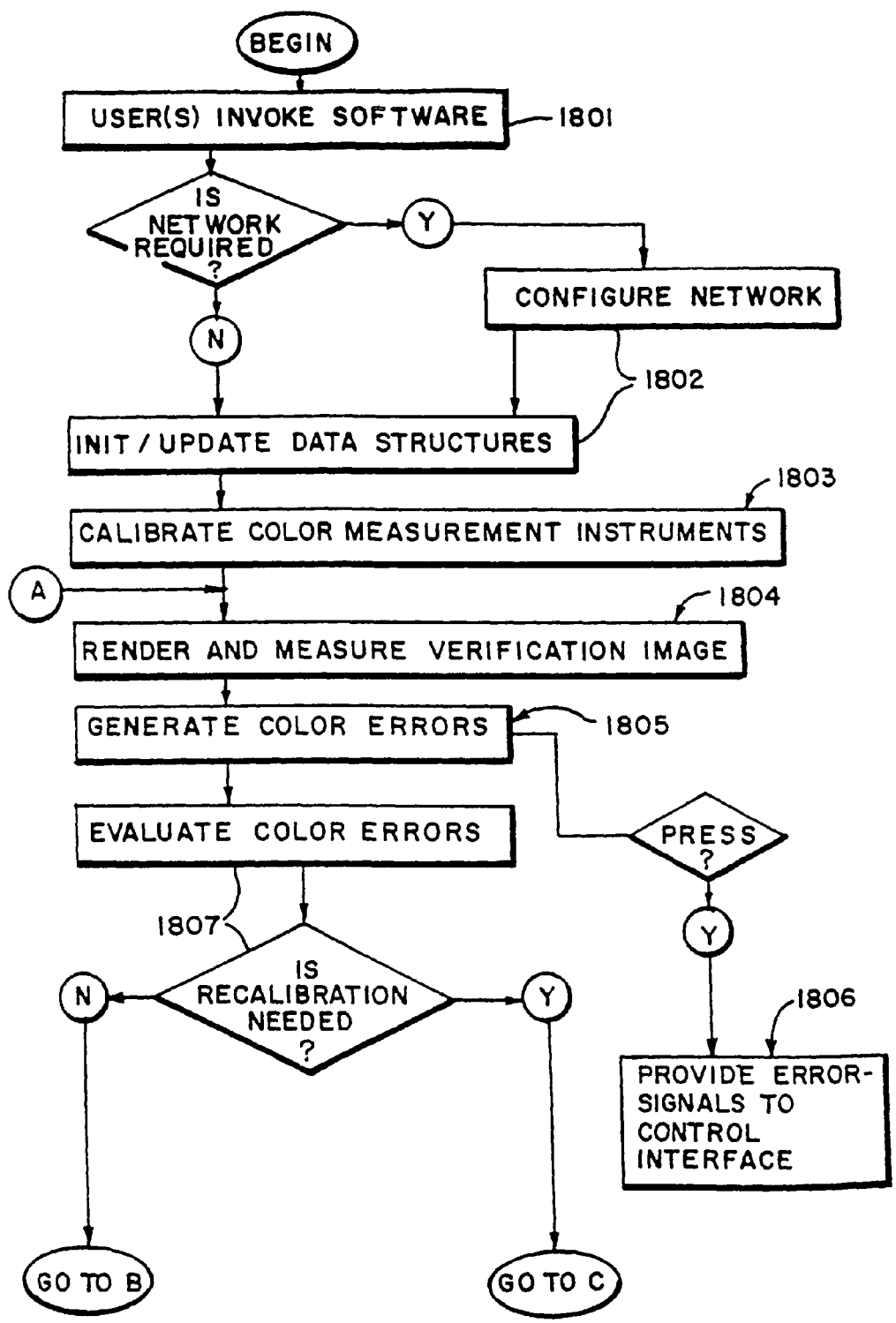
FIGS. 18A and 18B are a flow chart for virtual proofing using the system of the present invention.
Figure 18B:
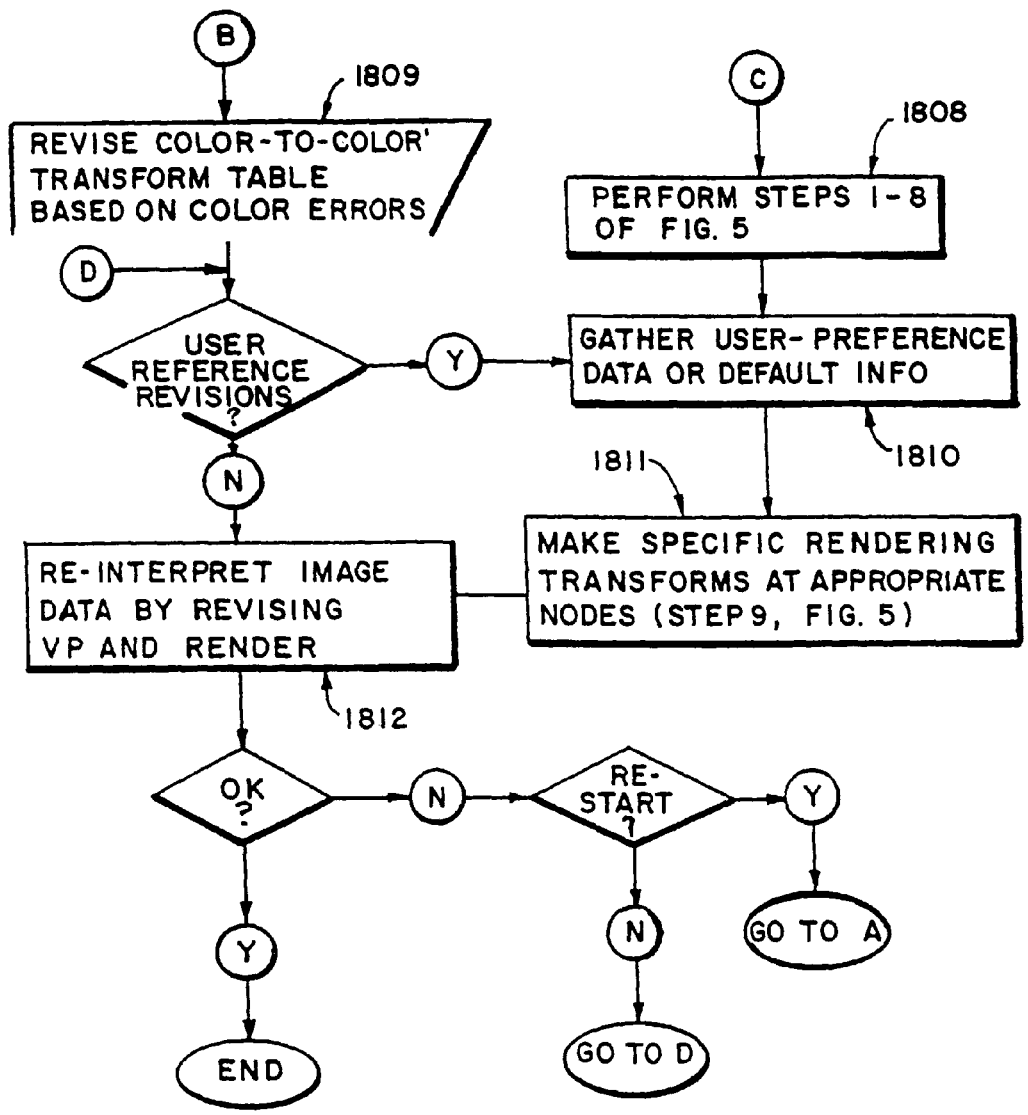

Referring now to FIGS. 18A-B, a flow chart of the program operating at nodes 102 and 104 for virtual proofing in system 100 is shown. The figures are connected at circled letters A-D. At the top of FIG. 18A, one or more users invoke the application software 1801: a single user can run the program in order to revise the Virtual Proof as it relates to the local node, or to other nodes which are accessible. Often, multiple users run the program simultaneously to negotiate the VP. Network readiness is established by making sure that the relevant, participating nodes all share current data 1802. CMI's are put through (preferably automatic) calibration checks 1803. Next, verification of device calibration is attempted by rendering and analyzing color 1804. The details of this step depend on the nature of the device and of the color measurement instrument: if the device is a press, particularly one with fixed information on the plate, the verification is most likely to involve "live" imagery rather than a predefined cal/verification form or target such as one consisting of tint blocks. The color error data 1805 produced by verification are supplied to the press controls, if appropriate 1806, as well as to the program to support decisions about whether color variations can be compensated by modification of existing rendering transforms of the VP or whether recalibration of the device is required 1807.

If re-calibration is called for, the program branches to C, atop FIG. 18B, where systematic calibration after FIG. 5 is undertaken 1808. Else, the program branches to B, atop FIG. 18B, to revise the color-to-color' transform 1809 based on the processing of the color error data, which is detailed later in FIGS. 19 and 20. Next, the need for User-preference revisions is assessed at D. If YES, then gather User preference data 1810 and re-specify rendering transforms 1811 as in Step 9, FIG. 5. If NO, then revise VP for a new interpretation of image data and render 1812. If results are satisfactory, conclude. Else, either recalibrate at A or revise preferences at D, depending on the nature of the diagnostics.

Verification is a feature of system 100 used in virtual proofing, described above, and color quality control of production rendering devices. The reason for verification is that the use of system 100 for remote proofing and distributed control of color must engender confidence in users that a proof produced at one location looks substantially the same as one produced in another location, provided that the colors attainable by the devices are not very different. Once rendering devices are calibrated and such calibration is verified to each user allowing, virtual proofing can be performed by the users at the rendering devices. In production control, such verification provides the user reports as to status of the color quality.

During verification of production rendering devices, on-press analysis of printed image area may be used in control of the production process and for accumulation of historical data on color reproduction performance. Historical data may be used in a statistical profile of the manufacturing run which serves as a means of verifying the device calibration. It is also used to inform and update the virtual proof, enabling better representation of the production equipment by a proofing device. With a sufficient accumulation of historical information, it is even possible to model and predict the effects of neighboring pages in a signature on the color in the page of interest to an advertiser.

Once a device has been calibrated, the color transformations thus can be one of the mechanisms of control. In a control loop, colors produced by the device are compared to desired values and mechanisms affecting colorant application are modulated to reduce the discrepancy between measured and desired values. Control implies continuous feedback and iterative adjustment over many printing impressions, whereas proofing devices are usually one off. Nevertheless, proofing devices vary with time and periodic recalibration is a means of control.

One feature of system 100 is to provide the User with information about the color accuracy of the proof. It has been noted that the invention is compatible with two kinds of instrumentation, unitary colorimeters (SOMs 13) capable of measuring homogeneous samples and imaging colorimeters (imagicals 14) capable of sensing many pixels of complex image data simultaneously. In the following discussion, differences in verification procedures for the two kinds of instrument are considered.

Calibration is best carried out with a specialized form which is known to explore the entire gamut of the device. The rendered form can be measured by either type of instrument. In verification, the requirements of sampling the entire gamut are not as stringent: the interest is often in knowing how well the reproduction of all the colors in a particular image is performed, even if the image samples only a part of the device gamut.

Figure 19:
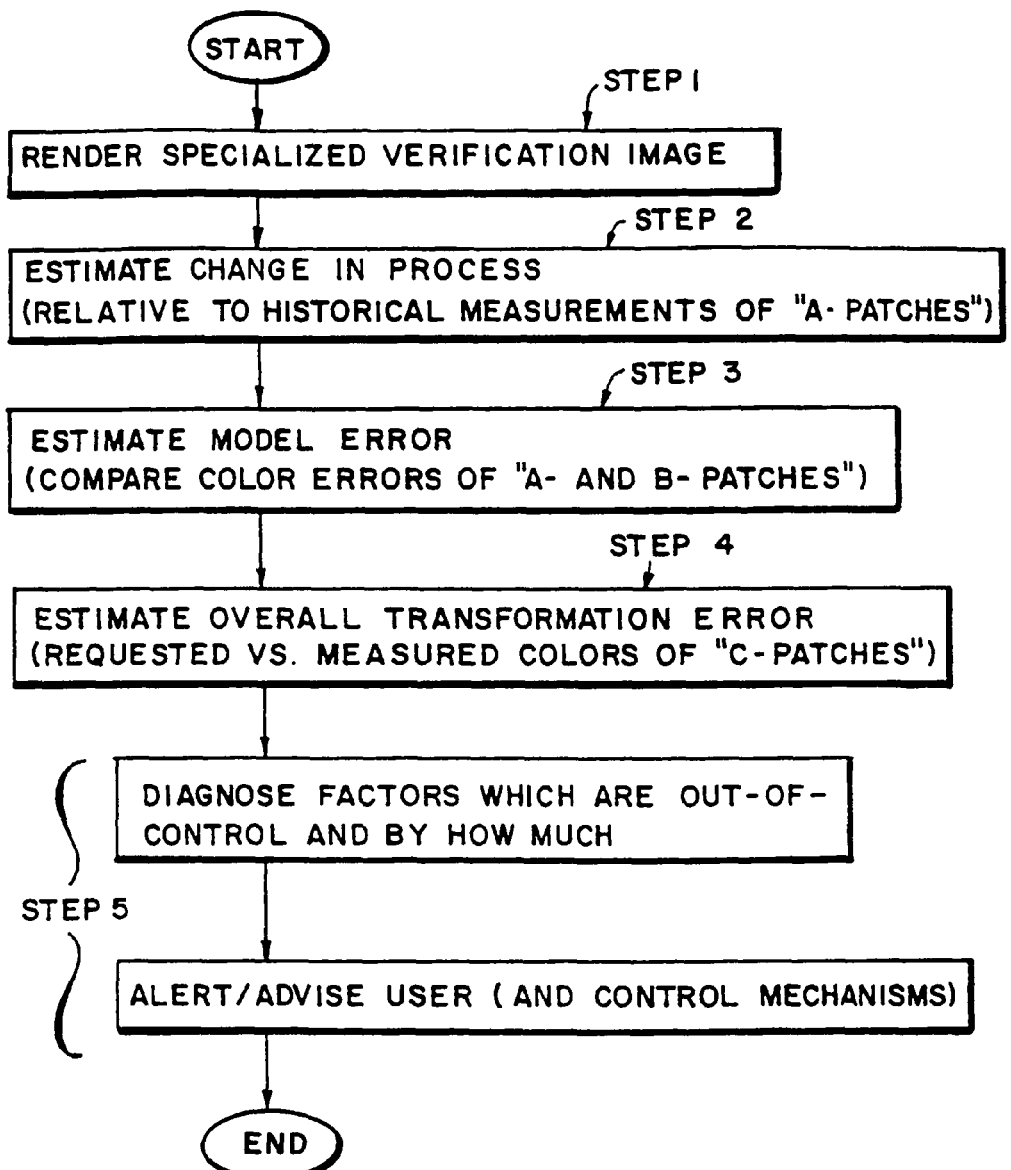
FIG. 19 is a flow chart of the verification procedures employed to estimate process variations based on measurements of color errors.

Referring to FIG. 19, steps 1804-1807 of FIG. 18A are shown. A specialized verification image is analyzed either with a SOM 13 or an imagical 14 according to the following procedures: Step 1: Render an image consisting of homogeneous samples ("patches") of three types: a) patches whose nominal colorant specifications match those of patches in the original calibration, b) patches whose nominal specs are different and c) patches specified as color. The original calibration procedure (see FIG. 8) produced statistical estimates of within-sheet and between-sheet color differences or process variation. User-defined requirements for accuracy are expressed in terms of standard deviations (or like quantity) within the process variation to define confidence limits for the process. Three kinds of color error derived from verification procedures are used to control the process and are referred to the confidence interval in order to decide if recalibration is necessary.

Step 2: New measurements of type "a" patches (preceding paragraph) are compared to historical values to estimate change in the process: a thorough sampling of color space is useful because it is possible that change is not uniform with color. Step 3: Model predictions of the colors of patches of types "a" and "b" are compared to measurements to yield estimates of the maximum and average values of color error for the forward model. Step 4: Comparisons of the requested colors of patches of type "c" to those obtained (measured) are used to estimate the overall error (due to change of the process, model error, model inversion error, interpolation and quantization errors, when relevant.) Step 5: If color errors assessed in this way exceed the confidence limits, the User(s) are advised that the system needs recalibration and corrective actions may also be taken, such as modification of conditioning transforms, depending on the severity of the problem. If the device is a press, color error data is furnished to the press control system (subject to User intervention) which does its best to bring the press as close to criterion as possible.

The advantage of specialized imagery is that suitably chosen patches provide more information than may be available from imaging colorimetry of images with arbitrary color content. This can guarantee that the entire gamut is adequately sampled and can provide differentiated information about sources of error. Also, imaging colorimetry of the reproduction during or shortly after rendering is often the least obtrusive way of verifying that forward models and rendering transformations are current, especially when a volume production device is the object.

Because, as was noted above, the variations in color need not be uniform throughout the gamut of the device, the data structure is segmented into clusters of contiguous cells in order to identify the most frequent colors in the various regions of the gamut. Thus, system 100 herein samples color errors throughout the image is one of the points. The processing checks to make sure that the frequency it is reporting for a cluster of cells is a peak, not a slope from a neighboring cluster.

In order to improve the reliability with which corresponding peaks in different histograms can be resolved, methods of image processing such as accumulation of counts from multiple images (averaging) bandpass filtering and thresholding are employed. Then regions of the histograms are cross-correlated. Cross-correlation is a technique discussed in many texts of signal and image processing, in which two functions are convolved without reflection of one of the two. It is similar to techniques in the literature of W. K. Pratt, Digital Image Processing, N Y: Wiley, 1978, ch. 19, pp. 551-558. A "cross-correlogram" reveals the offsets of one histogram with respect to another in three-space.

The color offsets of the peaks are expressed as color errors. These are made available for numerical printout as well as for visualization. In the latter, the user may choose to view a monochrome version of the image overlaid with translucent color vectors showing the direction and magnitude of color-errors, or may choose to view a simulation of the error in a split screen, full color rendering of two versions of the image data showing what the error can be expected to look like.

For clarity, an equivalent procedure for cross-correlation can be outlined as follows: 1) subdivide the histograms into blocks and "window" them appropriately. 2) calculate Fourier Transforms of the histograms, 3) multiply one by the complex conjugate of the other, 4) Inverse Fourier Transform the product from 3 and 5) locate the maximum value to find the shift in the subregion of color space represented by the block.

For the simplest level of control, the inverse of the color errors may be used to prepare a conditioning transformation which then modifies the rendering transformation employed in making another proof. For more sophisticated, on-line control, the data are used to compute error gradients of the sort described earlier and used by optimization and error minimization algorithms. Results are fed to the control processor of a press or used to modify the rendering transform as a control mechanism for a press (or press-plate) Which does not use a press bearing fixed information.

Figure 20:
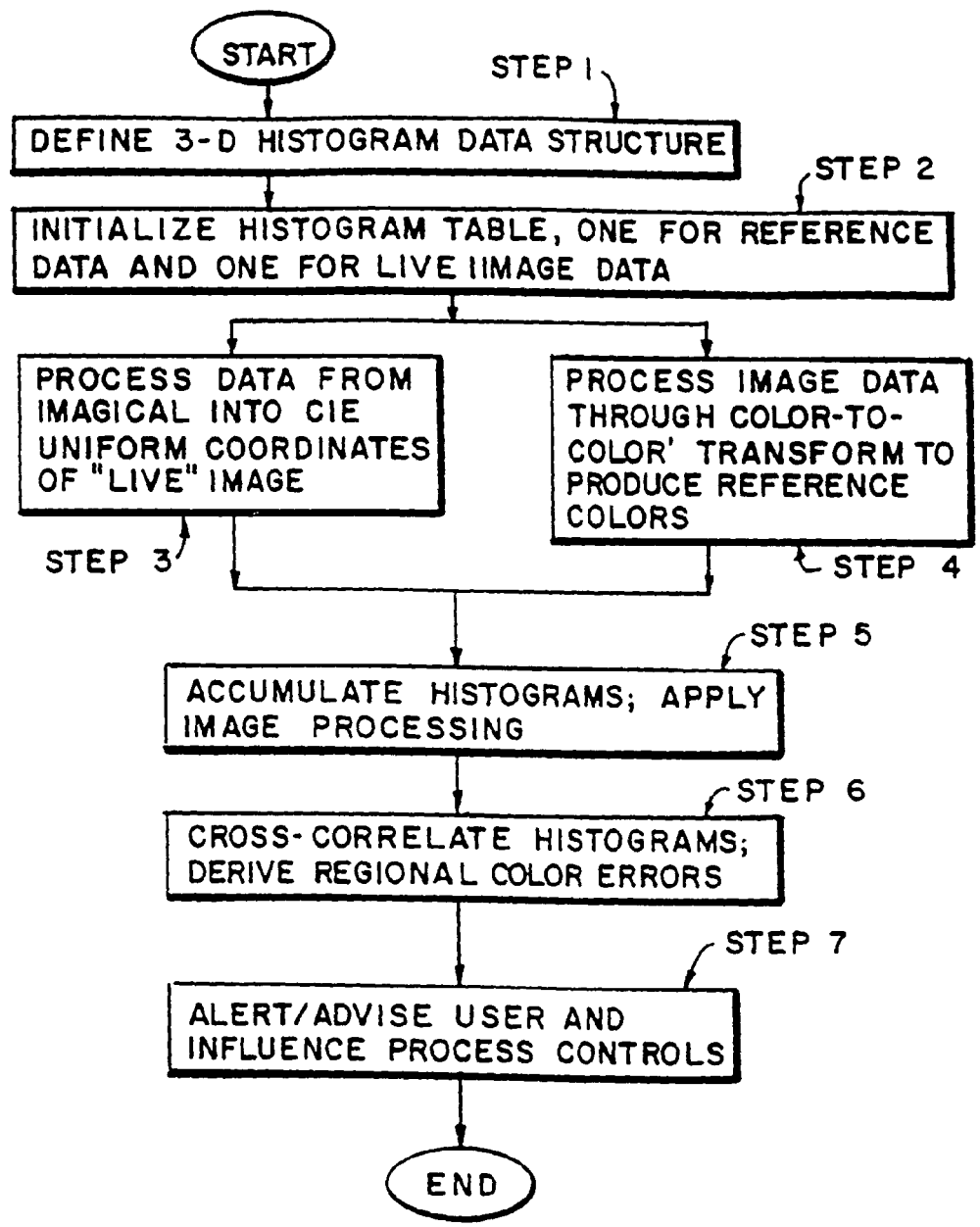
FIG. 20 is a flow chart of the process of preparing a three-dimensional color histogram of color image data in providing a resolution-independent analysis of color error relative to a criterion.

The goal is to determine errors in color reproduction in a resolution-independent way. This is shown in reference to FIG. 20, illustrating processes 1804-1807 in FIG. 18A when an imagical 14 is verifying using live image data. In step 1 of FIG. 20, the histogram is defined. Generally, it is a data structure addressed similarly to the Conditioning Transform (color-to-color' table) described earlier, although the range of colors represented in each dimension of the structure is adaptive and may depend on the imagery. In step 2, the 3-D arrays to hold accumulated histogram data are allocated in memory and initialized: one array is needed for "live" image data and the other for reference data. At step 3, capture of "live" image data occurs. Optical low-pass filtering may precede image capture, preferably by a solid state electronic sensor, in order to reduce aliasing in signal processing. The electronic, pixel data are converted into CIE coordinates, and, simultaneously, a histogram of the relative frequency of occurrence of colors in the image is stored. As mentioned earlier, the data structure may be segmented into clusters of contiguous cells in order to identify the most frequent colors in the various regions of the gamut.

In part 4 of the process, the image data (not that captured by the imagical, but the "original," image data) are processed through the color-to-color' transform to produce Reference Color Data which are accumulated in a histogram structure. It is important to recognize what the requested (or "reference") colors are. They are the colors (preferably in CIE Uniform coordinates) which are the final outputs of all the color-to-color' conditioning transforms (usually exclusive of color-coordinate transforms) and thus represent the interpretation of the image data negotiated by the Users.

In steps 5 and 6, as described above, the program checks to make sure that the frequency it is reporting for a cluster of cells is a peak, not a slope from a neighboring cluster. Accumulation of counts from multiple images (averaging) bandpass filtering of histograms, thresholding, autocorrelation and other operations of image processing are used to improve reliability and the ability to resolve peaks and match corresponding peaks in different histograms. Ordered lists of peaks are prepared and written to the shareable portion of the VP. The lists are compared and corresponding peaks identified. The color offsets of the peaks are expressed as color errors. In step 7, color error data are made available to User/Operator and control systems.

Referring to FIGS. 21A-21F, a Graphical User Interface (GUI) to the application software is shown. The GUI is part of the software operating at the nodes in network 11 for conveying the workings of system 100 at a high-level to the user. The user-interface has reusable software components (i.e. objects) that can be configured by users in a point-and-click interface to suit their workflow using established visual programming techniques. The GUI has three functions: 1) Network (configure and access resources) 2) Define (Transformation) and 3) Apply (Transformation.) All three interact. For instance, verification functions fit logically within Apply Transformation but must be able to feed back corrective prescriptions to Define Transformation which provides a superstructure for modules concerned with calibration and modelling. Therefore, both Define and Apply need access to Color Measurement modules, whether they make use of imaging or non-imaging instruments. "Network" is responsible for coordinating network protocols and polling remote nodes. Part of this function includes the identification of color measurement capabilities of a node. Another part is to insure that a user's mapping of software configuration onto his workflow is realizable. Loading the appropriate color measurement device drivers is as crucial as choosing and initializing the correct communications protocol and proofer device drivers. Therefore. Color Measurement coexists with modules for administering network protocols, building device models, building color transformations and implementing the transformations for the conversion of color images.

For the purposes of this discussion, assume that the application is stand alone. Today. Graphical User Interfaces can be prepared via automatic code generation based upon re-usable components in most of the windowing environments on the market. The depictions of menus and attributes of the User Interface in what follows are not meant to restrict the scope of the invention and are kept simple for clarity.

Figure 21A:
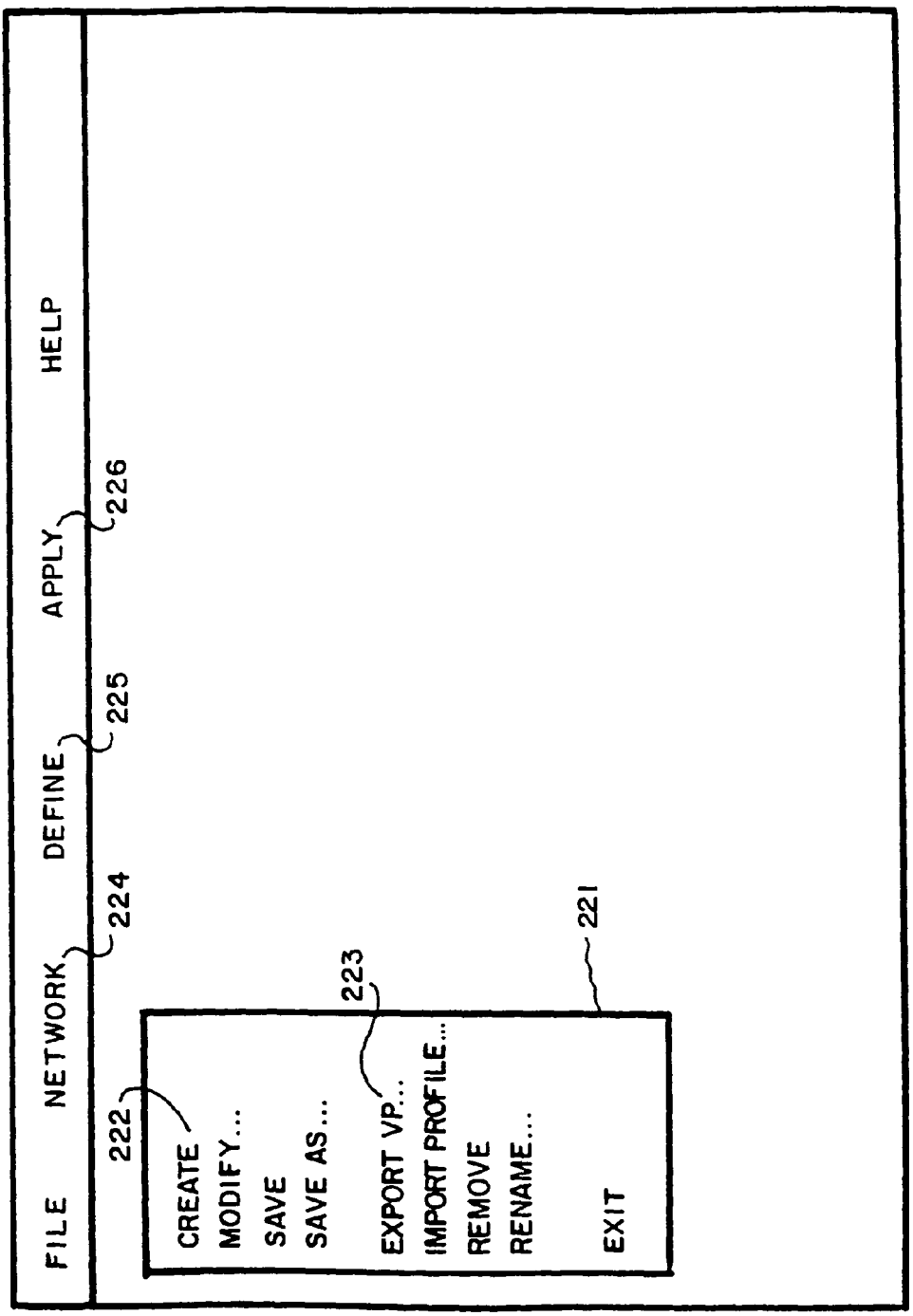
FIG. 21A is a menu of the Graphical User Interface (GUI) to the application software to enable configuration of the network of nodes, remote conferencing and proofing and oversight of the processes involved in calibrating devices in the systems of FIG. 3A.

Referring to FIG. 21A, a first level hierarchy screen is shown allowing a user to enable configuration of network 11 nodes, remote conferencing, and user oversight of processes in system 100. Upon invocation, the application introduces itself and offers a typical menu bar with five choices (command names). File. Network. Define, Apply and Help. Clicking File opens a pull-down menu whose selections are like those indicated by 221 in the FIG. Clicking on Create 222 initializes file creation machinery and opens the Network tableau (FIG. 21B) in a mode of readiness to design a virtual proofing network. Export VP (Virtual Proof) 223 offers the option of converting color transformational components of the Virtual Proof into standardized file formats such as International Color Consortium Profiles. Adobe Photoshop color conversion tables, PostScript Color Rendering Dictionaries. TIFF or TIFFIT. A possibility of importing standardized color transformation files is also provided. Other menu items under File are conventional.

The Network heading 224 opens a tableau concerned with membership in the virtual proofing network, the physical and logical connections among nodes and the equipment at the nodes and its capabilities. The Define heading 225 provides means of calibrating (characterizing) devices, enabling customized assemblies of procedures to be applied to appropriate target combinations of devices and color measurement instrumentation. The Apply heading 226 covers display of imagery rendered through the virtual proof and provides tools for verifying and reporting on the accuracy of color transformations, customizing those transformations, conferencing, comparing various versions of the proof and establishing contact with other applications performing like functions. The Main menu offers Help and each of the Network, Define and Apply menus offer Tutorial interaction.

Figure 1:
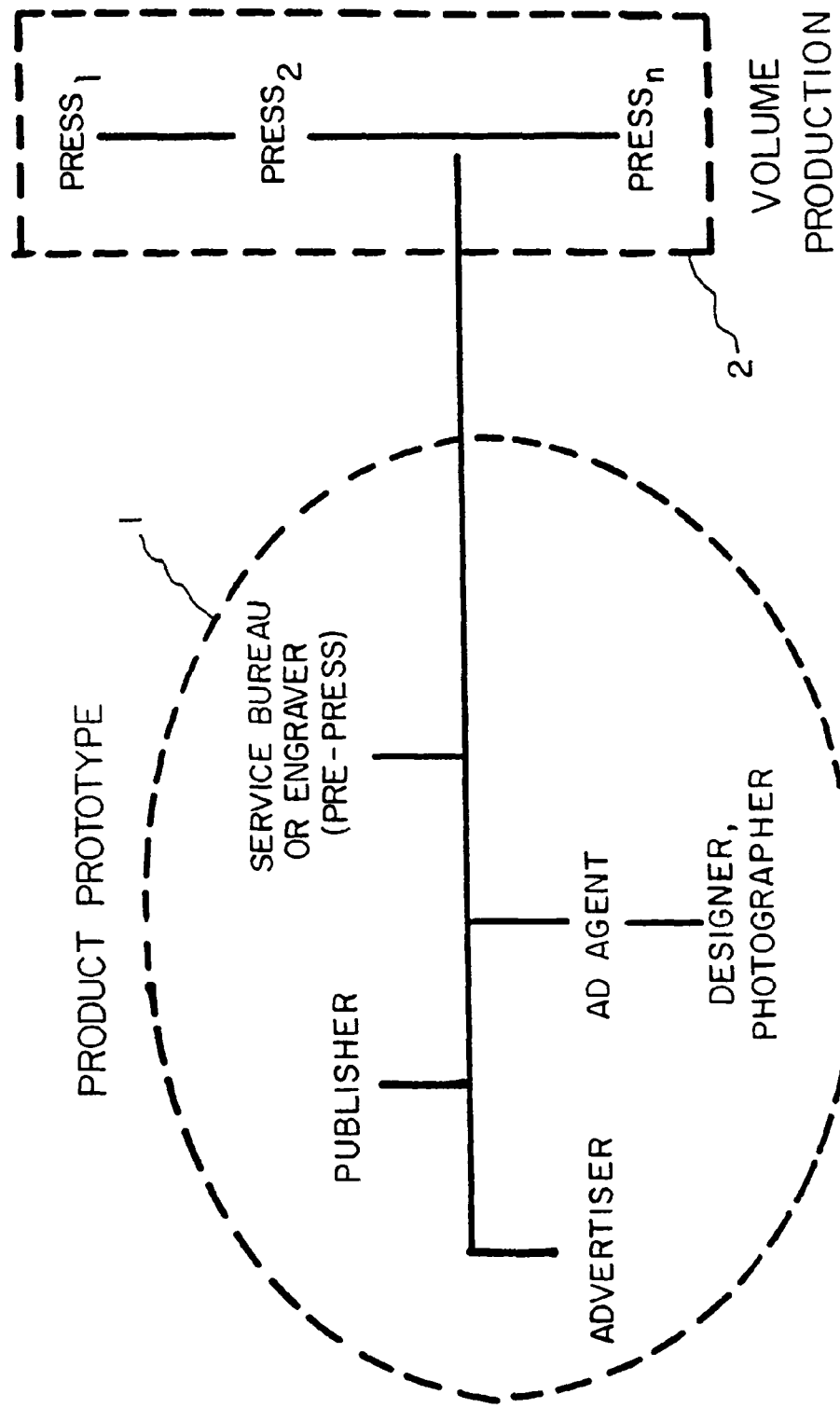
FIG. 1 is a diagram of the typical sites involved in preparing volume production of color products.
Figure 2:
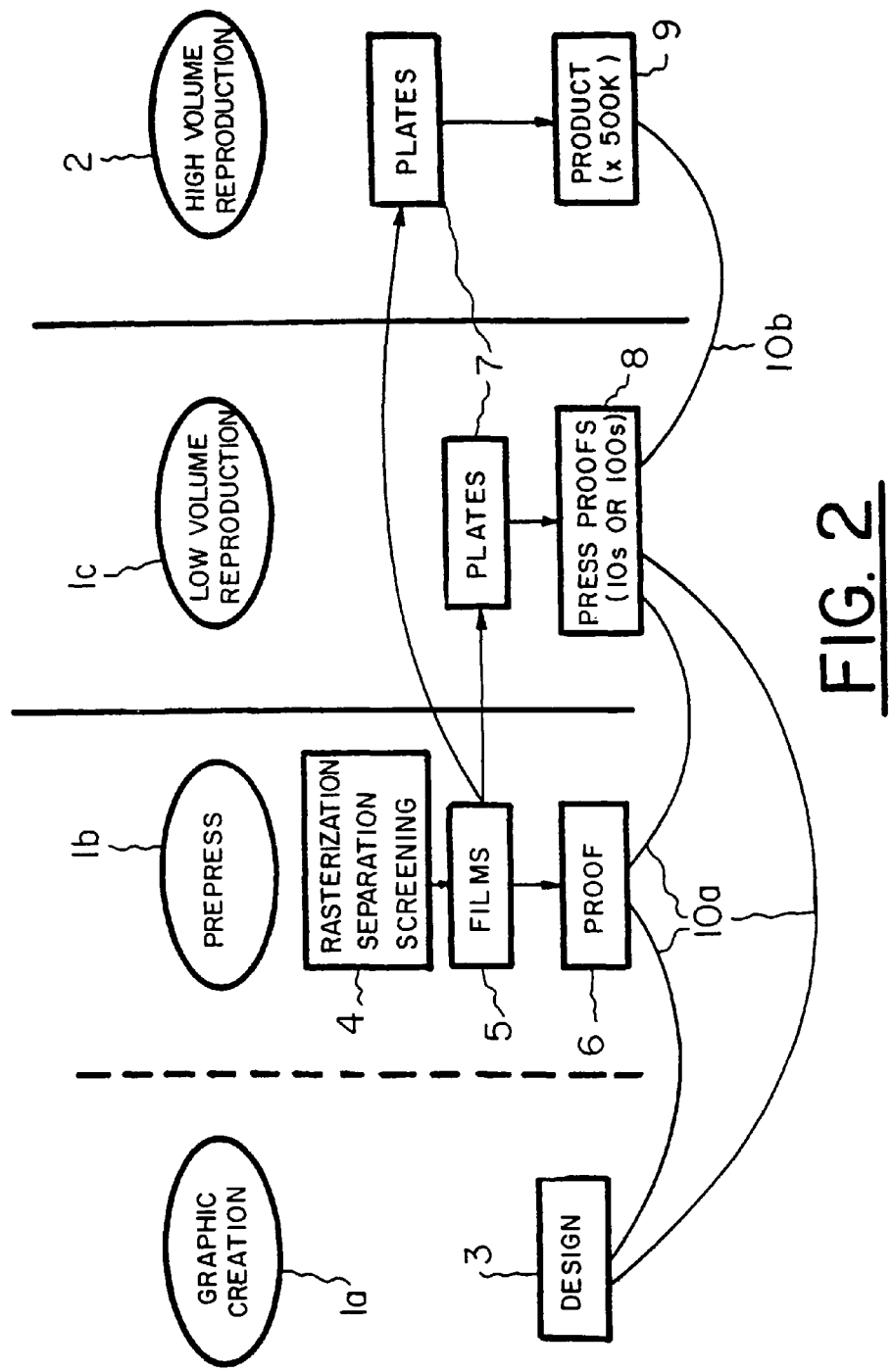
FIG. 2 is a diagram showing a conventional workflow for publication printing.
Figure 21B:
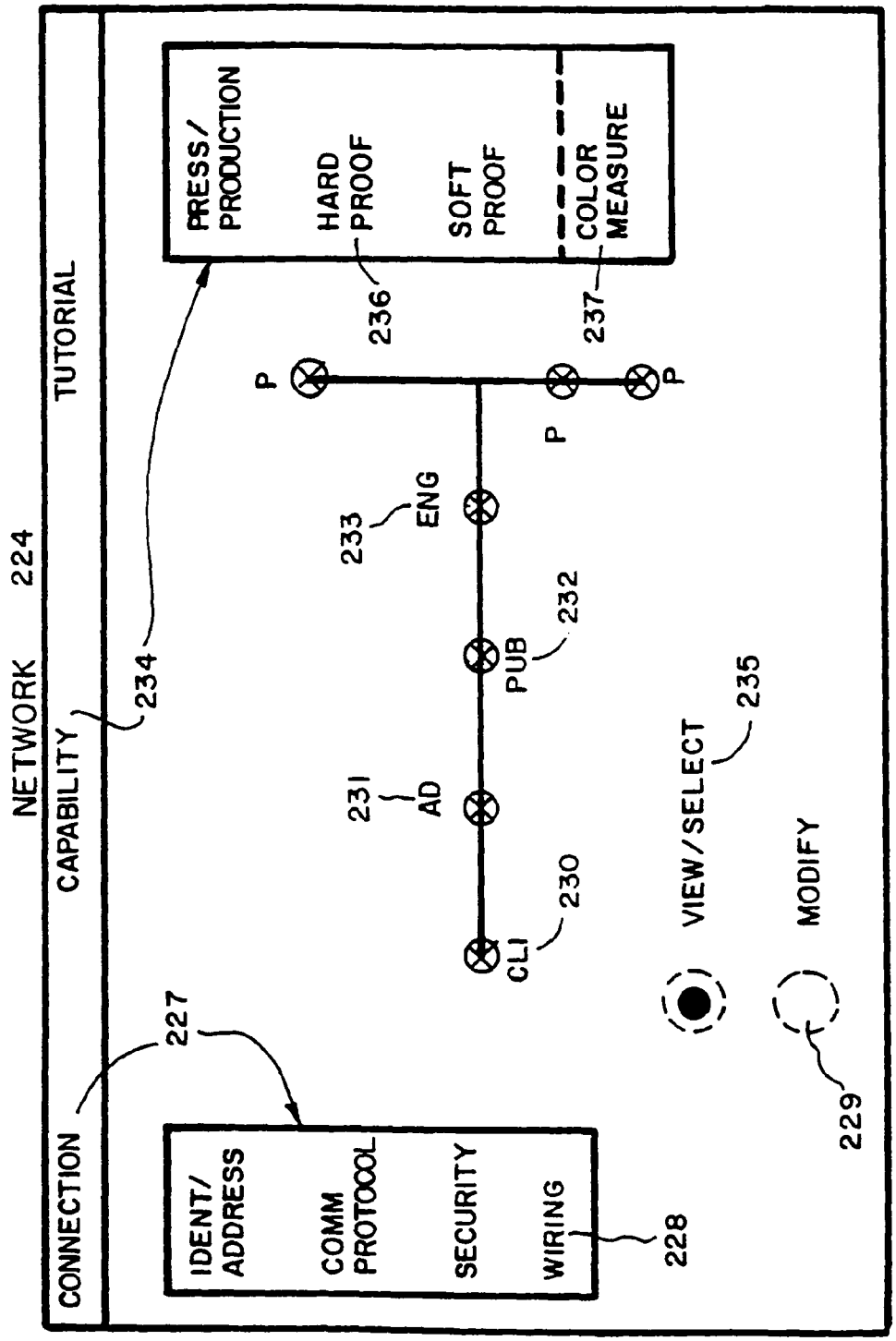
FIG. 21B is a menu at the second level of hierarchy in the GUI to provide access to tools for configuring the network connections and communications protocols.

Clicking on Network in the Main menu opens a tableau of FIG. 21B, which is concerned with Connections and Capabilities. Clicking Connection 227 reveals a sidebar concerned with tools and attributes of network 11 connections. For example, during creation (see FIG. 1) it is possible to pick up a wire by way of the "wiring" entry of the sidebar 228 and move it into the field as part of assembling a network model that can be written to a file and can direct proofing commerce. Double clicking on the wire reveals information about the connection or permits editing of the information when the "Modify" radio button 229 is activated. Error notices are generated when the software drivers required to implement the model are not available or when the hardware they require is not present. The present invention is not wedded to particular current (e.g. modem, ISDN, T1, satellite, SMDS) or anticipated (ATM) telecommunications technologies, nor to particular networking protocols. Nodes can be defined, given addresses, security, etc. and can be equipped with proofing devices in a manner similar to the design of connections. The summary of the network's connections and of nodal capabilities is shared through the Virtual Proofs tagged file format described earlier which is kept current at all sites.

In the center of FIG. 21B is an example network topology. It resembles the network of FIG. 1, where "cli" 230 refers to a possible client (e.g., advertiser) member, "ad" 231 an ad agency, "pub" 232 a publisher, "eng" 233 an engraver and the Ps are printers. The links between the nodes are created and modified through the wiring 228 functionality of "Connection" mentioned above. Clicking "Capability" reveals a sidebar 234 concerned with devices and their associated instrumentation for color calibration and verification. An example of the use of the menu is as follows: I am a user at an ad agency who wants to establish a remote proofing conference regarding a page of advertising with a publisher and printer. I bring up the relevant network using "Modify . . ." in FIG. 21A, push the radio button for view/select 235 in FIG. 21B, and click on the "pub" node 232. This creates a connection between the ad and pub nodes if one can be made and initiates a process of updating virtual proof files at either end of the link. Then I click on hard proof 236 and color measure 237. This utilizes the updated VP information to show me what hard copy proofer(s) are available and how they are calibrated and/or verified. Then I follow a similar sequence of actions with respect to a P node. The initiation of display and conferencing about color image data is done via the Apply menu of FIG. 21D.

Figure 21C:
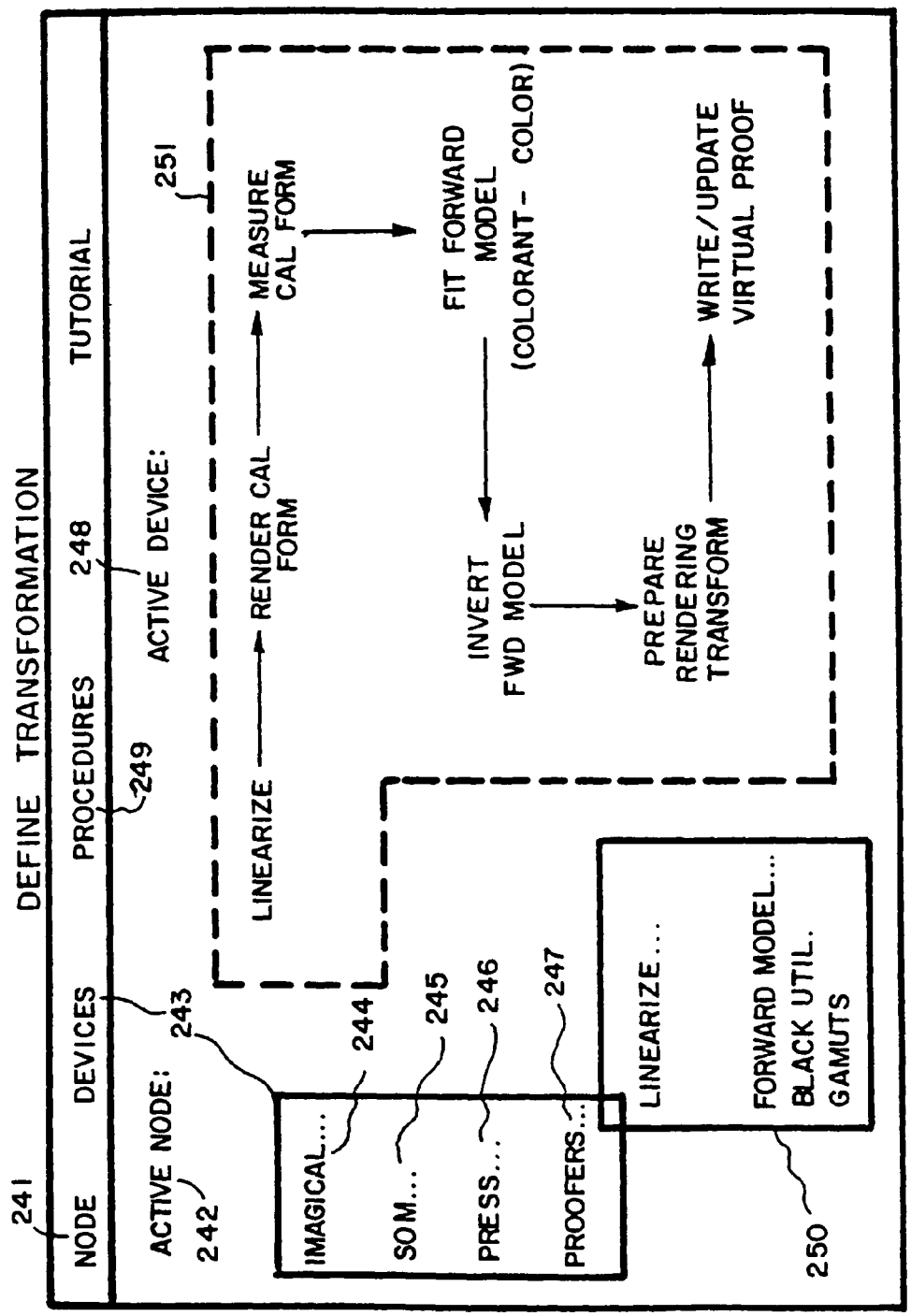
FIG. 21C is a menu at the second level of hierarchy in the GUI to enable a user to manipulate the process of making color transformations at a rendering device.

To pursue the example of the preceding paragraph, suppose that I find that the hard copy proofer at node "pub" has not been calibrated recently. A study of the information about the device in the updated Virtual Proof reveals whether re-calibration or verification procedures can be carried out without operator intervention at that site. From one site or the other, the Define (Transformation) menu of FIG. 21C provides access to the tools and procedures for calibrating while the Apply (Transformation) menu (FIG. 21D) supports verification. A node can be activated in the Network menu and then a device at the node singled out for calibration within Define.

Clicking on "Node" 241 in the bar atop the Define menu of FIG. 21C opens a pull down providing access to other nodes without requiring a return to the Network menu. Which node is active is indicated at the upper left of the menu 242. Clicking on "Devices" 243 opens a pull-down which lists classes of devices; clicking on a member of that list displays an inventory of devices of that class present at the active node. Selecting a device in this list is the first step in the process of calibration and causes the device to be identified as active 248 at the top of the menu. The classes of devices of particular interest in the invention are imaging colorimeters or imagicals 14 ("imagicals." 244) unitary colorimeters (SOMs 13, capable of measuring discrete tint samples, 245) presses 246 and proofers 247 of hard and soft copy varieties. Clicking on "Procedures" 249 reveals a pull down listing calibration modules 250 such as linearization, Forward Model Generation, etc.

Procedures appropriate to the device can be dragged and dropped into the open field at the center of the menu and linked by connecting arrows. The controlling application software monitors the selections, performs error-checking (with notification and invocation of tutorial material) and links together the modules needed to perform the task if possible. FIG. 21C shows a flowchart for complete calibration of a rendering device encircled by a dotted line 251. In the case of some proofing devices, such as Cathode Ray Tube displays and Dye Sublimation printers, it may be sufficient to perform complete calibration only infrequently. In particular, it is usually adequate to re-compensate for the gamma function of a monitor (a process which falls under "linearization") on a regular basis. Because phosphor chromaticities change very gradually, re-determination of the color mixing functions of the calibration need not be performed as frequently. Therefore, a user may activate the CRT device at his node and specify only linearization in preparation for a proofing conference. Alternatively, the present invention covers the equipment of monitors: with devices that can participate in continual verification and recalibration.

The "Apply" Transformation menu (FIG. 21D) provides access to the database of pages and images that are the subject of remote proofing through the "Page/Image" 256 selection in the menu bar. Clicking here displays a shared file structure. Although the (generally) bulky color image data file of interest need not be present in local storage 19 of FIG. 3A at all nodes where proofing is to occur, it is generally desirable to make a local copy so that rendering across the network is not necessary. However, one of the purposes of the Virtual Proof is to make multiple transfers of the bulky data unnecessary. The "Node" 257 and "Devices" 258 elements of the menu bar have effects that are entirely analogous to those in the "Define" menu of FIG. 21C. More than one device at a node can be made active in support of a mode in which interactive annotation and conferencing via the medium of a soft proof on a video display is employed to negotiate changes in a hardcopy, remote proof that is taken to be representative of the ultimate client device.

Figure 21D:
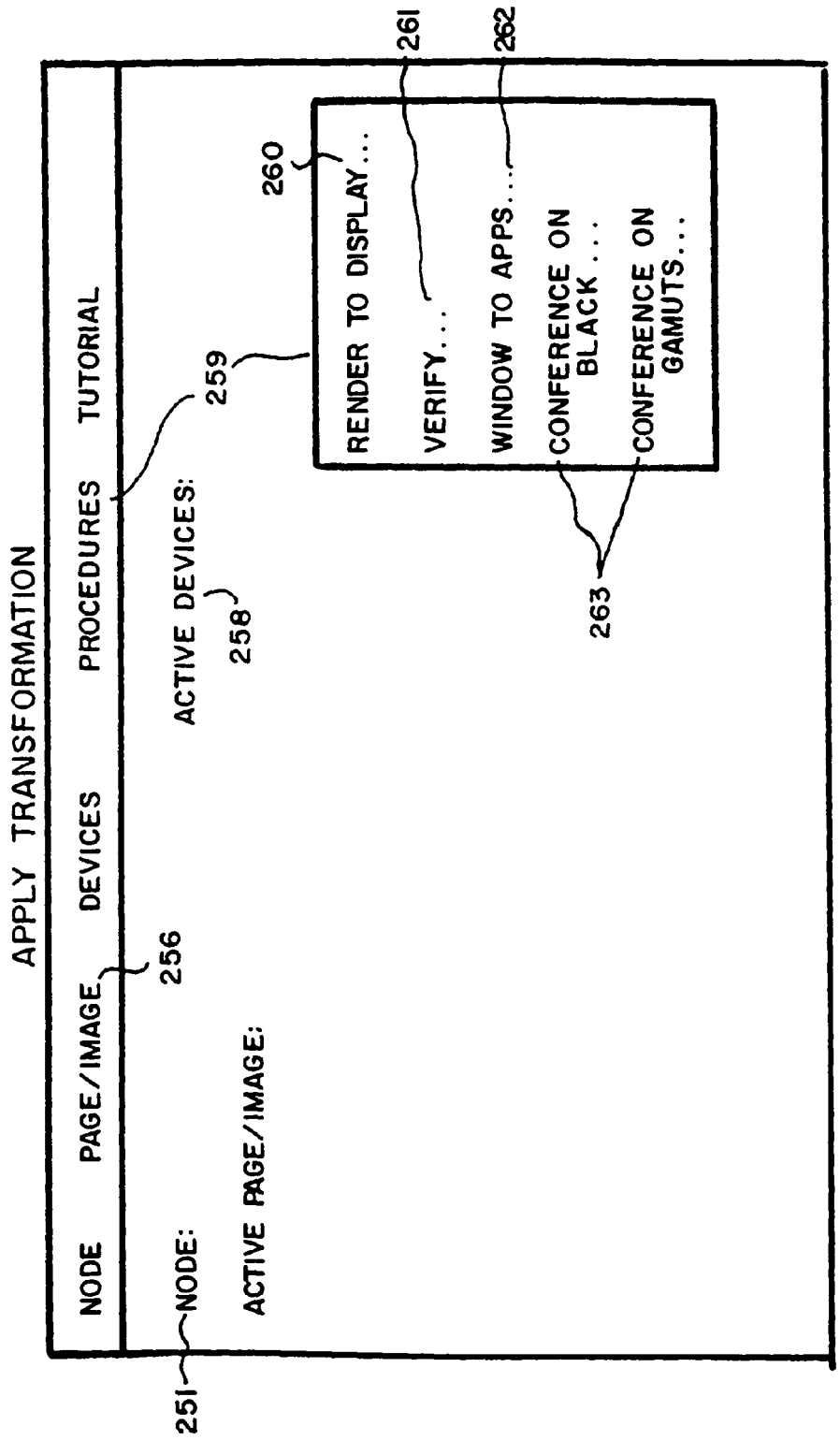
FIG. 21D is a menu at the second level of hierarchy in the GUI to enable a user to oversee the process of using color transformations at a rendering device.
Figure 2I:
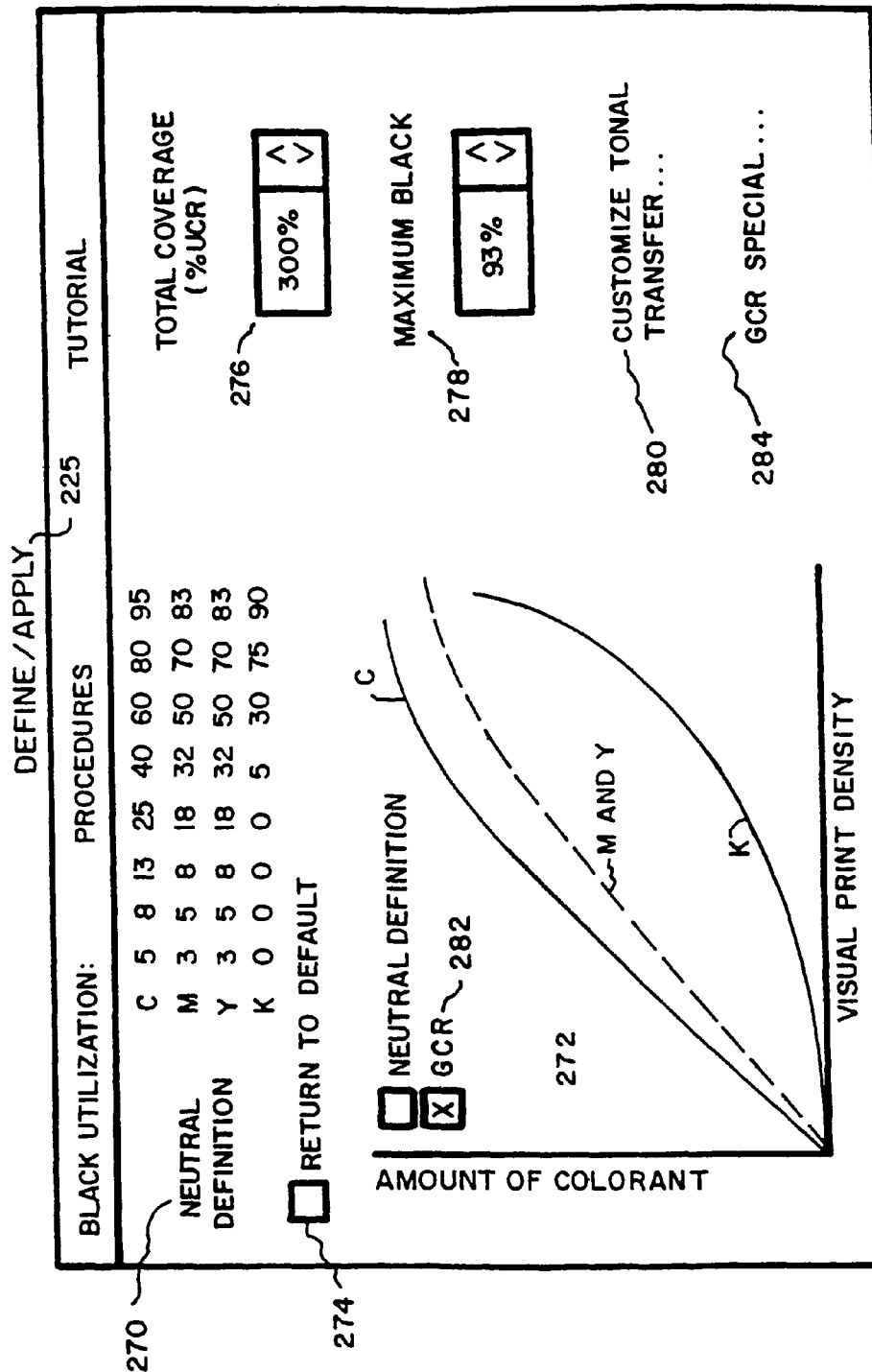
Figure 2I:
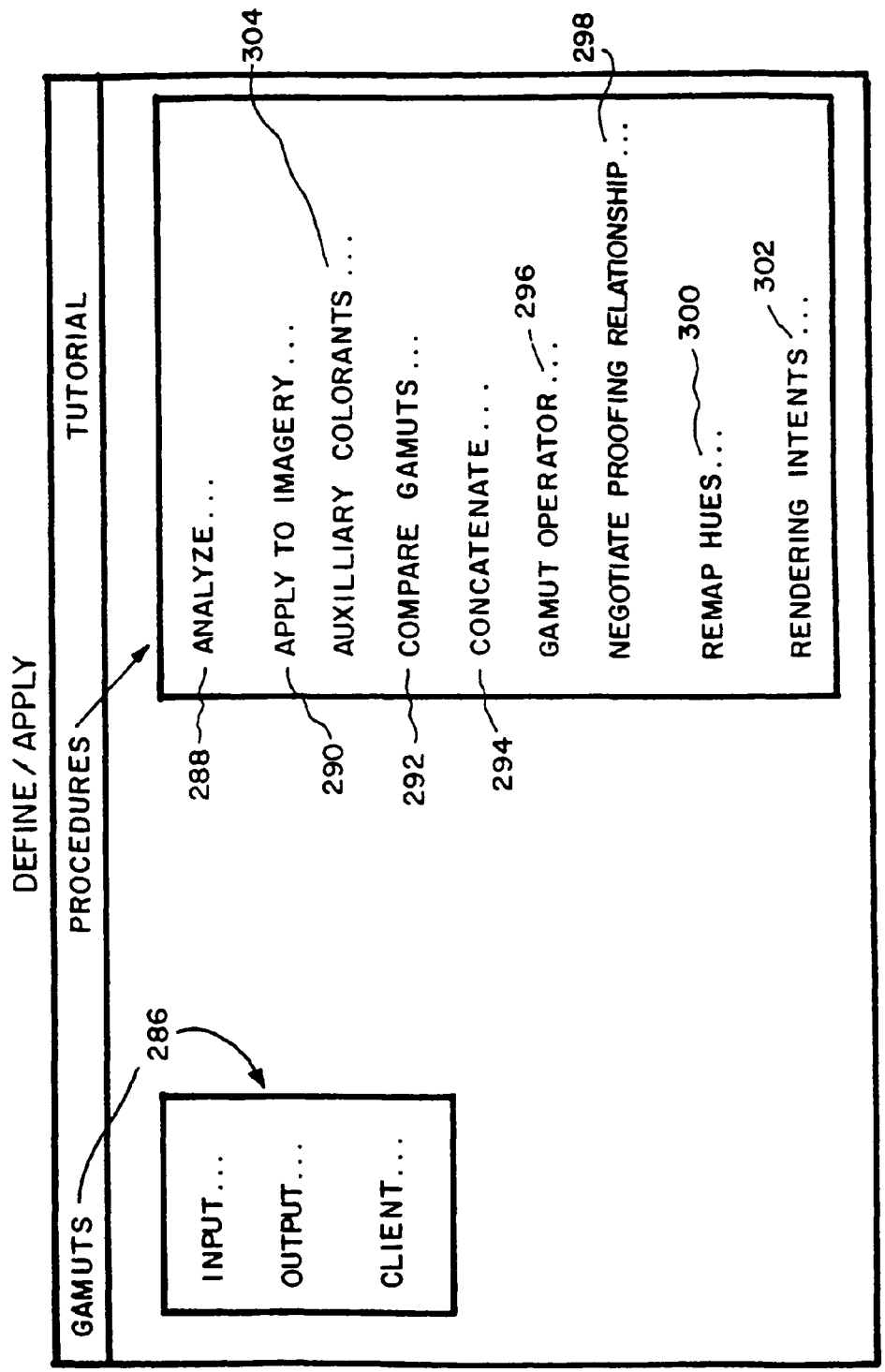

Clicking on "Procedures" 259 in the Apply menu bar of FIG. 21D reveals a pull down that includes functions such as "Render to display . . . " 260. "Verify . . . " 261 and "Window . . . " 262 to external applications. Rendering supports display, either within the Apply window or on a separate, dedicated video display, of imagery a) as the designer imagined it, to the extent that the proofer is capable of showing it, b) as a client device, such as a press, can reproduce it and c) as another proofer is capable of representing the press, including indications of gamut mismatches superimposed on the imagery and location of errors identified by the verification process. To further the example, the virtual proof may mediate a rendering of an image as it appears or will appear on press. If the node includes an imaging colorimeter, then an image of the proof can be captured and analyzed in order to provide verification of how well the proofer represents the client. Without verification, digital proofing and remote proofing for color approval are not really useful.

The Apply menu provides a Window 262 through which to "plug-in" to or to "Xtend" applications such as Adobe Photoshop or Quark Xpress. It also provides the platform for incorporating remote, interactive annotation of the sort provided by Group Logic's imagexpo, reviewed earlier. Imagexpo focuses on marking up images with a virtual grease pencil, a concept that is extended in the present invention to remote conferencing concerning gamut scaling, black utilization and other aspects of the definition of rendering transforms. Aspects of rendering such as black utilization 263 (or gamut operations) can be harmonized across the production network by sharing/exchanging black designs through the virtual proof file structure and mechanism.

Menus supporting interactive design and selection of user preference data are shown in FIGS. 21E and 21F. A User-Interface to support interactive determination of black utilization is depicted in FIG. 21E. It may be invoked from either Define or Apply menus. At the top right 270 is shown a panel of colorant specifications which are to be considered neutral in color. Users may redefine entries in the panel by clicking and keying or by modifying curves in the graph below 272 provided the graph is toggled to neutral definition rather than GCR. In the neutral definition mode the user may move points on any of the colorant functions: the points are splined together and changes in the graph are reciprocal with changes in the panel. A "return to default" switch 274 provides an easy way to get out of trouble. At the upper right 276, 278, variable readout switches enable definition of maximum colorant coverage and maximum black. At the bottom right 280, "Customize Tonal Transfer" opens the door to user modification of one or more of the 1-dimensional output postconditioning LUTs which are part of the color to colorant transformation. The application warns sternly that the specification of transfer curves which did not prevail during calibration will void the calibration; however, there are situations in which knowledgeable users can make effective use of the flexibility afforded by this function.

When the Graph is switched 282 to GCR mode, the user can control only the shape of the neutral colorant curve;

because GCR is colorimetric, the non-neutral curves respond compensatorily to changes in black. The relationship of the curve specified in the graph to the amount of black chosen for a solution at a particular entry in the separation table is as follows: The function shown in the graph represents amounts of the colorants which produce given neutral densities. At each density, there is a range of possible black solutions from minimum to maximum. At the minimum, black is zero or one or more of the non-neutral colorants is maxed out; at the maximum, black is at its limit and/or one or more non-neutral colorants are at their minimum. In this invention, the % GCR is the percentage of the difference between min and max black chosen for a solution. By industry convention, a constant % GCR is seldom desired for all Lightness (density) levels. Therefore, the black curve in the graph defines the % GCR desired as a function of density. Although it is conceivable to make GCR a function of hue angle and Chroma as well as of Lightness, this is usually an unwarranted complexity with one exception: It is useful to graduate GCR with Chroma when preparing transformations for more-than-four colorants as discussed earlier. This need is addressed through the "GCR special . . ." submenu 284 offered at the bottom right of FIG. 21E.

FIG. 21F depicts a GUI screen to gamut operations. Clicking on "Gamuts" reveals a pull-down 286 which provides access to lists of input, output and client gamuts: the latter two are both output gamuts, but a client gamut is known to the system as one that is to be represented on another device. It is possible to drag and drop members from the different types into the field of the menu and to link them with various procedures, as was the case in FIG. 21C. Procedures applicable to the gamuts include: 1) Analyze 288 which displays information on how a particular conditioning transformation was put together (e.g., was it a concatenation of gamut scaling and color aliasing operations?—which ones?) and on gamut compression records, a constituent of the VP which stores key variables of a gamut scaling, such as minimum Lightness, cushion value, functional form, etc. 2) Apply to Imagery 290 enables display of imagery mediated by transformations configured in this or related menus on some device. 3) Compare Gamuts 292 enables visualization, in several forms, of the relationship between the gamuts of two or more devices—this functionality is elaborated in a following paragraph. 4) Concatenate 294 does not apply solely to gamut operations: it links nested or sequential transformations into implicit, net transformations. 5) Gamut Operator 296 provides a graphical display of an operator; this is a different representation of the information available from Analyze 288. 6) Negotiate Proofing Relationship 298 works closely with Compare Gamuts 292; it enables users to make decisions based on information provided by Compare, such as whether to use the Least Common Gamut as the aim point for a network of volume production devices. 7) Remap Hues 300 provides the separable hue adjustment functionality described earlier. 8) Rendering intents 302 is a mechanism for providing users with generic gamut scaling options for accomplishing things like obtaining the most saturated rendering on paper of color originally created in a business graphics application on a video display. Compare Gamuts 292 allows a user to invoke and control the use of gamut filters, which were described earlier in connection with FIG. 17.

System 100 supports the coordination of color control in multisite production in several forms. Because the virtual proof encompasses records of the states of calibration of network devices independent of the color data, application software can define a criterion for reproduction across the network in one of several ways. Based on the states and capabilities of network devices, a criterion may be selected which all devices can satisfy, such as a least common gamut (LCG). LCG defines the aim point for production and the control system strives to minimize the color error with respect to it. Alternatively, users may select one device as the criterion and all others are driven by the controls to match it as closely as possible. Optionally, users may choose to disqualify one or more rendering devices on the network because it/they cannot match the criterion closely enough or due to failures of verification.

Figure 22:
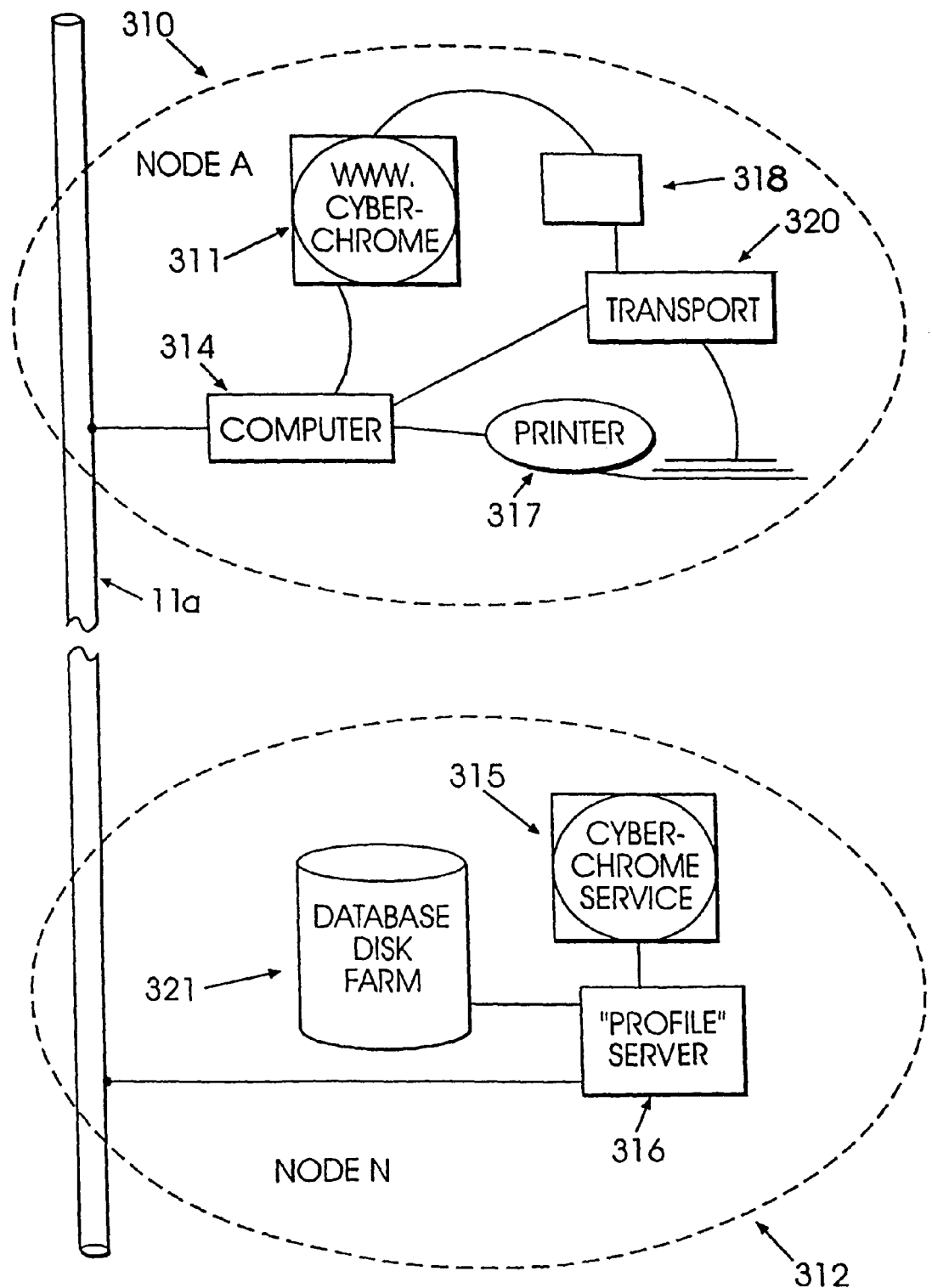
FIG. 22 is a block diagram of an example of the system of FIG. 3A.

Referring to FIG. 22, an example of system 100 (FIG. 3A) is shown having two nodes of the network. Node N may possess high performance computing processor(s) and, optionally, extensive electronic storage facilities. Node N may also have output devices of various types along with color measurement instrumentation for the calibration of those devices and it may be connected to more than one networks for Virtual Proofing. In addition to participating in one or more networks for Virtual Proofing. Node N may assist other nodes by computing transformation functions. It may also function as a diagnostic and service center for the networks it supports.

Node A 310 includes components similar to nodes 102 or 104 (FIG. 3A) and is linked to other nodes by network link 11a. The communication between Node A and Node N is enabled via the Internet or World Wide Web, for example, to a web site service "cyberchrome" 315 at Node N 312. This communication is illustrated by the screen of the video display device 311 being labeled "www.cyberchome". Node A 310 has a computer 314 such as a personal computer or workstation in accordance with application software providing Virtual Proofing as described earlier. Node A 310 need not have a computer other than the processors embedded in the proofing devices or color measurement instrumentation. In this case, the Virtual Proof for Node A are coordinated by another computer system, such as the computer server 316 at Node N (called hereinafter the profile server), as described earlier in connection with FIG. 3A.

Printer 317 is shown for Node A, but not for Node N. A color measurement instrument (CMI) 318 is provided as a module for calibration of the printer. CMI 318 includes a sensor, lamp, reference and control unit (which may itself be of modular design) and a transport mechanism 320 for transporting hard copy of a calibration or verification sheet rendered by printer 317 so that the sheet may be read by the CMI with a minimum of user effort or involvement. Reflection or transmission measurements are facilitated by the transport mechanism 320 for such a sheet, bearing a matrix or array of color samples, which is actuated by click of computer mouse or, preferably, by insertion of the sheet in the transport mechanism. The transport mechanism may be integrated with the printer 317 in which the optical pickup component of the sensor is mounted to move in tandem with the marking head of the device and transport of the copy may be performed by the mechanism of the printer, such as when the printer is an ink jet printer. In either case, the optical pickup link their devices to a control unit for the CMI by fiber optic or by electrical wire link.

The profile server 316 at Node N 312 may consist of a multiprocessor or locally networked array of processors or high performance workstation processor whose performance may be enhanced by special-purpose hardware. The exact architecture (such as RISC or CISC, MIMD or SIMD) is not critical, but needs to provide the capacity to compute quickly color transformation mappings, gamut operations, etc., as described earlier. Any of the processors in the network may have this capability or none may. However, the more responsive the network is in development and modification of Virtual Proof constituents, the more useful it can be. Disk storage or memory 321 (similar to storage 19 in FIG. 3A) represents centralized storage of current and historical constituents, which may be shared by one or more nodes on the network. The profile server further provides a database which stores calibration data for rendering devices of the network, such as color profiles (inter-device color translation files), or data needed to generate such profiles. The calibration data produced for each rendering device in the network was described earlier.

Referring to FIGS. 23-32, the calibration of video color monitors or displays shown in FIGS. 3A and 3B will be further described. Video displays play an increasingly important role in color communication. They are used to simulate three-dimensional rendering in synthetic image creation, as such they function as linear. 3-channel, input devices, and are also used ubiquitously in interactive image editing. Further, video displays can be used as soft-proofing devices, thereby providing a video proofer. In the latter application, it is desired to portray an image on a video proofer as it will be rendered on a hard copy device. Although it is not usually possible to match the spatial resolution of hard copy with a soft proof, it is possible to forecast color reproduction.

Although the following describes color calibration of cathode ray tube (CRT) displays, it can also be applied to any video display technology, such as Digital Light Processing (based on Texas Instruments Digital Micromirror Device), flat plasma panels. Liquid Crystal Display panels, etc. The foregoing technologies may be used in front or rear projection applications. An embodiment in which a front projection device is used to project high resolution imagery onto production paper stock was described earlier.

Video displays are highly complicated image reproduction devices, featuring ample adjacency effects. (interactions among neighboring pixels, where a neighbor may be spatially removed at some distance.) However, satisfactory results may be obtained by ignoring complex spatial effects and modeling three, separable variables simply: 1) color mixture. 2) gamma or the intensity-voltage relationship and 3) the dependence of luminous output at a pixel on where it is on the screen, independent of its interactions with the level of activity of other pixels.

All video displays behave as light sources and those suited to accurate color reproduction conform to linear rules of color mixture. In other words, they observe, to a reasonable approximation, the principle of superposition. This means that the light measured when all three channels are driven to specified levels equals the sum of the light measured when each is driven separately to the specified level. Also, the spectral emission curve (indicating light output as a function of the wavelength of the light) changes by a constant scale factor as the driving voltage changes.

The last point is illustrated for green phosphor emission in FIG. 23. The emission spectrum is a property of the phosphor and is normally invariant during the useful life of the CRT. The graph shows the activity in the green channel, as a function of wavelength, when driven full scale at digital level 255, denoted by numeral 322, compared with 15 times the activity in response to digital level 64, denoted by numeral 323. The fact that the two curves superimpose means that they differ by a factor which does not depend on wavelength—a linear property important for color mixture. However, the scale factors are not linear with digital drive levels, a manifestation of non-linear gamma in the device. The derivation of color mixing transformation matrices capable of translating RGB device codes for a particular monitor into XYZ TriStimulus Values or vice versa is described, for example, in Holub, Kearsley and Pearson, "Color Systems Calibration for Graphic Arts. II: Output Devices," J. Imag. Technol., Vol. 14, pp. 53-60, April 1988, and in R. Berns et al., "CRT Colorimetry, Part I Theory and Practices, Part II Metrology." Color Research and Application, Vol. 18, Part 1 pp. 299-314 and Part II pp. 315-325, October 1993.

It has been observed that the spectral emission functions of CRT phosphors do not change over significant periods of time. This means that for a large class of displays, the data needed for color mixture modeling can be measured once, preferably at the factory, and relied on for most of the useful life of the monitor. Phosphor spectra and/or chromaticities measured at the factory may be stored in Read Only Memory (ROM) in the display, they may be written on a disk and shipped with the monitor or, preferably, they may be stored in association with the monitor's serial number in a "Cyberchrome" database at Node N 312 of FIG. 22. It is preferable if spectral data are captured and stored. In the database, they can be made accessible to networks for Virtual Proofing via restricted, keyed access, using typical encryption and security schemes for the Internet.

The balance of Red. Green and Blue channels does vary continually, often requiring adjustment at least daily. RGB balance determines the white point. Key variables subject to change in the R, G and B channels are the bias and gain. The bias, or offset, determines the activity in the channel at very low levels of input from the host computer system, while the gain determines the rate of increase in activity as digital drive increases and the maximum output. Bias and gain controls usually interact within a color channel, but should not interact between channels if the superposition condition is to be satisfied. The gamma of a channel is the slope of the relationship giving log light intensity, usually in units of CIE Luminance, or Y, and log digital drive supplied by the host computer system. In order to maintain a given white balance and overall stability of tone and color reproduction, it is necessary to regulate the bias and gain in the three channels. Consistency of gamma is the main determinant of tone reproduction, while white point stability depends on the balance of activity in the three channels.

Ambient illumination refers to light that reflects off the faceplate (or screen) of the display and whose sources are in the surrounding environment. Light so reflected adds to light emitted by the display. A viewer may not be able to distinguish the sources. At low to moderate levels, ambient illumination affects mostly the dark point of the display causing a loss of perceptible shadow detail and, possibly, a change in shadow colors. In effect, gamma (and tone reproduction) are modified, along with gray balance in the shadows. Generally, it is preferable to detect and alert to the presence of ambient contamination so that users can control it than to incorporate ambient influences into the calibration.

The foregoing several paragraphs are meant to set the stage for discussion of monitor calibration in the color imaging system of the present invention.

It is often very difficult to build a good colorimeter, as discussed in the article by R. Holub, "Colorimetry for the Masses?" Pre magazine. May/June. 1995, for video displays. Accurate, repeatable ones are expensive; for example, one marketed by Graseby Optronics sells for around $6000, currently, and a fine instrument by LMT costs considerably more. FIG. 23A shows a comparison between measurement of spectral emission of a red phosphor of EBU type by a PhotoResearch PR700 Spectroradiometer 324 and a Colortron II 325. The plots make clear that an instrument capable of resolving 2 nanometer increments can resolve the complex peaks in the phosphor's spectrum while Colortron cannot. Colortron is a low-resolution, serial spectro as discussed earlier cited article "Colorimetry for the Masses?". Calculations of TriStimulus Values and chromaticities based on the two spectra reveal significant errors in the estimation of red chromaticity with Colortron II.

The foregoing analysis suggests that, for phosphor-based displays, at least, continual colorimetry is not required to maintain good calibration. Thus, maintenance of gamma and white balance and monitoring of ambient influences is all that should be required for a phosphor-based display. Such maintenance is described later is connection with FIG. 32.

Figure 24:
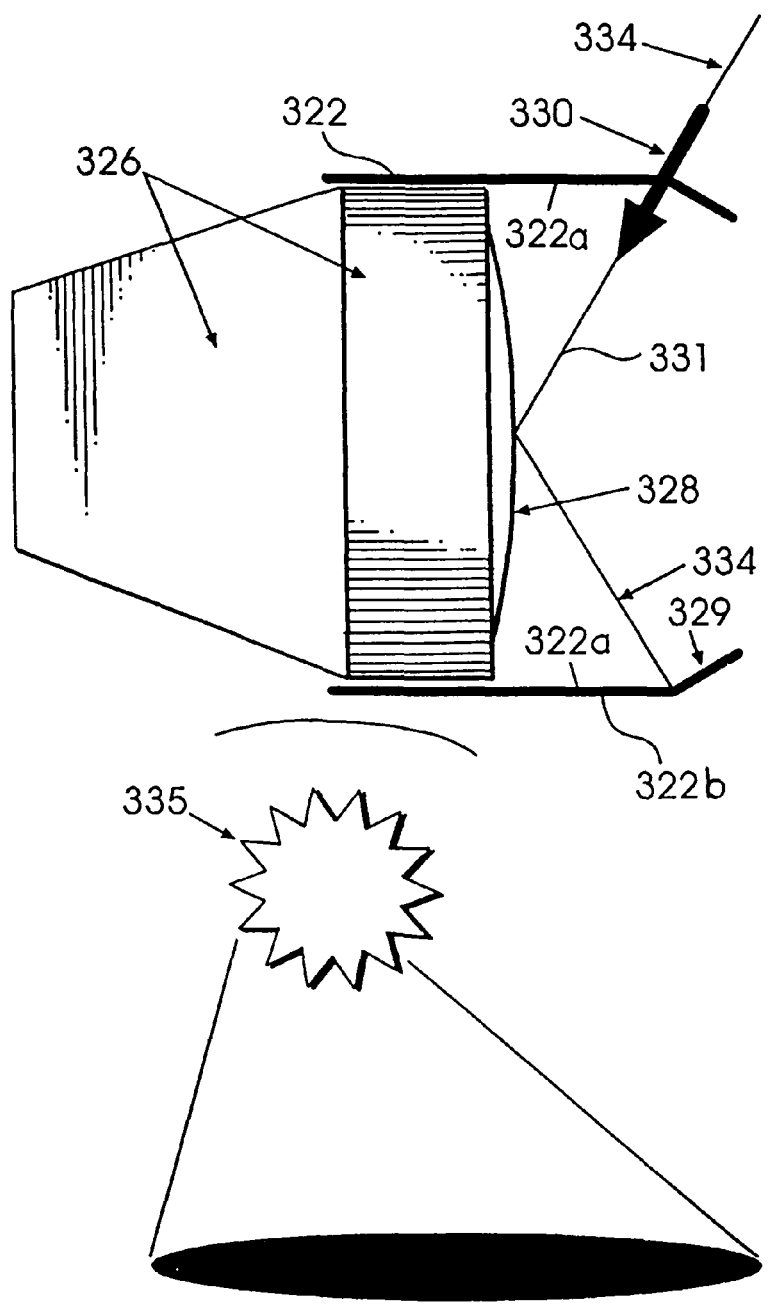
FIG. 24 is a block diagram of the configuration of a color measuring instrument for a video screen display which is similar to FIG. 3A.

FIG. 24 shows a configuration of color display 326 (i.e., CRT), cowel and color measurement instrument, as generally shown in FIG. 3B, that enables very accurate, inexpensive and automatic maintenance of CRT display calibration. Additional features of this configuration will become apparent from the following discussion of FIGS. 24, 24A, 24B, 24C and 24D.

The cowel 322 is circumferential and helps to shield the faceplate 328 from stray light coming from any direction, including the desktop on which the display 326 may be located. Cowel 322 is black-coated on inner faces 322a to absorb light. The cowel 322 forms a light trap 329 for the embedded sensor 330 coupled to the cowel. A small lamp 335 is located beneath the lower flange 322b of the cowel. Lamp 335 illuminates the desktop without influencing the display significantly in circumstances when overall room illumination is kept low for good viewing.

A sensor 330, often referred to herein as an electro-optical pickup, is lodged in the cowel. It views approximate screen center, denoted by line 331. (however other areas of the screen may be viewed) collecting and focussing light onto the sensor. The line of sight 334 reflects off the screen 328 and into the light trap 329 formed by the lower flange of the cowel, so that specularly reflected light will not enter the sensor. It permits unattended calibration, possibly during screen-saver cycles or at other times when the operating system of the computer at a node is not scheduling activities which would compete with calibration. Because the sensor 330 is perched in the cowel 332, it does not require user involvement to be affixed to the screen, it leaves no saliva or other residue on the faceplate, it does not contribute to desktop clutter and it is well positioned to monitor ambient illumination influences.

Figure 24B:
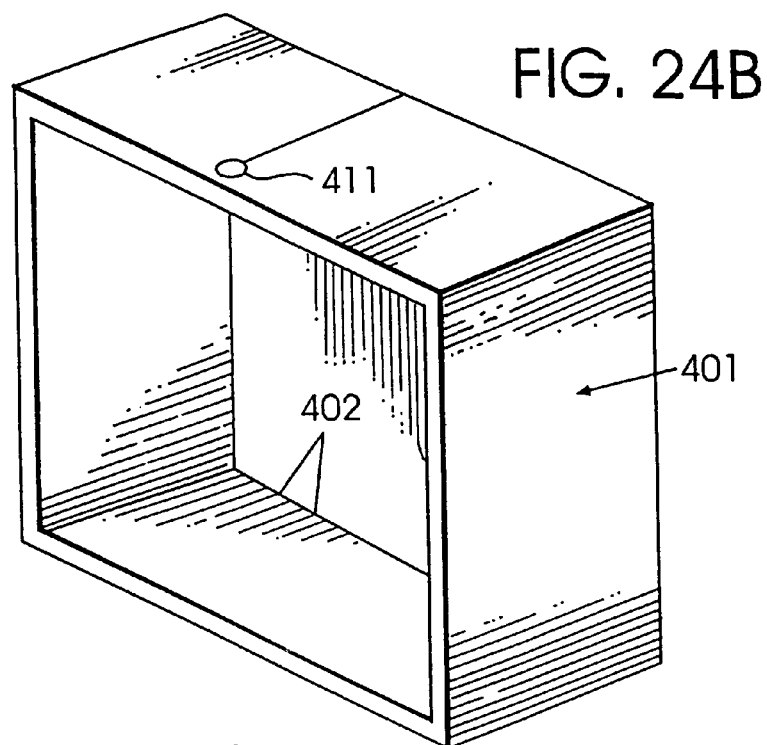
FIGS. 24B, 24C and 24D are perspective view of the cowel, arm member, and one of the brackets, respectively, of FIG. 24A.
Figure 24C:
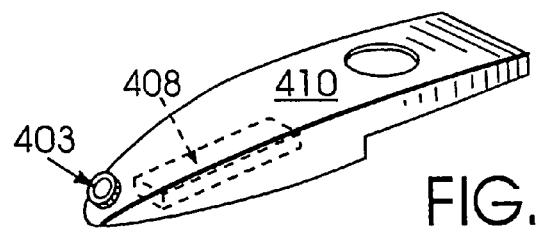
Figure 24D:
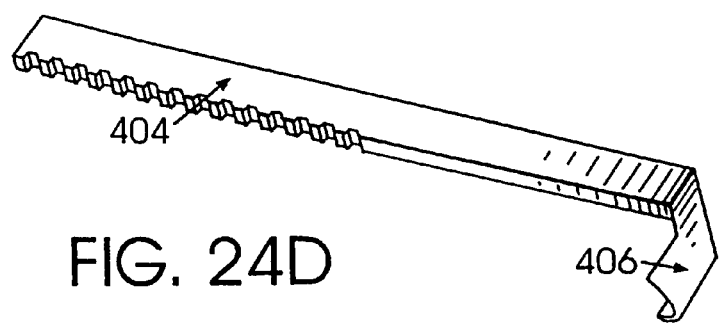

FIG. 24A shows an example of the assembly of cowel and sensor for a color monitor, wherein the circumferential cowel 401, arm member 410, and one of the brackets 404 of FIG. 24A are separately shown in FIGS. 24B, 24C, and 24D, respectively. To satisfy the goal of adapting the cowel to monitors of different size and make, the circumferential cowel 401 is a separable part which can be sized apropos of 17, 20, 21 or 24 inch or other size monitors. It can be made of any material, but preferably is of light weight plastic. The rear edge 402 of the cowel 401 rests against that part of the plastic monitor cover which frames the faceplate of a typical monitor. This has two advantages: First, it provides relief to the mechanism 412 which suspends and supports the circumferential flange 401a of the cowel 401 because a significant component of the force of support is into the front of the monitor chassis. Second, the upper flange 401b of the cowel 401 will support the electro-optical pickup head at socket 403 at a correct and predictable angle of view of the screen.

The mechanism 412 for supporting circumferential cowel 401 on the monitor includes a rack and pinion adjustment mechanism having an extending arm member 410 with a knob and gear 405 to allow adjustment of two brackets 404 having teeth which engage opposite sides of the gear 405. The brackets 404 have ends 406 which attach to the top right and left corners of the monitor's chassis. In other words, adjustment of the knob causes two foam feet at either end 406 of the brackets to move in and out so as to control their pressure against the sides of the chassis. In other words, the sliding bracket rests atop the monitor's chassis and is held in place by an adjustable press fit to the sides of the chassis. It, in turn, provides additional support to the circumferential flange 401a. Arm member 410 connects the brackets 404 to the circumferential flange 401, such as by screws coupling arm member 410 and upper flange 401(b) together. Alternatively, the knob and gear 405 could be replaced by a friction-fitted tube sliding within a sleeve. Cables 407 represents wires being led from the electro-optic components in socket 403 back to an interface such as Universal Serial Bus, of the computer 314 coupled to the monitor 311 (FIG. 22). However, it could also represent an alternate means of attachment, if it were made adjustable front to back of the monitor's chassis. The arm member 410 rests partially on the circumferential flange 401 at upper flange 401(b) and provides a housing for the electronics (circuitry) 408 associated with the electro-optic unit which plugs in at socket 403.

The depth, denoted by numeral 409 of the circumferential flange 401a is the distance from its outermost edge along a perpendicular to the point at which it rests against the monitor's chassis. Due to contouring of the chassis or the cowel (in the interests of a good fit to the chassis or of aesthetics) the depth may vary around the circumference. We have chosen, for example, a depth of 8 inches, on average, to effect a trade off between two factors: the degree of shielding of the viewing area of the screen from environmental stray light (ambient), and the desirability of enabling more than one user an unimpeded view of the screen at one time. At 8 inches, it should be possible for 2 or 3 people seated in front to see the full screen and for 2 or 3 people standing behind them also to see. However, the particulars cited here are not meant to limit the generality of the invention.

Many users like to conduct soft proofing under circumstances in which the hard copy proof may be available for comparison to the soft proof visualized on the monitor. Under said circumstances, it is important to control the viewing conditions of the hard copy. A viewing hood such as the SoftView™ made by Graphic Technologies, Inc. is often used for this purpose. However, it is also important to insure that the viewing hood doesn't contribute to stray light and that it is positioned to facilitate soft- and hard-proof comparisons.

Figure 25:
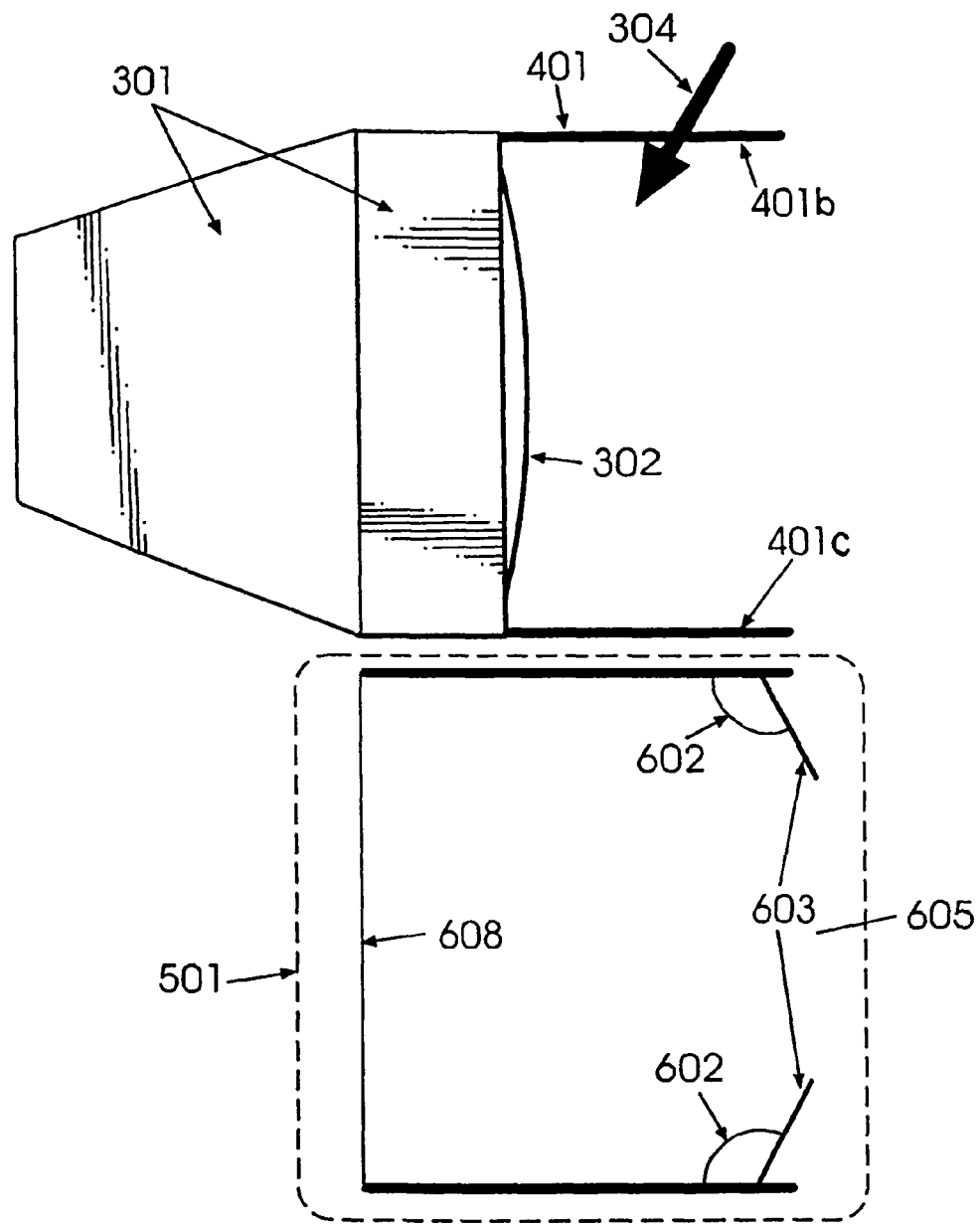
FIG. 25 is a block diagram of the configuration of a color measuring instrument for a video screen display of FIG. 24 which includes a viewing box.

Accordingly, the viewing box (or reflection viewer or hood) 501 shown in FIG. 25 may optionally be provided at Node A 310 (FIG. 22) which is integrated with the cowel 401. FIG. 25 shows an arrangement in which the video display is raised up on a pedestal with viewing box positioned below, so that the top side of the box is contiguous with the bottom flange 401c of the cowel. One side of the box has an opening 605 opposite the back wall 608 of the box upon which media is locatable. Other arrangements are possible, for example, some workspace arrangements may call for situating viewing hood and monitor side-by-side. i.e. integrated to the right or left side of the cowel, and oriented at an angle so as to optimize viewing at relatively short range.

Figure 26:
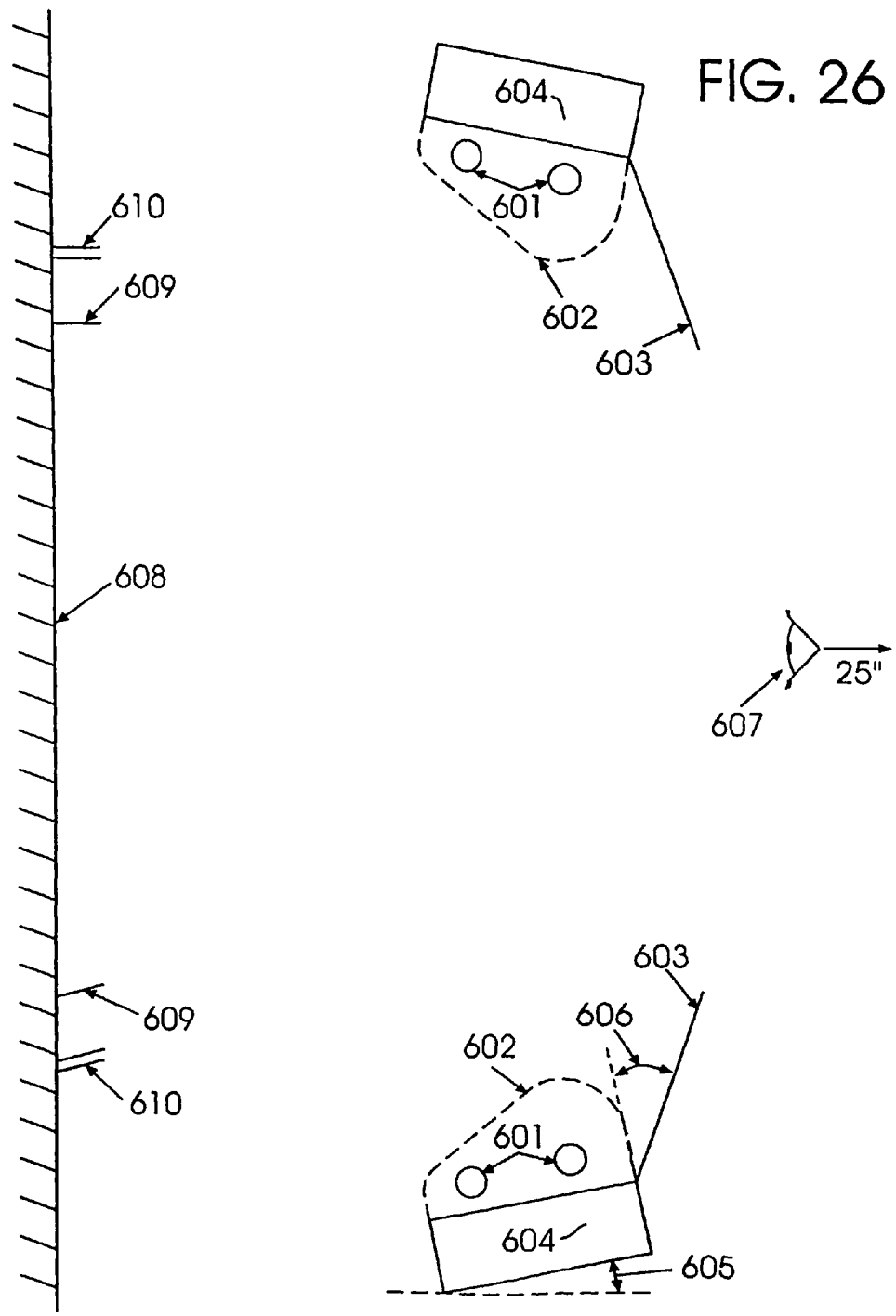
FIG. 26 is a block diagram showing the viewing box of FIG. 25 in further detail.

FIG. 26 is a scale drawing, showing the configuration of light sources 601, lenses 602 and reflectors 603 in the viewing box 501, whose size should be adequate to accommodate at least a two-page spread in publication terms (11×17 inches.) At top and bottom (or left and right) are ballasts 604 which can accept one or two (depending on required illumination levels) Daylight 5000-simulating fluorescent lamps. D5000 is mentioned merely because it is a standard illuminant in certain industries: in other industries, the choice might be different. Approximately pear-shaped plastic lenses serve to diffuse and disperse the light. The lenses should be frosted or waffled (rippled lenticularly) so as to enhance diffusion of light and should not greatly change the color temperature of the fluorescent light.

Any direct sighting of the lamps/diffusers by the viewer 501 (in normal use) is prevented by reflectors 603 which are aluminized or chromed on the side facing inward toward the copy so as to reflect and further disperse the light. The configuration depicted has been shown to result in very uniform, diffuse illumination over the area of at least a two page spread. Angles 605 and 606 are approximately 14° and 34°, respectively. At eye 607 is depicted on a line of sight which should extend at least 25 inches back from the rear viewing surface 608 of the viewing box. The single lines 609 and double lines 610 indicate the extent of the illuminated back wall of the viewer which can be seen from distances of 40 inches and 30 inches, respectively.

The above discussed assembly is preferably equipped with a dimmer. This, along with the choice of number of fluorescent tubes, allows critical control of the brightness levels within the viewing box. Brightness should be made as similar to that of a full-field white on the video display as possible. An additional option for the viewing box 501 is the installation, in the back wall 608, of a light box able to accommodate 8×10 or smaller color transparencies, as is provided in other conventional viewing hoods used in industry.

As explained previously, the primary chromaticities of phosphor-based displays are very constant over time. Therefore, the sensor coupled to cowel 332 (FIG. 24) or 401 (FIG. 24A) should be a simple, calibrated luminance meter, called thereinafter lumeter, sufficient to maintain white balance and gamma and to detect significant increases in ambient illumination over the norm.

However, display technologies which rely on light sources, such as LCD or DMD as defined earlier, may experience drift in primary chromaticities as the external light source ages. It is common for front or rear projection displays based on liquid crystals or digital micromirrors to employ metal halide lamps or xenon arcs. The spectral distribution of the former certainly changes with time and that of the latter may under some circumstances. In these cases, adequate control of color balance requires ongoing colorimetry, such as provided by a spectral based CMI. Even with CRTs, there are occasions in which adequate calibration or re-calibration may involve a color-capable device. For instance, it may be desirable to retrofit a CRT which was not calibrated at the factory with the invention in order to confer its benefits on a user. Accordingly, several types of electro-optic modules are described below, from a Lumeter to a spectral device.

Figure 27:
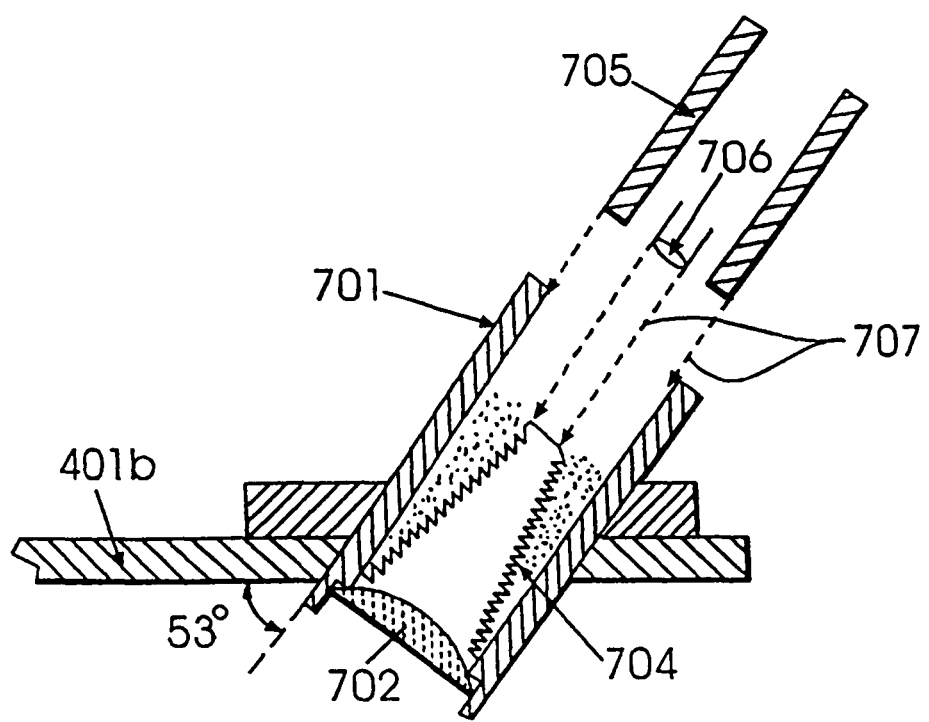
FIG. 27 is a block diagram of part of the sensor of the color measurement instrument located in the cowel of the assembly of FIG. 24A.

Referring to FIG. 27, a cross-section of part of the sensor integrated with the upper flange 401b of the cowel in socket 403 (FIG. 24A) is shown having a housing 701 including optics. On the assumption that the center of the outer edge of the upper flange is 7.5 to 8 inches from the chassis and that the flat surface of the flange is perpendicular to the faceplate, the center of the hole bored for the lens tube is 6 inches out. The bore is cocked at an angle of 53° to the flat surface of the flange so as to look at the approximate center of a nominal 21 inch screen. For example, the length of socket 403 may be 2 inches, and 1 inch in diameter.

The lens 702, shown in cross section in the tube, is a commercial grade condenser, plano-convex with diameter of about 20 mm and focal length of about 25.4 mm. It actually forms an image of what is at screen center about 36 mm behind the lens, presumably due to the diffuse and divergent nature of the light source. The inner surface of housing 701 should be very light absorbent. It should be painted flat black, or, preferably, outfitted with a conical baffle 704 with porous black inner surface. The above numerical values of components in FIG. 27 are exemplary, and other values may be used. In particular, a 53° angle is not quite as desirable as 45°, but the important consideration is that the line of sight reflected off the center of the faceplate intersect the black trap formed by the bottom flange of the cowel, as shown in FIG. 23. The black trap shields the sensor from light rays specularly reflected off the faceplate of the monitor.

FIG. 27 also shows an inner tube 705 which slides into the outer lens tube on tracks 707. It is used to bring either a photodiode array or a fiber optic 706 up to the focal plane behind the lens. The photodiode array is employed in the simple lumeter while the fiber optic pickup is used with a spectrograph. In the lumeter, it is desirable not to position the sensor exactly in the focal plane so as to induce a little blurring over the sensor. In the case of the spectrograph, the fiber optic should be chosen to have an acceptance angle which is as compatible as possible with lens 702 and with the spectrograph to which it is coupled to.

Separate tubes may be used for the lumeter and the spectrograph. The former could employ a non-achromatic plastic lens whereas the latter benefits from a glass achromat. The two kinds of tube should mate with the flange interchangeably.

Figure 28:
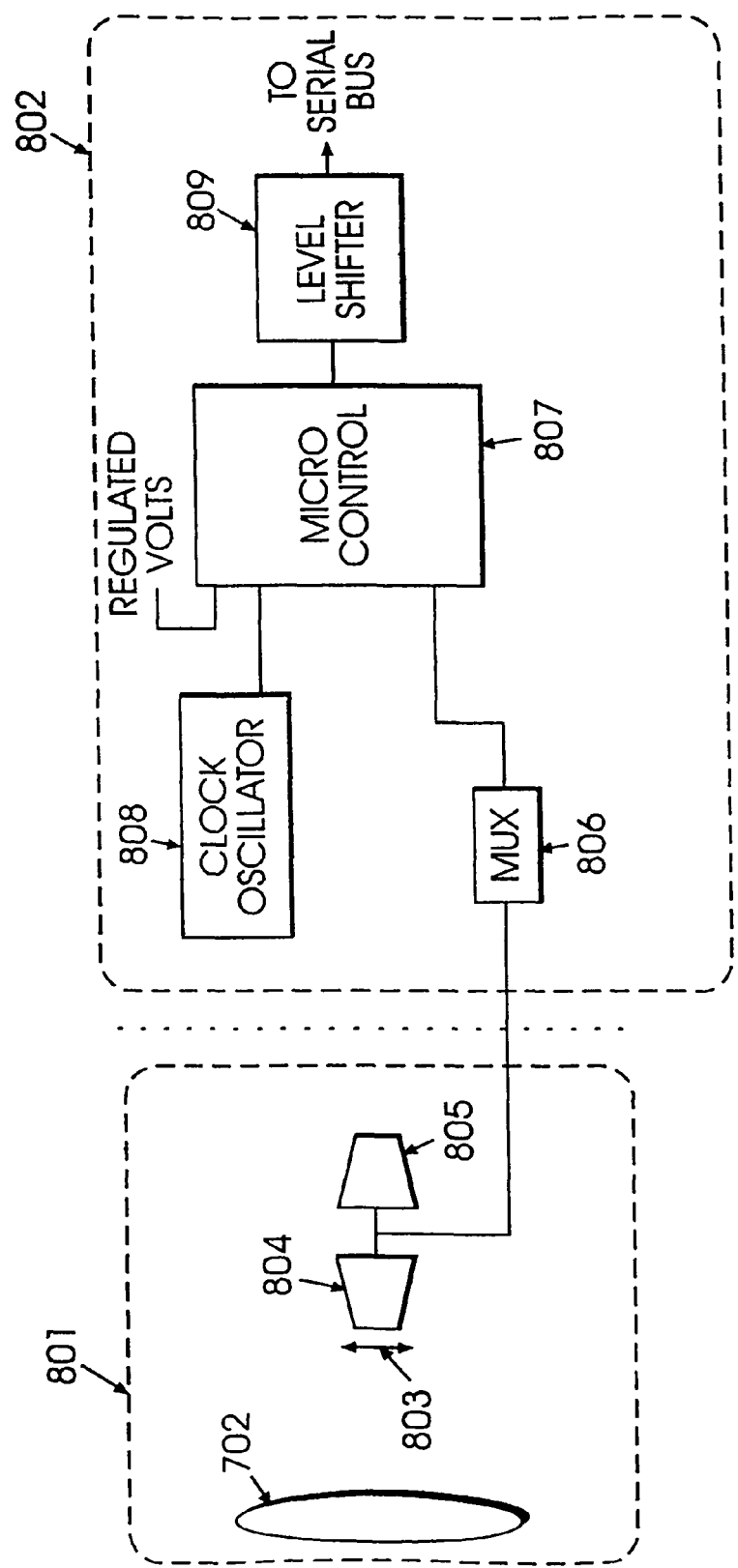
FIG. 28 is a block diagram of the color measurement instrument with the sensor of FIG. 27 and control circuitry.

Referring to FIG. 28, is a block diagram of the lumeter is shown with control circuitry. The lumeter includes two parts which may be combined or separate from each other, an electro-optic pickup head 801 and the control and interface electronics circuitry (controller) 802. The electro-optic pickup head 801 includes a lens 702 which converges light onto sensor 804 through spectrally selective filter 803 which must, at the least, attenuate Infrared radiation greatly. Another sensor 805 is an optional sensor identical to sensor 804 except that it is thoroughly light-baffled (i.e., protected from receiving any light).

Sensor 804 may be a photodiode array incorporated in a TSL 230, the programmable member of Texas Instruments' Light-to-Frequency converter (LTFC) family. The device integrates photosensors with an amplification stage and a current to frequency output stage which interfaces directly to a counter on a microcontroller. The lumeter described is very desirable because of the high levels of sensitivity, repeatability and low parts count.

Because its output is a pulse train, the TSL 23X device can be coupled to the control electronics 802 by a lead of up to several feet. Therefore, the device may be fitted into the inner tube with ample baffling and positioned near focal plane. Wires are lead back to the circuit board containing the control electronics. In this way, the electro-optical pickup head 801 can be very compact. As stated earlier, the control electronics 802 may be located in a housing or cavity 408 (FIG. 24A) in arm member 410 connecting the brackets 404 to the circumferential flange. Such control electronics may also be located a separate circuit enclosure.

Circuitry 802 consists of the control and interface electronics, including a microcontroller 807 having an on-board hardware counter whose overflows are counted in software. This enables long light integration times. A multiplexer 806 of circuitry 802 selects between the two sensors 804 and 805 when both are available, while timing is controlled by a clock oscillator 808. A level shifter 809 provides an interface for adjusting the output of the microcontroller for RS232. RS422, or other communication protocol, such interface may be a USB (Universal Serial Bus) interface.

The lumeter operates by cumulating pulses from the '23X Light-to-Frequency Converter (LTFC) so as to perform A/D conversion by integration. It is best to use some means to ascertain the refresh frequency of the display and to set the integration time to be an integral multiple of the refresh period. One means is to read back the refresh frequency from the processor in the display. Another is to measure it with the lumeter, taking advantage of Fast Fourier Transform algorithms and techniques, such as described, for example, in application notes published by Texas Instruments for the TSL 23X. However, it is also acceptable to set an integration time such that errors due to incomplete refresh cycles are small. An integration time of 5 seconds satisfies this criterion for a 75 Hz refresh rate.

FIG. 29 shows a basic command set used by the host computer to communicate with the lumeter. For example, the series of ascii strings "<E1>" "<P0>" "<D0>" "<S2>" "<T5F5>" is used to initialize the lumeter for data collection, where the ascii strings are enclosed in quotation marks. The effects are to turn on echoing from the lumeter back to the host, to power up the sensor so that it stays "awake" once a sensitivity command is issued, to program frequency division to a factor of 1, to set sensitivity to 100. i.e. use all available photosensors, and to set the integration time to 5 seconds However, in production, it is preferable for most applications to use a non-programmable version of the LTFC such as the TSL 235.

Figure 30:
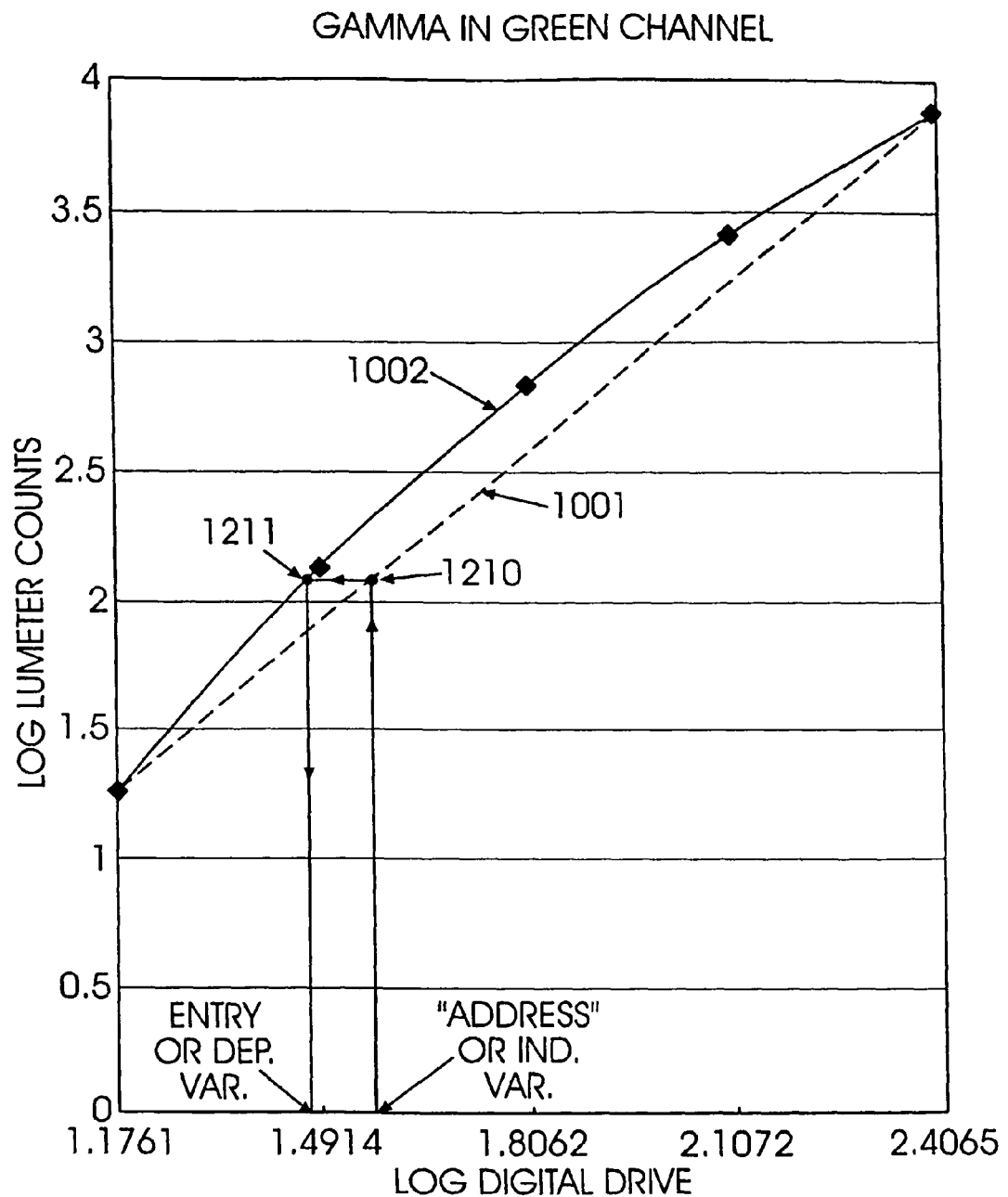
FIG. 30 is a graph of the gamma of the green color channel of the color measurement instrument of FIG. 28.

Intensity/Voltage data collected with a reference spectroradiometer (a PhotoResearch PR700) and with a lumeter are assembled in Table I below. These are the data needed to calculate gamma. Data are presented for several conditions which test the generality and robustness of the design. FIG. 30 exemplifies the summary data analysis. The actual points 1002 come from the fourth and fifth columns of the second data set, namely full screen green at 23° C. ambient temperature. The values of gamma quoted in what follows are the slopes of straight lines such as 1001.

TABLE I

Measurement of Intensity/Voltage Characteristic for Several Conditions

| Digital Code | Lumeter Counts | PR700 Luminance | Log Digital | Log Lumeter | Log Luminance |
|---|---|---|---|---|---|
| Measured for 6" by 6" square centered in screen. green channel |||||||
| 15 | 10 | 0.0398 | 1.1761 | 1 | −1.3997 |
| 31 | 65 | 0.3408 | 1.4914 | 1.8129 | −0.4675 |
| 64 | 350 | 2.191 | 1.8062 | 2.5441 | 0.3406 |
| 128 | 1349 | 9.552 | 2.1072 | 3.13 | 0.9801 |
| 255(max) | 4503 | 33.73 | 2.4065 | 3.6535 | 1.528 |
| Measured from full screen, green channel, room temperature of 23 C. |||||||
| 15 | 18 | 0.0397 | 1.1761 | 1.2553 | −1.4008 |
| 31 | 132 | 0.3532 | 1.4914 | 2.1206 | −0.452 |
| 64 | 699 | 2.185 | 1.8062 | 2.8445 | 0.3395 |
| 128 | 2627 | 9.401 | 2.1072 | 3.4195 | 0.9732 |
| 255(max) | 8537 | 32.63 | 2.4065 | 3.9313 | 1.5136 |
| Measured from full screen, green channel, room temperature of 30 C. |||||||
| 15 | 23 | 0.0495 | 1.1761 | 1.3617 | −1.3057 |
| 31 | 144 | 0.3883 | 1.4914 | 2.1584 | −0.4108 |
| 64 | 732 | 2.311 | 1.8062 | 2.8645 | 0.3638 |
| 128 | 2696 | 9.642 | 2.1072 | 3.4307 | 0.9842 |
| 255(max) | 8656 | 33.05 | 2.4065 | 3.9373 | 1.5192 |

Gammas calculated in the manner of FIG. 30 for the various conditions are:
 a) for the Lumeter, 2.15, 2.17 and 2.08 for the 6×6 square at 23 C, full field at 23 C and full field at 30 C, and
 b) for the PR700, 2.37, 2.36 and 2.29 for the same conditions, respectively.

Lumeter-derived gammas are a fixed percentage of PR700 values, indicating a robust calibration strategy and good immunity from field size. Both instruments appear to have good temperature compensation; however, there is about a 5% loss of gamma at the higher temperature. This is due to increase in dark current at the higher temperature. For applications in which higher temperatures may be encountered and accuracy to better than 1% is desired, a second, light-baffled sensor (805 in FIG. 28) should be added. Adding a temperature-sensing detector is less expensive than shuttering the system, however a shutter for sensor 804 could alternatively be used. Because sensor 805 is baffled, its readings indicate the dark current which can be calibrated against temperature. Background temperature readings can be taken with long integration cycles to insure accuracy when the instrument is not being used for video display calibration.

The gammas discussed above are not identical to those of a true luminance meter because the lumeter does not have the photopic sensitivity function. However, it is preferable to save the spectral emission characteristics of each phosphor channel, as noted earlier, and to measure the spectral sensitivity function of each lumeter as part of the calibration process. In that way, it will be possible to calculate exactly the relations between true luminosity data and lumeter responses for any phosphor set and any actual lumeter. This is done by convolving (with a shift parameter of zero) the spectral emission function with the human sensitivity function and with the lumeter's spectral sensitivity. In this we are helped by the linear scaling of spectral emission with drive voltage. However, if spectral data on phosphors is not available, very good calibrations will be possible based upon generic data.

The lumeter provides reproducible results from day to day, and is at least as stable as typical reference light sources, given a suitable choice of spectral filtering and a stable lens material. Therefore, the only aspect of self-calibration which is of concern is the monitoring of temperature-dependent dark signal. This is accommodated in the invention so that the lumeter is self-calibrating, automatic and non-contact, as will be described later below.

Figure 31:
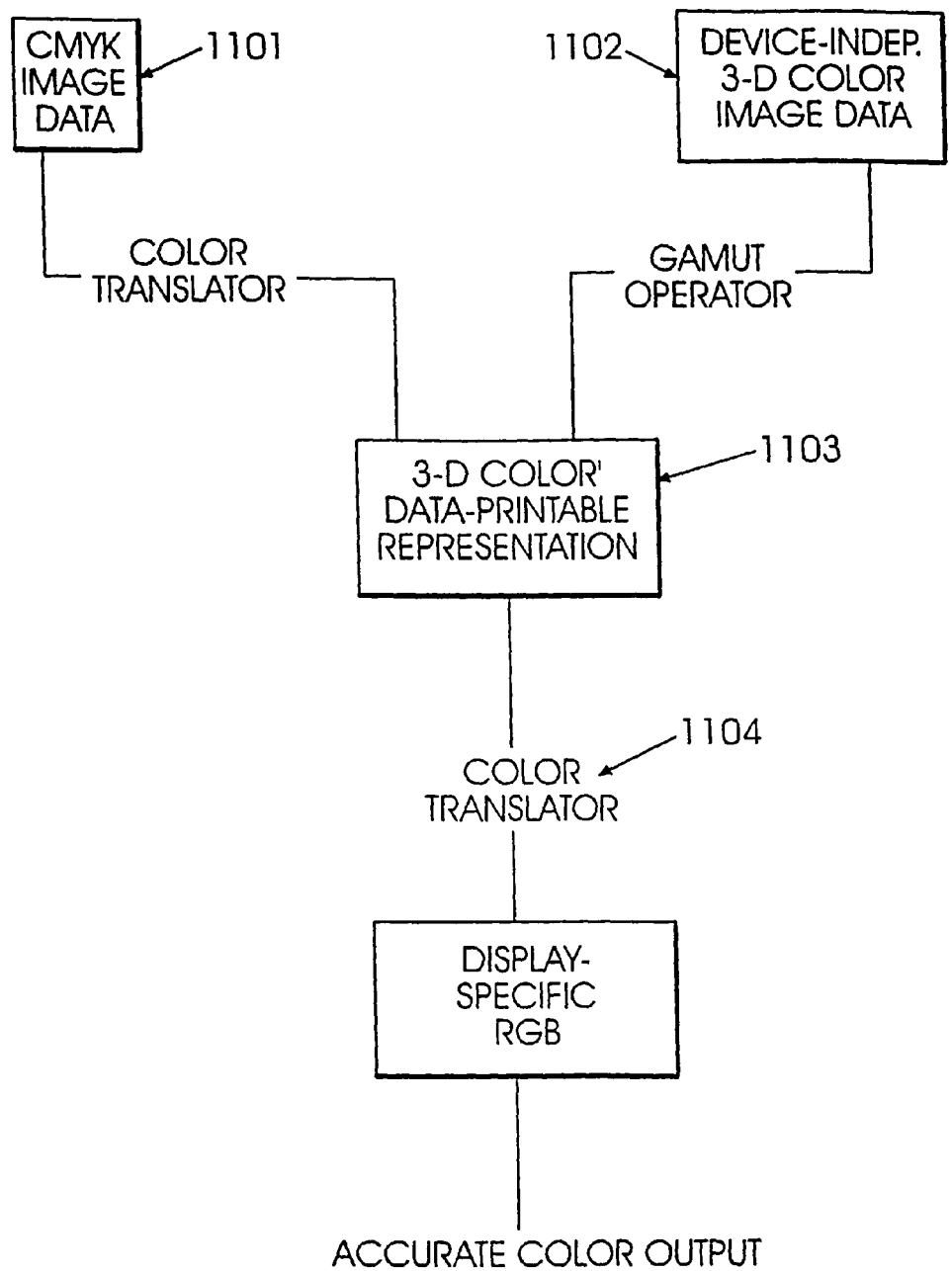
FIG. 31 is a high level flow chart showing the operation of the system in accordance with the present invention for soft proofing to a color display.

Referring to FIG. 31, the high level operation of the system for soft-proofing is shown. Users want to be able to edit or retouch image data while seeing the images they are preparing on the video display as they will appear on hard copy to the greatest degree possible, such as described, for example, in the article by Holub, et. al. J. Imag. Technol. Vol. 14, p. 53. Automatic device calibration at a single installation or coordinated among multiple nodes is provided by the above discussed lumeter and cowel assembly.

Data generally come from one of two sources in a soft-proofing application. CMYK data 1101, or as 3-dimensional color data 1102, usually in a device-independent coordinate system such as CIELAB or calibrated RGB. The first step is to get the data into the form of 3-D color' data 1103, where color' means that all the colors are printable. Since CMYK data are printable by definition, they need only be translated to suitable 3-D coordinates, as described earlier in connection with FIG. 4A. To effect the conversion for data that start out in a device-independent notation, they must be processed through a gamut operator. The latter is based upon gamut descriptors derived from models of the CMYK and display devices which was also described earlier.

Finally, the 3-D color' data must be translated into display-specific RGB signals. The result is accurate color output. Literal colorimetric reproduction on the video display may not be possible, such as described in the article Holub, et al., *op. cit.*) The color translator 1104 may involve processing beyond that needed to convert device-independent color' data into calibrated RGB for the particular display. However, the latter conversion is a critical part of the translator, and the concern in this discussion is to show how it is formed or updated automatically.

Figure 32:
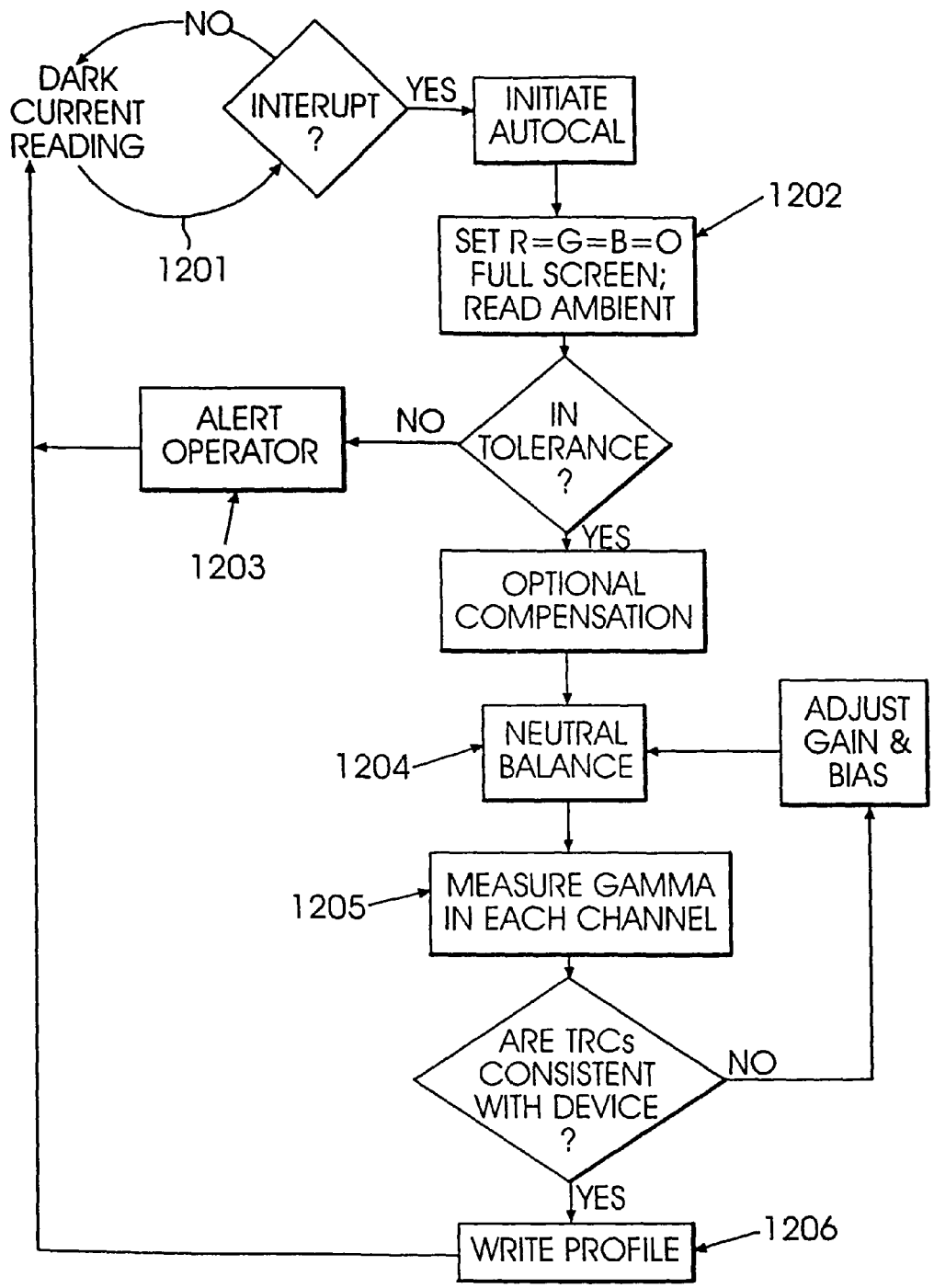
FIG. 32 is a flow chart for the process of maintaining a color display in calibration.

Referring to FIG. 32, a flowchart of the procedures for using the lumeter to set up a video display for soft-proofing and for remote proofing. It assumes that the color mixture component of the device characterization problem has been dealt with, such as by one of the methods taught in articles cited earlier. For simplicity, assume that the chromaticity data derived from factory measurements of the display's R, G and B channels are combined with data about the desired white point to form a 3×3 matrix. The color translator 1104 then consists of a stage which converts 3-D color' data into XYZ TriStimulus Values, if necessary, which are then converted into linear RGB by the matrix. Resulting R, G and B values are processed through Tone Reproduction Curves ("TRCs" in the parlance of the International Color Consortium's Profile Format Specification.)

Whatever the sequence of processing steps implicit in a color translator, they will only be effective if the parameters of processing correspond to the actual state of the device. In other words, the chromaticities used to compute the matrix must be those of the device, the three channels must be balanced to the correct white point and the TRCs must compensate for the non-linear gamma of the device. Insuring that the device is in a targeted state called calibration is the object of FIG. 32.

State 1201 shows the Lumeter in an initial state of periodic dark signal reading. This state may be interrupted by initiative of an operator or on cue from the operating system as described earlier. An autocalibration cycle begins by darkening the screen 1202 and measuring the sum of light emitted by the screen (the dark emittance) and reflected off the screen by environmental sources not baffled by the cowel. Call the sum dark light.

One of the shareable components of the Virtual Proof is a default or negotiated tolerance for dark light. If this is exceeded, credible soft proofing at a given node and collaborative proofing between remote nodes may not be possible. The device driver for the lumeter should flag the event 1203. During a prolonged period of system inactivity, it may raise the flag repeatedly; when an operator returns to use the system, however, he/she should be advised that an unattended calibration cycle was not possible. There are two main ways of recovery: a) restore dark light to an acceptable level (operator action), such as adjusting the amount of ambient light reflected from the screen, or b) use a more complicated model of color mixture, if possible, which includes the effects of the dark light.

It should be noted that the lumeter cannot discern the color of dark light. The latter may be important in some applications, either because of fairly high levels of dark light or due to a need for very critical color judgments. When measurement of the color of dark light is necessary, replace the lumeter with a spectrograph, as described latter in connection with FIG. 33.

Once the question of dark light is resolved, neutral balance 1204 is established. The aim white point is used in a computation of the relative activity levels needed in R, G and B channels to achieve the target at highlight and in the shadow. First the gains of the amplifiers within the color display which control electron density as a function of external drive are adjusted in each channel until a criterion balance is realized. This establishes highlight white. Next, the biases of those same amplifiers is adjusted until the appropriate balance is realized in the shadows. This is likely to upset the highlight balance. Therefore, several iterations may be needed to balance both highlight and shadow.

Under the simplest model of color mixture, the computation of relative activity levels proceeds as follows: From the factory-supplied calibration data, we have a 3×3 matrix of chromaticities, a column of x,y,z for Red, a column for Green and a column for Blue. The inverse of the foregoing matrix is dotted (a matrix inner product is formed) with the vector of white chromaticity values to yield a vector of weights. When the first weight is multiplied by each entry in the first column of the original matrix, the second weight by each entry in the second column, and so on, an RGB to XYZ matrix results. In particular, the second row of said matrix holds the Y TSV, or luminance value, that should prevail in each channel at the aim white point. The lumeter can be calibrated as described earlier, in connection with FIG. 30, to measure the luminance values so that the system software can decide what changes of gain or bias are needed. The foregoing description is meant only to clarify how the lumeter is used, not to restrict the scope of the invention to this model of color mixture.

Next, the gamma is measured in each channel 1205 by commanding a series of digital levels and measuring the result. If these need to have very specific values, but do not, then it is necessary to re-adjust gain and bias and re-iterate over neutral balance. If the gammas are critical, then the gammas should be adjusted to be close to the target value before neutral balancing. If the gammas merely need to be within a given range, then the TRCs in the profile can be adjusted to reflect the real state of the device once the values are within the desired range. On completion, the profile is updated 1206 and the Lumeter can return to sedentary (standby) mode 1201.

The adjustment of the TRC is accomplished as follows, referring to FIG. 30 If the aim value of output for a given command (this is the address in the TRC lookup table or the independent variable) is 1210, then enter tables of aim and measured values as a function of digital command level to find that level which produces the aim value 1211 among the measured data. That level becomes the entry or dependent value in the TRC LUT. In the interests of avoiding quantization artifacts, it is preferable to use precision greater than that afforded by 8-bit-in/8-bit-out LUTs.

For most video display technologies, with the possible exception of those which rely on microfilters to provide wavelength selection (e.g. LCDs) the problem of color differences in different regions of a nominally uniform color field can be separated from the aspects of device modeling that involve color mixture and gamma. For example, methods for flattening the screen are described in U.S. Pat. No. 5,510,851. The sensor and cowel assembly of FIGS. 23 and 24 can provide an automatic means of measuring non-uniformity of the display. An inexpensive, black & white, solid state camera, fitted with a wide field lens, may be located and centered in a door assembly in cowel 401 which can covers the opening 411 in the cowel 401 (FIG. 24B). It is preferable to eliminate the effects of environmental light on spatial homogeneity measurements. The camera should view slightly defocussed screen in the interest of anti-aliasing, one color channel at a time. The digitized images are then analyzed for non-uniformities and corrections computed and applied, such as described in the above cited patent. The distortion function of the wide-field lens should be measured and factored into the calculation of correction factors, as should differential sensitivity across the sensor array.

The following will describe color measure instruments utilizing spectrographs compatible with high resolution measurement of phosphor emissions from color monitors. i.e. CRTs to provide non-contact measurement, self-calibration, and push-button operation. The term push-button operation refers to the capability of a user automatically initiating color calibration, or that such color calibration is initiated automatically by a computer coupled to the monitor. As stated earlier in connection with FIG. 27, the sensor of the lumeter can be separate from the control and interface electronics. Sensor of the lumeter could also be a fiber optic pickup, with collecting optics, that could be coupled to a spectrograph. Therefore, the arrangement for spectral monitor calibration is non-contact and automatic once the sensor is fitted in the circumferential cowel.

Self-calibration of a spectral instrument involves insuring that readings are associated with the correct wavelengths and have the proper relative or absolute amplitudes. Unless damaged electrically or by radiation, solid state sensors tend to be very stable over time, more so than most lamps. For this reason, reference detectors are conventionally used against which standard lamps can be calibrated. Temporal variations in a source are best dealt with, in reflection or transmission measurements, by a dual beam technique, wherein the light source is reflected (or transmitted) off known and unknown objects either simultaneously or successively, depending on the temporal stability of the source. The spectral properties of the unknown object are inferred from the ratio of its spectrum with that of the known object.

A pulsed xenon source has many advantages for reflection and transmission spectroscopy. It emits strongly in the short visible waves where silicon detectors are less sensitive. It has a very stereotypical array of impulsive spectral lines across the visible spectrum which are very useful for wavelength calibration of spectral sensors. However, output is not stable from flash to flash making them best suited to dual beam designs.

Figure 33:
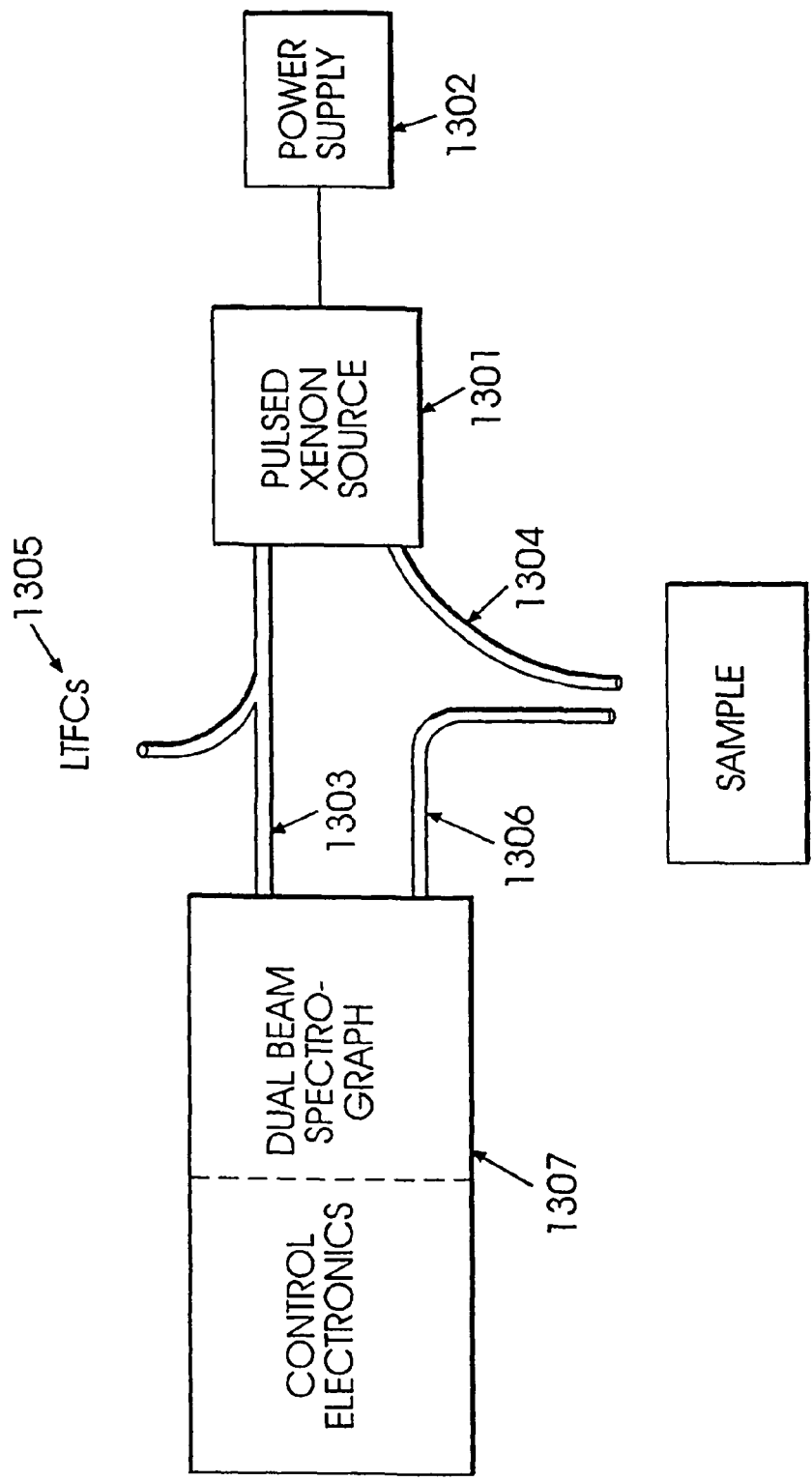
FIG. 33 is a block diagram of a color measurement instrument in accordance with the present invention utilizing a dual beam spectrograph.

Referring to FIG. 33, a block diagram of a color measurement instrument for calibrating a color monitor is shown utilizing a spectrograph. Source 1301 shows a pulsed xenon lamp tethered over a short distance to its power supply 1302. Source 1310 may be Xenon modules, such as manufactured by EG&G of Salem. Mass. Two fiber optic taps are taken, tap 1303 to the reference input of the dual beam spectroscope 1307 and tap 1304 to illuminate the reflection sample. Tap 1303 is bifurcated so that light is also taken to an assembly 1305 consisting of at least two Light-to-Frequency Converters (LTFCs) whose purpose will be described presently. Pickup 1306 is a fiber optic pickup which can accept light reflected or transmitted from a sample. Alternatively, it can be placed in the sensor assembly shown in FIG. 27, for use in spectral monitor calibration. Although the fiber optics are employed for flexibility, they must not be flexed during use and the components of the assembly that are linked by fibers must bear a fixed relationship to one another. The term fiber optic tap refers to one or more fiber optic cables.

The LTFCs in assembly 1305 serve two purposes. By monitoring their output in the dark, the temperature of the assembly can be estimated as we have seen earlier. However, they are also used as reference detectors. Each receives light through a different, spectrally-selective filter. For example, two LTFC's may be used, one tuned to a particular peak in the short wave region of xenon output and the other tuned to a peak in a longer wave region. In this way, they serve as a check on the consistency of the sensitivity of the reference sensor in the spectrograph at a given temperature. They also aid in estimating the dark current in the reference line camera. In summary, they contribute to checking amplitude calibration of the spectrograph, which may be controlled by the control electronics of the spectrograph. As noted earlier, the pulsed xenon spectrum provides very predictably placed peaks for use in wavelength autocalibration. The two aspects of calibration discussed here need not be done simultaneously in the case of monitor measurements; it is enough that they have been done recently. Thus, the signals from the LTFC sensors can be used to provide information for automatically checking the calibration of the spectrograph.

Referring back to FIG. 3C, the color measurement instrument of FIG. 33 may also be used for reflection color measurement from a hard copy sample, or media. The fiber optic probes 36 disposed over the paper sample were given a 45/90 geometry. This geometry works well, especially when the illuminating fiber oriented at 45° has a tip of oval shape such that the light spot formed is approximately circular with diameter 3-5 mm and uniformly illuminated. However, the foregoing geometry may not be suited to tight quarters. Two other configurations also produce very good results, even when the illuminating and detecting fiber probes have nearly the same orientation (typically near vertical) with respect to the copy. One configuration includes a polarizer placed over the tip of the illuminator fiber optic and a polarizer that is crossed, with respect to the first, is placed over the detector fiber optic. Specular pickup is severely attenuated, provided that crossing is almost perfect. Alternatively, a diffuser may be placed over the illuminator fiber optic; in this case, the end of the fiber should be several millimeters behind the diffuser. This is easier to setup than the polarizers, but may produce a larger illuminated spot than is desired in some circumstances. In each of the above configurations, all measurements are non-contact. Therefore, they do not disturb the copy sample being measured. The configuration we describe does not require significant baffling of extraneous light due to the very considerable (in a brief interval) output of pulsed xenon.

The preferred spectrographic design for simultaneous, dual beam work is one described by J. T. Brownrigg ("Design and Performance of a Miniature Dual Beam Diode-Array Spectrometer," Spectroscopy. Vol. 10, pp. 39-44. November/December '95) and manufactured by American Holographic (Fitchburg. Mass.) as the MD-5. For applications in which the spectrograph and related modules are embedded in a printer, such as an ink jet plotter with a single, mobile head (rather than a web design) the design discussed in the article has satisfactory spectral resolution. Other spectrographs providing comparable performance may alternatively be used.

However, for applications in which the unit (the color measurement instrument of FIG. 33) is installed in a pen-plotter-like assembly for measurements of specialized calibration forms and occasionally removed for monitor duty, a modified design is needed to achieve adequate spectral resolution. In it, the optical bench is lengthened and a grating with superior dispersion and focussing properties is used and the system must be aligned to optimize focus in the long wave region of the spectrum in which the paper/copy is transported through automatically while the pen scans the paper perpendicularly to the direction of the advance.

The pen-plotter assembly transports the paper or copy automatically when a pressure switch senses its presence. The fiber optics described above replace the pen and scans the copy perpendicularly to the direction of paper advance. Hence, we have a non-contact measurement by an instrument that is fully self-calibrating and provides push-button simplicity. This configuration could easily subserve the color measurements needed in support of soft-proofing as discussed in connection with FIG. 31 and earlier in this description. If one or more instruments of the kind described were available in a network for virtual proofing, they might be shared for hard-copy or, when needed, for monitor calibration.

A less sophisticated calibrator may be used for inexpensive print devices. For "low end" devices, the strategy of choice is to make stock profiles available for identified lots of inks or toners, through the Cyberchrome Service (FIG. 22) and then to use the calibrator to make sure that the devices conform as much as possible to a setup consistent with the assumptions used in making the profile. This would entail, at a minimum, ensuring that the Tone Reproduction Curves (TRC) for each channel in the printer conformed to specification.

Optionally, it would ensure that the image area of the device is flat. i.e. an uniform image reproduces uniformly across and down the page. This would require techniques analogous to those described in the art for flattening video displays, and referred to earlier in this description. In essence, at each point on the page, the TRCs are adjusted to match the least commonly achievable TRC and some sort of interpolation is employed to feather the corrections applied to contiguous blocks on the page for which TRC corrections were computed. A useful instrument for measuring the non-uniformities and initial TRCs for the different color channels is a monochrome scanner such as the PaperPort, marketed by Visioneer of Palo Alto, Calif.

This is an advance over Bonino's patent (U.S. Pat. No. 5,309,257) in two respects: a) distribution of colorant-lot-specific profiles and b) flattening the page. Each of these have considerable impact on the color reproduction of any device, especially less expensive ones.

Figure 34:
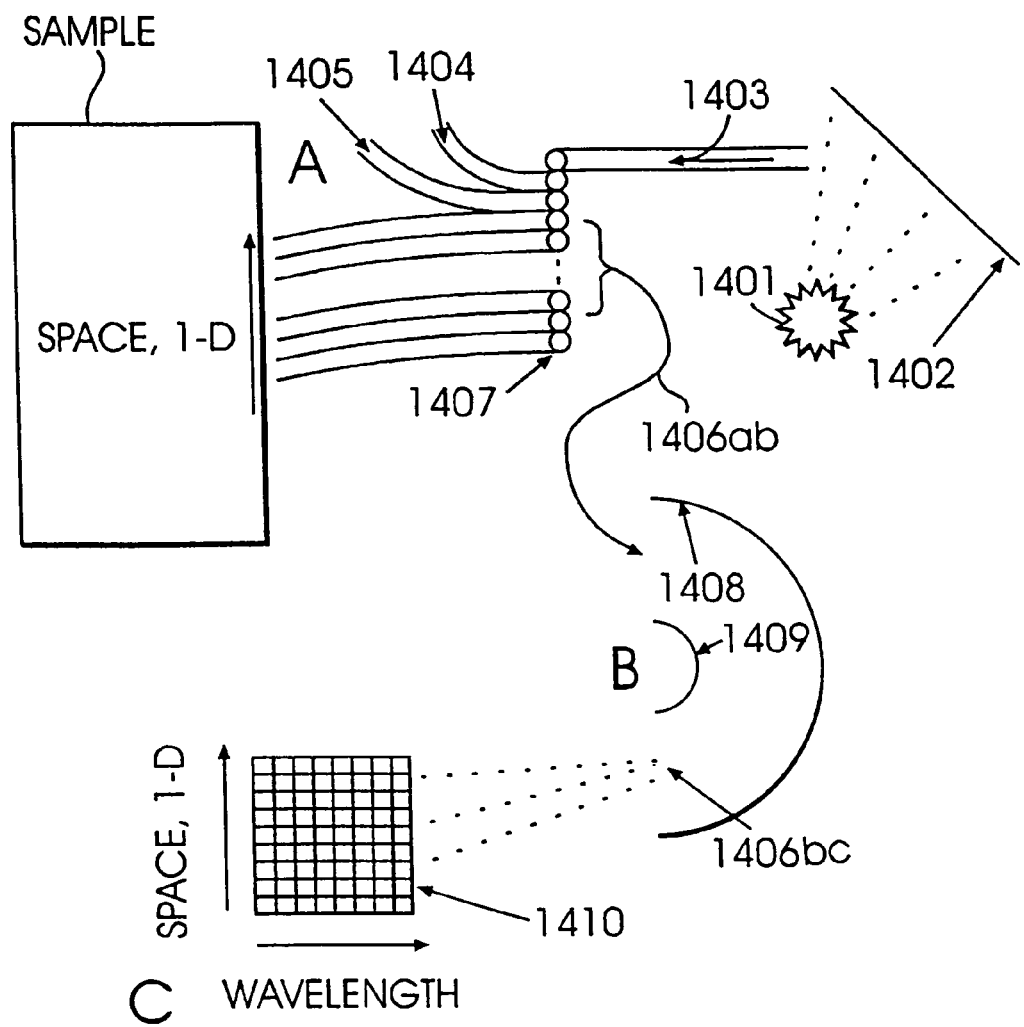
FIG. 34 is a block diagram of the a color measurement instrument in accordance with the present invention utilizing a concentric spectrograph.

Referring to FIG. 34, a block diagram of a color measurement instrument utilizing a concentric spectrograph is shown for providing spectral imaging colorimeter. Such a color measurement instrument is preferably used for page printers, such as a xerographic press. Concentric spectrographs are described by L. Mertz, Applied Optics. Vol. 16, pp. 3122-3124. December 1977, and are manufactured by American Holographic (Fitchburg. Mass.) and Instruments SA (Edison, N.J.) Source 1401 is an illumination source. By virtue of the spectral analysis, the interpretation of object colors can be independent of the source, opening the possibility of simulating the appearance of a product, for a customer, under various viewing conditions.

Reflector 1402 is a conventional reflector and pickup 1403 a fiber optic pickup which collects light from the reference reflector for conveyance to the spectrograph. Light from the reference reflector is shown on the sample object. Light reflected from the sample object is formed on a row (streak) of pixels indicated by fibers 1407. Fibers 1407 can be a row of 1.5 fiber optic bundles, or samples (pixels) of the image formed by a lens instead (A.) Collection of reference light by 1403 enables a dual beam operation in which the influence of the source illuminant can be extracted from each pixel. Fiber 1404 is a fiber which sees a black trap and is used to generate reference dark current on the array. Fiber 1405 is a fiber (or generally, an input) which transmits light from a source used for wavelength calibration, such as source providing light of known wavelength(s).

Surface 1408 is the reflecting surface of a concave mirror whose center of curvature is shared with convex holographic grating surface 1409; this is a simplified depiction of a concentric spectrograph (B.) Rays 1406$_{ab}$ and 1406$_{bc}$ show the flow of image rays to imaged pixels at the entrance slit of the spectrograph and hence to the sensor array 1410, on which one dimension encodes wavelength and the other distance in space along the imaged streak (C.) In other words, the concentric spectrograph outputs spectra spatially related to points along the line of light provided to the spectrograph. Thus, the wavelengths of each spectrum related to light received from each of fibers 1403, 1404, and 1405 can provide calibration reference information for automatically calibrating the spectrograph.

The spatial resolution of a practical implementation is such that anti-aliasing filters, described earlier, are required. Conventional compression algorithms must be applied to the spectral data to make it sufficiently compact for storage. Where data need to be captured at high spatial resolution, a separate line camera with approximate photopic sensitivity should be resolution encoding of images as practiced in a number of commercial imaging architectures such as Kodak's PhotoCD and the FlashPix. When used as a digital camera, the sensor arrays must be translated across the plane of the subject. When applied to on-press measurement of color across the web, the arrays are stationary and the web moves. Thus, the transport mechanism 320 (FIG. 22) for a physical copy and associated light-collecting optics should constitute a module distinct from the module which attaches to video display and from the module containing sensor(s) and control electronics. Light-collecting modules may be connected to the control module by fiber optic links.

As a spectral, imaging colorimeter, the capture device will require the speed and image quality insured by a concentric optical design along with anti-aliasing software or optical design and with facilities (hardware and/or software) for compressing and manipulating spectral data and for hierarchical, multi-resolution image storage compatible with conventional image data protocol, such as Flash Pix.

Although the above description relates to the printing and publishing industry, it is also applicable to other industries, such as textile printing. Further, in packaging and related industries, more than four colorants may be used in circumstances in which no more than four colorants overlap within a given region of the page. The system can accommodate this by applying the herein methods to separate regions of the page.

From the foregoing description, it will be apparent that there has been provided a system, method, and apparatus for distributing and controlling color reproduction at multiple sites. Variations and modifications in the herein described systems in accordance with the invention will undoubtedly suggest themselves to those skilled in the art. Accordingly, the foregoing description should be taken as illustrative and not in a limiting sense.

What is claimed is:

1. An apparatus for measurement of color rendered on media comprising:
    an illumination source which directs light to the media;
    optics for collecting light of said illumination source reflected from said media, in which at least said optics are moveable to scan said media;
    at least a spectrograph for providing data representative of said light collected by said optics; and
    one or more programs executable by one or more processors to process said data provided by said spectrograph for comparison to reference data, to store said data provided by said spectrograph in a database of historical data, to provide at least information of the grayness of mixtures of colorants for display to a user, and to communicate one or more of said data provided by said spectrograph, said reference data, and said information to one or more other computer systems using a network protocol.

2. The apparatus according to claim 1 wherein said one or more programs further produce one or more color transformations responsive to said data provided by said spectrograph and communicate to said one or more computer systems at least information related to or representative of said one or more color transformations wherein said information related to or representative of said one or more color transformations is useable by said one or more computer systems for color matching.

3. The apparatus according to claim 2 wherein said information related to or representative of said one or more color transformations comprises a gamut filter whose inputs are color values and whose outputs indicate whether input color values are inside or outside of a color gamut.

4. The apparatus according to claim 1 wherein said object represents media and said apparatus further comprises a program to analyze one or more images rendered on media by a rendering device in order to find areas of color for measurement.

5. The apparatus according to claim 1 further comprising one or more programs that provide information of color errors, wherein said information of color errors is provided to color controls of a production system.

6. The apparatus according to claim 1 wherein said optics and said illumination source are configured with respect to said object to reduce the contribution of light due to specular reflections to the light collected by said optics.

7. The apparatus according to claim 1 wherein said illumination source comprises a first polarizer with a first polarization through which light is directed to said media, said optics having a second polarizer having a second polarization crossed with respect to said first polarization, and said first and second polarizers operate to reduce the contribution of light due to specular reflections to light collected by said optics.

8. A method for measuring color comprising the steps of:
providing illumination to a surface;
collecting light of said illumination reflected from said surface with the aid of optics while scanning said surface;
measuring said collected light with a spectrograph to provide data representative of said light collected by said optics in accordance with a calibration enabling CIE colorimetry traceable to a standard;
processing said data provided by said spectrograph for comparison to reference data, said reference data comprising at least a colorimetric specification of desired colors;
storing said data provided by said spectrograph in a database of measurements in association with time of measurement information;
displaying information of the grayness of a color to a user; and
communicating said data provided by said spectrograph or results of processing said data provided by said spectrograph, and said information to one or more computer systems through a network interface using a network protocol.

9. The method according to claim 8 wherein said steps of processing, storing, displaying and communicating are carried out with the aid of one or more programs executable by a processor.

10. The method according to claim 8 further comprising the steps of:
producing one or more color transformations responsive to said data provided by said spectrograph; and
communicating to said one or more computer systems at least said information related to or representative of said one or more color transformations, wherein said information related to or representative of said one or more color transformations is useable by said one or more computer systems for color matching.

11. The method according to claim 8 wherein said illumination is provided by a source to said surface, and said method further comprises the step of configuring said optics and said illumination source with respect to said surface to reduce the contribution of light specularly reflected from said surface to the light collected by said optics.

12. The apparatus according to claim 1 wherein at least one of said one or more processors is part of said apparatus and controls said communication and processing of said data.

13. The method according to claim 8 further comprising the steps of:
producing color error data from said comparison; and
providing said color error data to color controls of a production system.

14. The method according to claim 8 further comprising the step of substituting a viewing illuminant for the measuring illuminant in calculation of color values from spectral measurements.

15. A computer-readable storage medium encoded with a computer program for measurement of color comprising:
one or more programs executable by one or more processors
to process data provided, in accordance with a calibration enabling CIE colorimetry traceable to a standard, by a measurement module for comparison to reference data, said measurement module comprising an array of sensor elements and one of spectrally selective filters or a grating to disperse light into spectral components,
to store said data provided by said measurement module in a database of measurements in association with time of measurement information,
to provide information of the grayness of a color for display to a user, and
to communicate said data provided by said measurement module or results of processing said data provided by said measurement module and said information to one or more computer systems using a network protocol,
wherein said data provided by said measurement module represents measurement of light collected through optics due to reflection or transmission of illumination of a colored object wherein at least said optics are moveable to measure said colored object.

16. The computer-readable storage medium according to claim 15 wherein said one or more programs further produce one or more color transformations responsive to said data provided by said measurement module and communicate to said one or more computer systems at least information related to or representative of said one or more color transformations wherein said information related to or representative of said one or more color transformations is useable by said one or more computer systems for color matching.

17. The computer-readable storage medium according to claim 15 further comprising one or more programs that provide information of color errors for use by color controls of a production system, wherein said reference data comprise a colorimetric specification of a desired color of said colored object and said information of color errors is based upon said comparison.

18. The computer-readable storage medium according to claim 15, wherein said colored object comprises media bearing one or more color images, further comprising a program to analyze said one or more color images rendered on said media in order to find areas of color for measurement.

19. The computer-readable storage medium according to claim 15 further comprising a program enabling substitution of the spectrum of viewing illumination for the spectrum of the illumination used for measurement in the calculation of color values when said data provided by said measurement module comprise spectral data.

20. The apparatus according to claim 1 wherein said data provided by said spectrograph or results of processing said data provided by said spectrograph are stored in relation to at least a device identifier.

21. The apparatus according to claim 1 wherein said measurements are expressed in CIE coordinates of color adjusted for illumination and the adjustment is carried out on spectral data of said spectrograph by substituting the spectrum of viewing illumination for the spectrum of the illumination used for measurement.

22. The apparatus according to claim 1 wherein said data provided by said spectrograph are employed to measure spatial uniformity of color of said object.

23. The apparatus according to claim 20 wherein said database of measurements is accessible by said one or more processors and said one or more computer systems.

24. The apparatus according to claim 20 wherein data of said database are used for preparation of a statistical profile of a series of measurements in relation to a tolerance for error expressed in standard color difference units.

25. The apparatus according to claim 1 wherein said reference data comprise colorimetric values derived from measurement of a calibration standard.

26. The method according to claim 10 wherein said information related to or representative of said one or more color transformations comprises one of a gamut filter or a chromatic adaptation transform, said gamut filter representing a first data structure stored in a file and accessible through a file header wherein said first data structure has inputs which are color values and outputs indicative of whether input color values are inside or outside of a color gamut, and said chromatic adaptation transform representing a second data structure stored in a file and accessible through a file header to enable conversion of input color coordinates to output color coordinates representative of different viewing conditions.

27. The computer-readable storage medium according to claim 16 wherein said information related to or representative of said one or more color transformations comprises one of a gamut filter or a chromatic adaptation transform, said gamut filter representing a first data structure stored in a file and accessible through a file header wherein said first data structure has inputs which are color values and outputs indicative of whether input color values inside or outside of a color gamut, and said chromatic adaptation transform representing a second data structure stored in a file and accessible through a file header to enable conversion of input color coordinates to output color coordinates representative of different viewing conditions.

28. The computer-readable storage medium according to claim 15 wherein said reference data comprise colorimetric values derived from measurement of a calibration standard.

29. The apparatus according to claim 5 wherein said apparatus is integrated into said production system.

30. The apparatus according to claim 29 wherein said object is measured in at least two spatial dimensions.

31. The apparatus according to claim 25 wherein said calibration standard is internal to said apparatus.

32. The apparatus according to claim 1 wherein said reference data comprise a colorimetric specification of a desired color of or on said object.

33. The computer-readable storage medium according to claim 15 wherein said measurement module provides image data representing a rendered image and wherein color errors are computed by cross-correlating a three-dimensional color histogram derived from said rendered image independently of spatial resolution with a histogram representing the colors desired to be rendered.

34. The apparatus according to claim 1 wherein said illumination source is a xenon lamp and said spectrograph is a dual beam spectrograph.

* * * * *

UNITED STATES PATENT AND TRADEMARK OFFICE
CERTIFICATE OF CORRECTION

PATENT NO. : 8,537,357 B2  
APPLICATION NO. : 12/660937  
DATED : September 17, 2013  
INVENTOR(S) : Richard A. Holub It is certified that error appears in the above-identified patent and that said Letters Patent is hereby corrected as shown below:

Title Page 1, column 1, under "Inventors:", delete "Daniel R. Mongeau, Marlboro, MA (US)".

Title Page 1, column 1, under "Assignee:", delete "Rah", and insert --RAH--.

Title Page 3, column 2, References Cited under "OTHER PUBLICATIONS", line 10, delete "Pobboraysky", and insert --Pobboravsky--.

Title Page 3, column 2, References Cited under "OTHER PUBLICATIONS", line 12, delete "Fourteen", and insert --Fourteenth--.

Title Page 3, column 2, References Cited under "OTHER PUBLICATIONS", line 22, delete "1-10", and insert --186-195--.

Title Page 3, column 2, References Cited under "OTHER PUBLICATIONS", line 72, delete "Druckmashinen", and insert --Druckmaschinen--.

Title Page 4, column 1, References Cited under "OTHER PUBLICATIONS", line 1, delete "spectographs", and insert --spectrographs--.

Title Page 4, column 2, References Cited under "OTHER PUBLICATIONS", line 4, delete "Management", and insert --Color Management--.

In the Drawings

FIG. 5, STEP 2, delete "READER", and insert --RENDER--.

FIG. 8, item 81, delete "outlayer", and insert --outlyer--.

Signed and Sealed this  
Eighteenth Day of February, 2014

Michelle K. Lee  
*Deputy Director of the United States Patent and Trademark Office*

FIG. 8, item 85, delete "outlayers", and insert --outlyers--.

FIG. 8, item 86, delete "outlayers", and insert --outlyers--.

FIG. 9A, item 99, delete "cylinderical", and insert --cylindrical--.

Figure 11:
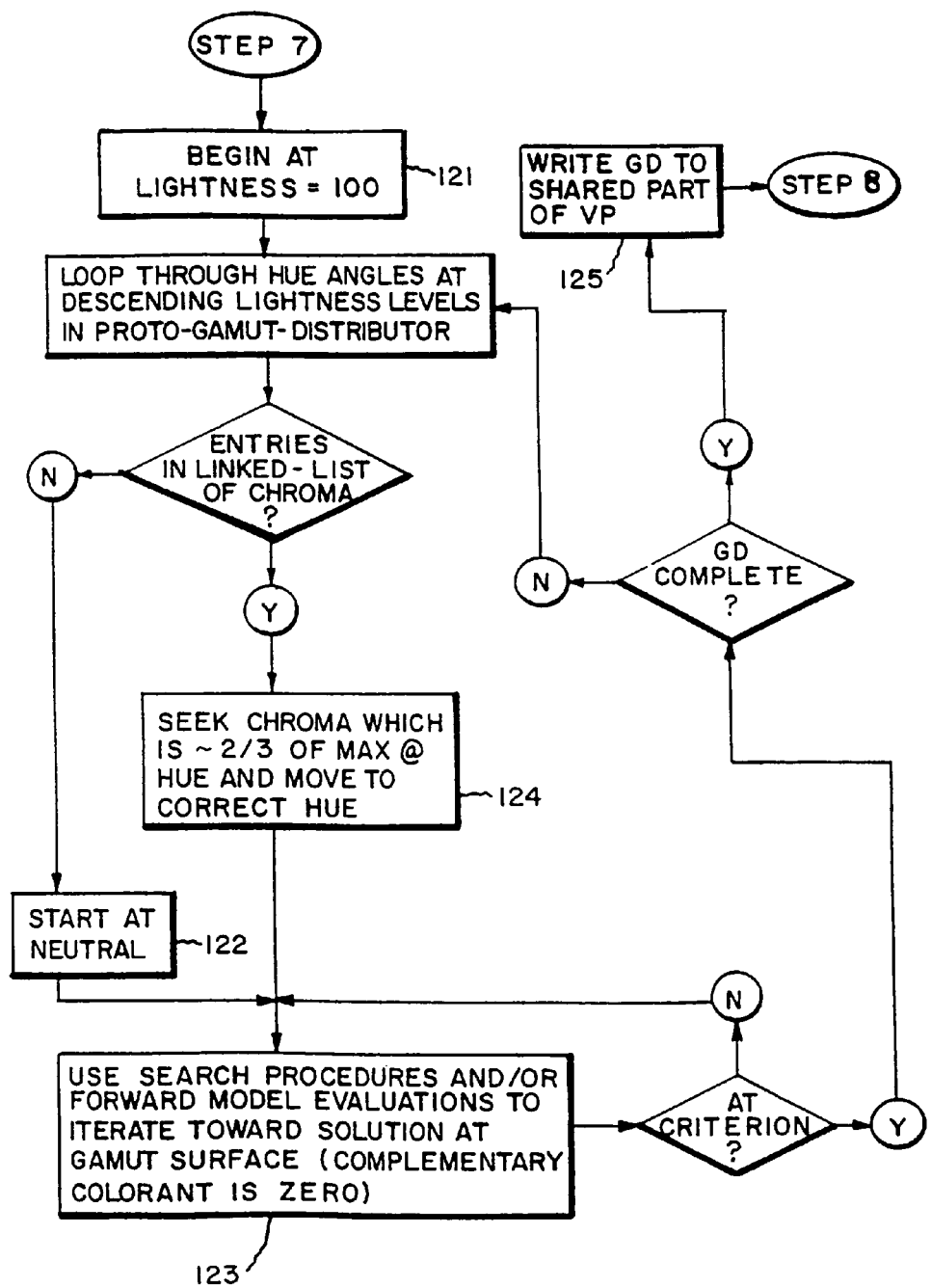
FIG. 11 is a flow chart detailing step 7 of FIG. 5, finishing the gamut descriptor data.

FIG. 11, STEP 7, delete "GAMUT-DISTRIBUTOR", and insert --GAMUT-DESCRIPTOR--.

FIG. 15C, bottom right corner, delete "DATA OR PRINTER TO DATA", and insert --DATA OR POINTER TO DATA--.

FIG. 18B, upper left, below entry point D, delete "USER REFERENCE REVISIONS", and insert --USER PREFERENCE REVISIONS--.

FIG. 20, STEP 2, delete "IIMAGE", and insert --IMAGE--.

FIG. 32, item 1201, delete "INTERUPT", and insert --INTERRUPT--.

In the Specification

Column 2, line 50, delete "theses", and insert --these--.

Column 13, line 11, delete "3A", and insert --3B--.

Column 15, line 12, delete "function is", and insert --functions--.

Column 20, lines 51-52, delete "(or gamma compensated)".

Column 31, line 9, delete "inventors'", and insert --inventor's--.

Column 34, line 59, delete "color-to-color", and insert --color-to-color'--.

Column 38, line 3, delete ")(90°"", and insert --(90°)--.

Column 38, line 6, delete "in".

Column 44, line 2, delete "Also", and insert --On the other hand--.

Column 44, line 12, delete "is one of the points".

Column 44, lines 52-53, delete "(or press-plate) Which does not use a press", and insert --which does not use a plate--.

CERTIFICATE OF CORRECTION (continued)
U.S. Pat. No. 8,537,357 B2

In the Claims

Column 64, lines 53-54, delete "rendered on media".

Column 64, line 55, delete "the media", and insert --a color of or on an object--.

Column 64, line 57, delete "said media", and insert --or transmitted through said object--.

Column 64, line 58, delete "scan said media", and insert --measure said object--.

Column 64, line 59, before "a spectrograph", delete "at least".

Column 64, line 60, after "optics", insert --in accordance with a calibration enabling CIE colorimetry traceable to a standard--.

Column 64, lines 64-65, delete "of historical data", and insert --of measurements in association with time of measurement information--.

Column 64, line 65, delete "at least".

Column 64, line 66, delete "mixtures of colorants", and insert --a color--.

Column 64, line 67, delete "one or more of".

Column 65, line 1, after "spectrograph", insert --or results of processing said data provided by said spectrograph--.

Column 65, lines 1-2, delete "said reference data and said information to one or more other" and insert --and said information to one or more--.